United States Patent
Kosaka

(10) Patent No.: US 8,476,889 B2
(45) Date of Patent: Jul. 2, 2013

(54) PIEZOELECTRIC TRANSFORMER DRIVING DEVICE CONTROLLED BY VARIABLE REFERENCE VOLTAGE VALUES AND IMAGE FORMING DEVICE

(75) Inventor: Toru Kosaka, Tokyo (JP)

(73) Assignee: Oki Data Corporation, Tokyo (JP)

( * ) Notice: Subject to any disclaimer, the term of this patent is extended or adjusted under 35 U.S.C. 154(b) by 437 days.

(21) Appl. No.: 12/801,157

(22) Filed: May 25, 2010

(65) Prior Publication Data
US 2010/0302809 A1 Dec. 2, 2010

(30) Foreign Application Priority Data
May 28, 2009 (JP) ................................. 2009-128630

(51) Int. Cl.
*G05F 1/00* (2006.01)
*H01L 41/00* (2006.01)
*H02N 2/00* (2006.01)
*H05B 37/02* (2006.01)
*H05B 39/04* (2006.01)
*H05B 41/36* (2006.01)

(52) U.S. Cl.
USPC ................ 323/284; 310/316.01; 315/225

(58) Field of Classification Search
USPC ................ 323/284; 310/316.01; 315/225
See application file for complete search history.

(56) References Cited

U.S. PATENT DOCUMENTS

| | | | |
|---|---|---|---|
| 5,942,835 A * | 8/1999 | Furuhashi et al. | 310/316.01 |
| 6,198,198 B1 * | 3/2001 | Fujimura et al. | 310/316.01 |
| 6,486,612 B2 * | 11/2002 | Fujimura et al. | 315/225 |
| 6,720,705 B2 * | 4/2004 | Nakatsuka et al. | 310/316.01 |
| 6,794,796 B2 * | 9/2004 | Nakatsuka et al. | 310/316.01 |
| 7,973,520 B2 * | 7/2011 | Kondo | 323/247 |
| 8,174,200 B2 * | 5/2012 | Kosaka et al. | 315/209 PZ |

FOREIGN PATENT DOCUMENTS
JP  A-H11-206113  7/1999

* cited by examiner

*Primary Examiner* — Adolf Berhane
*Assistant Examiner* — Gary Nash
(74) *Attorney, Agent, or Firm* — Posz Law Group, PLC

(57) ABSTRACT

A piezoelectric transformer driving device includes a piezoelectric transformer for outputting an alternating high voltage, a switching control part configured to control the control frequency of the control signal, a reference voltage waveform generation part configured to switch between a first voltage value, a second voltage value and a third voltage value, a monitor voltage generation part configured to generate a monitor voltage waveform based on the high voltage output from the piezoelectric transformer, and a comparison part configured to compare the reference voltage waveform with the monitor voltage waveform to generate a comparison result, and configured to supply the comparison result to the switching control part.

21 Claims, 32 Drawing Sheets

| SC | EC | CUOHV | DOV (V) |
|---|---|---|---|
| 0 | 1023 | 061 | 1.255 |
| 1024 | 1055 | 061 | 1.255 |
| 1056 | 1087 | 064 | 1.294 |
| 1088 | 1119 | 067 | 1.333 |
| 1120 | 1151 | 06A | 1.372 |
| 1152 | 1183 | 06D | 1.411 |
| 1184 | 1215 | 070 | 1.449 |
| 1216 | 1247 | 073 | 1.488 |
| 1248 | 1279 | 076 | 1.527 |
| 1280 | 1311 | 079 | 1.566 |
| 1312 | 1343 | 07C | 1.605 |
| 1344 | 1375 | 07F | 1.644 |
| 1376 | 1407 | 0A2 | 2.096 |
| 1408 | 1439 | 085 | 1.721 |
| 1440 | 1471 | 088 | 1.760 |
| 1472 | 1503 | 08B | 1.799 |
| 1504 | 1535 | 08E | 1.838 |
| 1536 | 1567 | 092 | 1.889 |
| 1568 | 1599 | 095 | 1.928 |
| 1600 | 1631 | 098 | 1.967 |
| 1632 | 1663 | 09B | 2.006 |
| 1664 | 1695 | 09E | 2.045 |
| 1696 | 1727 | 0A1 | 2.084 |
| 1728 | 1759 | 0A4 | 2.122 |
| 1760 | 1791 | 0A7 | 2.161 |
| 1792 | 1823 | 0AA | 2.200 |
| 1824 | 1855 | 0AD | 2.239 |
| 1856 | 1887 | 0B0 | 2.278 |
| 1888 | 1919 | 0B3 | 2.316 |
| 1920 | 1951 | 0B6 | 2.355 |
| 1952 | 1983 | 0B9 | 2.394 |

| SC | EC | CUOHV | DOV (V) |
|---|---|---|---|
| 1984 | 2015 | 0BC | 2.433 |
| 2016 | 2047 | 0BF | 2.472 |
| 2048 | 2079 | 0C2 | 2.511 |
| 2080 | 2111 | 0BF | 2.472 |
| 2112 | 2143 | 0BC | 2.433 |
| 2144 | 2175 | 0B9 | 2.394 |
| 2176 | 2207 | 0B6 | 2.355 |
| 2208 | 2239 | 0B3 | 2.316 |
| 2240 | 2271 | 0B0 | 2.278 |
| 2272 | 2303 | 0AD | 2.239 |
| 2304 | 2335 | 0AA | 2.200 |
| 2336 | 2367 | 0A7 | 2.161 |
| 2368 | 2399 | 0A4 | 2.122 |
| 2400 | 2431 | 0A1 | 2.084 |
| 2432 | 2463 | 09E | 2.045 |
| 2464 | 2495 | 09B | 2.006 |
| 2496 | 2527 | 098 | 1.967 |
| 2528 | 2559 | 095 | 1.928 |
| 2560 | 2591 | 092 | 1.889 |
| 2592 | 2623 | 08E | 1.838 |
| 2624 | 2655 | 08B | 1.799 |
| 2656 | 2687 | 088 | 1.760 |
| 2688 | 2719 | 085 | 1.721 |
| 2720 | 2751 | 082 | 1.682 |
| 2752 | 2783 | 07F | 1.644 |
| 2784 | 2815 | 07C | 1.605 |
| 2816 | 2847 | 079 | 1.566 |
| 2848 | 2879 | 076 | 1.527 |
| 2880 | 2911 | 073 | 1.488 |
| 2912 | 2943 | 070 | 1.449 |
| 2944 | 2975 | 06D | 1.411 |
| 2976 | 3007 | 06A | 1.372 |
| 3008 | 3039 | 067 | 1.333 |
| 3040 | 3071 | 064 | 1.294 |

FIG. 8A

| SC | EC | CUOHV | DOV (V) |
|---|---|---|---|
| 3072 | 3103 | 061 | 1.255 |
| 3104 | 3135 | 05E | 1.216 |
| 3136 | 3167 | 05B | 1.178 |
| 3168 | 3199 | 058 | 1.139 |
| 3200 | 3231 | 055 | 1.100 |
| 3232 | 3263 | 052 | 1.061 |
| 3264 | 3295 | 04F | 1.022 |
| 3296 | 3327 | 04C | 0.984 |
| 3328 | 3359 | 049 | 0.945 |
| 3360 | 3391 | 046 | 0.906 |
| 3392 | 3423 | 043 | 0.867 |
| 3424 | 3455 | 040 | 0.828 |
| 3456 | 3487 | 03D | 0.789 |
| 3488 | 3519 | 03A | 0.751 |
| 3520 | 3551 | 037 | 0.712 |
| 3552 | 3583 | 034 | 0.673 |
| 3584 | 3615 | 031 | 0.634 |
| 3616 | 3647 | 02D | 0.582 |
| 3648 | 3679 | 02A | 0.544 |
| 3680 | 3711 | 027 | 0.505 |
| 3712 | 3743 | 024 | 0.466 |
| 3744 | 3775 | 021 | 0.427 |
| 3776 | 3807 | 01E | 0.388 |
| 3808 | 3839 | 01B | 0.349 |
| 3840 | 3871 | 018 | 0.311 |
| 3872 | 3903 | 015 | 0.272 |
| 3904 | 3935 | 012 | 0.233 |
| 3936 | 3967 | 00F | 0.194 |
| 3968 | 3999 | 00C | 0.155 |
| 4000 | 4031 | 009 | 0.116 |
| 4032 | 4063 | 006 | 0.078 |
| 4064 | 4095 | 003 | 0.039 |
| 4096 | 4127 | 000 | 0.000 |
| 4128 | 4159 | 003 | 0.039 |
| 4160 | 4191 | 006 | 0.078 |
| 4192 | 4223 | 009 | 0.116 |
| 4224 | 4255 | 00C | 0.155 |
| 4256 | 4287 | 00F | 0.194 |
| 4288 | 4319 | 012 | 0.233 |
| 4320 | 4351 | 015 | 0.272 |
| 4352 | 4383 | 018 | 0.311 |
| 4384 | 4415 | 01B | 0.349 |
| 4416 | 4447 | 01E | 0.388 |
| 4448 | 4479 | 021 | 0.427 |
| 4480 | 4511 | 024 | 0.466 |
| 4512 | 4543 | 027 | 0.505 |
| 4544 | 4575 | 02A | 0.544 |
| 4576 | 4607 | 02D | 0.582 |
| 4608 | 4639 | 031 | 0.634 |
| 4640 | 4671 | 034 | 0.673 |
| 4672 | 4703 | 037 | 0.712 |
| 4704 | 4735 | 03A | 0.751 |
| 4736 | 4767 | 03D | 0.789 |
| 4768 | 4799 | 040 | 0.828 |
| 4800 | 4831 | 043 | 0.867 |
| 4832 | 4863 | 046 | 0.906 |
| 4864 | 4895 | 049 | 0.945 |
| 4896 | 4927 | 04C | 0.984 |
| 4928 | 4959 | 04F | 1.022 |
| 4960 | 4991 | 052 | 1.061 |
| 4992 | 5023 | 055 | 1.100 |
| 5024 | 5055 | 058 | 1.139 |
| 5056 | 5087 | 05B | 1.178 |
| 5088 | 5119 | 05E | 1.216 |

FIG. 8B

| 8-BIT COUNTER | 8-BIT OUTPUT | b-t 12 | b-t 11 | b-t 10 | b-t 9 | b-t 8 | b-t 7 | b-t 6 | b-t 5 | b-t 4 | b-t 3 | b-t 2 | b-t 1 | b-t 0 |
|---|---|---|---|---|---|---|---|---|---|---|---|---|---|---|
| 20 | 61 | 0 | 1 | 1 | 0 | 0 | 0 | 0 | 1 | 0 | 0 | 0 | 0 | 0 |
| 21 | 64 | 0 | 1 | 1 | 0 | 0 | 1 | 0 | 0 | 0 | 0 | 0 | 0 | 1 |
| 22 | 67 | 0 | 1 | 1 | 0 | 0 | 1 | 1 | 1 | 0 | 0 | 0 | 1 | 0 |
| 23 | 6A | 0 | 1 | 1 | 0 | 1 | 0 | 1 | 0 | 0 | 0 | 0 | 1 | 1 |
| 24 | 6D | 0 | 1 | 1 | 0 | 1 | 1 | 0 | 1 | 0 | 0 | 1 | 0 | 0 |
| 25 | 70 | 0 | 1 | 1 | 1 | 0 | 0 | 0 | 0 | 0 | 0 | 1 | 0 | 1 |
| 26 | 73 | 0 | 1 | 1 | 1 | 0 | 0 | 1 | 1 | 0 | 0 | 1 | 1 | 0 |
| 27 | 76 | 0 | 1 | 1 | 1 | 0 | 1 | 1 | 0 | 0 | 0 | 1 | 1 | 1 |
| 28 | 79 | 0 | 1 | 1 | 1 | 1 | 0 | 0 | 1 | 0 | 1 | 0 | 0 | 0 |
| 29 | 7C | 0 | 1 | 1 | 1 | 1 | 1 | 0 | 0 | 0 | 1 | 0 | 0 | 1 |
| 2A | 7F | 0 | 1 | 1 | 1 | 1 | 1 | 1 | 1 | 0 | 1 | 0 | 1 | 0 |
| 2B | A2 | 1 | 0 | 1 | 0 | 0 | 0 | 1 | 0 | 0 | 1 | 0 | 1 | 1 |
| 2C | 85 | 1 | 0 | 0 | 0 | 0 | 1 | 0 | 1 | 0 | 1 | 1 | 0 | 0 |
| 2D | 88 | 1 | 0 | 0 | 0 | 1 | 0 | 0 | 0 | 0 | 1 | 1 | 0 | 1 |
| 2E | 8B | 1 | 0 | 0 | 0 | 1 | 0 | 1 | 1 | 0 | 1 | 1 | 1 | 0 |
| 2F | 8E | 1 | 0 | 0 | 0 | 1 | 1 | 1 | 0 | 0 | 1 | 1 | 1 | 1 |
| 30 | 92 | 1 | 0 | 0 | 1 | 0 | 0 | 1 | 0 | 1 | 0 | 0 | 0 | 0 |
| 31 | 95 | 1 | 0 | 0 | 1 | 0 | 1 | 0 | 1 | 1 | 0 | 0 | 0 | 1 |
| 32 | 98 | 1 | 0 | 0 | 1 | 1 | 0 | 0 | 0 | 1 | 0 | 0 | 1 | 0 |
| 33 | 9B | 1 | 0 | 0 | 1 | 1 | 0 | 1 | 1 | 1 | 0 | 0 | 1 | 1 |
| 34 | 9E | 1 | 0 | 0 | 1 | 1 | 1 | 1 | 0 | 1 | 0 | 1 | 0 | 0 |
| 35 | A1 | 1 | 0 | 1 | 0 | 0 | 0 | 0 | 1 | 1 | 0 | 1 | 0 | 1 |
| 36 | A4 | 1 | 0 | 1 | 0 | 0 | 1 | 0 | 0 | 1 | 0 | 1 | 1 | 0 |
| 37 | A7 | 1 | 0 | 1 | 0 | 0 | 1 | 1 | 1 | 1 | 0 | 1 | 1 | 1 |
| 38 | AA | 1 | 0 | 1 | 0 | 1 | 0 | 1 | 0 | 1 | 1 | 0 | 0 | 0 |
| 39 | AD | 1 | 0 | 1 | 0 | 1 | 1 | 0 | 1 | 1 | 1 | 0 | 0 | 1 |
| 3A | B0 | 1 | 0 | 1 | 1 | 0 | 0 | 0 | 0 | 1 | 1 | 0 | 1 | 0 |
| 3B | B3 | 1 | 0 | 1 | 1 | 0 | 0 | 1 | 1 | 1 | 1 | 0 | 1 | 1 |
| 3C | B6 | 1 | 0 | 1 | 1 | 0 | 1 | 1 | 0 | 1 | 1 | 1 | 0 | 0 |
| 3D | B9 | 1 | 0 | 1 | 1 | 1 | 0 | 0 | 1 | 1 | 1 | 1 | 0 | 1 |
| 3E | BC | 1 | 0 | 1 | 1 | 1 | 0 | 1 | 1 | 1 | 1 | 1 | 1 | 0 |
| 3F | BF | 1 | 0 | 1 | 1 | 1 | 1 | 1 | 0 | 1 | 1 | 1 | 1 | 1 |
| 40 | C2 | 1 | 1 | 0 | 0 | 0 | 0 | 1 | 0 | 0 | 0 | 0 | 0 | 0 |
| 41 | BF | 1 | 0 | 1 | 1 | 1 | 1 | 1 | 0 | 1 | 1 | 1 | 1 | 1 |
| 42 | BC | 1 | 0 | 1 | 1 | 1 | 0 | 1 | 1 | 1 | 1 | 1 | 1 | 0 |
| 43 | B9 | 1 | 0 | 1 | 1 | 1 | 0 | 0 | 1 | 1 | 1 | 1 | 0 | 1 |
| 44 | B6 | 1 | 0 | 1 | 1 | 0 | 1 | 1 | 0 | 1 | 1 | 1 | 0 | 0 |
| 45 | B3 | 1 | 0 | 1 | 1 | 0 | 0 | 1 | 1 | 1 | 1 | 0 | 1 | 1 |
| 46 | B0 | 1 | 0 | 1 | 1 | 0 | 0 | 0 | 0 | 1 | 1 | 0 | 1 | 0 |
| 47 | AD | 1 | 0 | 1 | 0 | 1 | 1 | 0 | 1 | 1 | 1 | 0 | 0 | 1 |
| 48 | AA | 1 | 0 | 1 | 0 | 1 | 0 | 1 | 0 | 1 | 1 | 0 | 0 | 0 |
| 49 | A7 | 1 | 0 | 1 | 0 | 0 | 1 | 1 | 1 | 1 | 0 | 1 | 1 | 1 |
| 4A | A4 | 1 | 0 | 1 | 0 | 0 | 1 | 0 | 0 | 1 | 0 | 1 | 1 | 0 |
| 4B | A1 | 1 | 0 | 1 | 0 | 0 | 0 | 0 | 1 | 1 | 0 | 1 | 0 | 1 |
| 4C | 9E | 1 | 0 | 0 | 1 | 1 | 1 | 1 | 0 | 1 | 0 | 1 | 0 | 0 |
| 4D | 9B | 1 | 0 | 0 | 1 | 1 | 0 | 1 | 1 | 1 | 0 | 0 | 1 | 1 |
| 4E | 98 | 1 | 0 | 0 | 1 | 1 | 0 | 0 | 0 | 1 | 0 | 0 | 1 | 0 |
| 4F | 95 | 1 | 0 | 0 | 1 | 0 | 1 | 0 | 0 | 1 | 0 | 0 | 0 | 1 |
| 50 | 92 | 1 | 0 | 0 | 1 | 0 | 0 | 1 | 0 | 1 | 0 | 0 | 0 | 0 |
| 51 | 8E | 1 | 0 | 0 | 0 | 1 | 1 | 1 | 0 | 0 | 1 | 1 | 1 | 1 |
| 52 | 8B | 1 | 0 | 0 | 0 | 1 | 0 | 1 | 1 | 0 | 1 | 1 | 1 | 0 |
| 53 | 88 | 1 | 0 | 0 | 0 | 1 | 0 | 0 | 0 | 0 | 1 | 1 | 0 | 1 |
| 54 | 85 | 1 | 0 | 0 | 0 | 0 | 1 | 0 | 1 | 0 | 1 | 1 | 0 | 0 |
| 55 | 82 | 1 | 0 | 0 | 0 | 0 | 0 | 1 | 0 | 0 | 1 | 0 | 1 | 1 |
| 56 | 7F | 0 | 1 | 1 | 1 | 1 | 1 | 1 | 1 | 0 | 1 | 0 | 1 | 0 |
| 57 | 7C | 0 | 1 | 1 | 1 | 1 | 1 | 0 | 0 | 0 | 1 | 0 | 0 | 1 |
| 58 | 79 | 0 | 1 | 1 | 1 | 1 | 0 | 0 | 1 | 0 | 1 | 0 | 0 | 0 |
| 59 | 76 | 0 | 1 | 1 | 1 | 0 | 1 | 1 | 0 | 0 | 0 | 1 | 1 | 1 |
| 5A | 73 | 0 | 1 | 1 | 1 | 0 | 0 | 1 | 1 | 0 | 0 | 1 | 1 | 0 |
| 5B | 70 | 0 | 1 | 1 | 1 | 0 | 0 | 0 | 0 | 0 | 0 | 1 | 0 | 1 |
| 5C | 6D | 0 | 1 | 1 | 0 | 1 | 1 | 0 | 1 | 0 | 0 | 1 | 0 | 0 |
| 5D | 6A | 0 | 1 | 1 | 0 | 1 | 0 | 1 | 0 | 0 | 0 | 0 | 1 | 1 |
| 5E | 67 | 0 | 1 | 1 | 0 | 0 | 1 | 1 | 1 | 0 | 0 | 0 | 1 | 0 |
| 5F | 64 | 0 | 1 | 1 | 0 | 0 | 1 | 0 | 0 | 0 | 0 | 0 | 0 | 1 |

FIG. 13A

| 8-BIT COUNTER | 8-BIT OUTPUT | bit12 | bit11 | bit10 | bit9 | bit8 | bit7 | bit6 | bit5 | bit4 | bit3 | bit2 | bit1 | bit0 |
|---|---|---|---|---|---|---|---|---|---|---|---|---|---|---|
| 60 | 61 | 0 | 1 | 1 | 0 | 0 | 0 | 0 | 1 | 0 | 0 | 0 | 0 | 0 |
| 61 | 5E | 0 | 1 | 0 | 1 | 1 | 1 | 0 | 1 | 1 | 1 | 1 | 1 | 1 |
| 62 | 5B | 0 | 1 | 0 | 1 | 1 | 0 | 1 | 0 | 1 | 1 | 1 | 1 | 0 |
| 63 | 58 | 0 | 1 | 0 | 1 | 0 | 1 | 1 | 1 | 1 | 1 | 1 | 0 | 1 |
| 64 | 55 | 0 | 1 | 0 | 1 | 0 | 1 | 0 | 0 | 1 | 1 | 1 | 0 | 0 |
| 65 | 52 | 0 | 1 | 0 | 1 | 0 | 0 | 0 | 1 | 1 | 1 | 0 | 1 | 1 |
| 66 | 4F | 0 | 1 | 0 | 0 | 1 | 1 | 1 | 0 | 1 | 1 | 0 | 1 | 0 |
| 67 | 4C | 0 | 1 | 0 | 0 | 1 | 0 | 1 | 1 | 1 | 1 | 0 | 0 | 1 |
| 68 | 49 | 0 | 1 | 0 | 0 | 1 | 0 | 0 | 0 | 1 | 1 | 0 | 0 | 0 |
| 69 | 46 | 0 | 1 | 0 | 0 | 0 | 1 | 0 | 1 | 1 | 0 | 1 | 1 | 1 |
| 6A | 43 | 0 | 1 | 0 | 0 | 0 | 0 | 1 | 0 | 1 | 0 | 1 | 1 | 0 |
| 6B | 40 | 0 | 0 | 1 | 1 | 1 | 1 | 1 | 1 | 1 | 0 | 1 | 0 | 1 |
| 6C | 3D | 0 | 0 | 1 | 1 | 1 | 1 | 0 | 0 | 1 | 0 | 1 | 0 | 0 |
| 6D | 3A | 0 | 0 | 1 | 1 | 1 | 0 | 0 | 1 | 1 | 0 | 0 | 1 | 1 |
| 6E | 37 | 0 | 0 | 1 | 1 | 0 | 1 | 1 | 0 | 1 | 0 | 0 | 1 | 0 |
| 6F | 34 | 0 | 0 | 1 | 1 | 0 | 0 | 1 | 1 | 1 | 0 | 0 | 0 | 1 |
| 70 | 31 | 0 | 0 | 1 | 1 | 0 | 0 | 0 | 0 | 1 | 0 | 0 | 0 | 0 |
| 71 | 2D | 0 | 0 | 1 | 0 | 1 | 1 | 0 | 1 | 0 | 1 | 1 | 1 | 1 |
| 72 | 2A | 0 | 0 | 1 | 0 | 1 | 0 | 1 | 0 | 0 | 1 | 1 | 1 | 0 |
| 73 | 27 | 0 | 0 | 1 | 0 | 0 | 1 | 1 | 1 | 0 | 1 | 1 | 0 | 1 |
| 74 | 24 | 0 | 0 | 1 | 0 | 0 | 1 | 0 | 0 | 0 | 1 | 1 | 0 | 0 |
| 75 | 21 | 0 | 0 | 1 | 0 | 0 | 0 | 0 | 1 | 0 | 1 | 0 | 1 | 1 |
| 76 | 1E | 0 | 0 | 0 | 1 | 1 | 1 | 1 | 0 | 0 | 1 | 0 | 1 | 0 |
| 77 | 1B | 0 | 0 | 0 | 1 | 1 | 0 | 1 | 1 | 0 | 1 | 0 | 0 | 1 |
| 78 | 18 | 0 | 0 | 0 | 1 | 1 | 0 | 0 | 0 | 0 | 1 | 0 | 0 | 0 |
| 79 | 15 | 0 | 0 | 0 | 1 | 0 | 1 | 0 | 1 | 0 | 0 | 1 | 1 | 1 |
| 7A | 12 | 0 | 0 | 0 | 1 | 0 | 0 | 1 | 0 | 0 | 0 | 1 | 1 | 0 |
| 7B | 0F | 0 | 0 | 0 | 0 | 1 | 1 | 1 | 1 | 0 | 0 | 1 | 0 | 1 |
| 7C | 0C | 0 | 0 | 0 | 0 | 1 | 1 | 0 | 0 | 0 | 0 | 1 | 0 | 0 |
| 7D | 09 | 0 | 0 | 0 | 0 | 1 | 0 | 0 | 1 | 0 | 0 | 0 | 1 | 1 |
| 7E | 06 | 0 | 0 | 0 | 0 | 0 | 1 | 1 | 0 | 0 | 0 | 0 | 1 | 0 |
| 7F | 03 | 0 | 0 | 0 | 0 | 0 | 0 | 1 | 1 | 0 | 0 | 0 | 0 | 1 |
| 80 | 00 | 0 | 0 | 0 | 0 | 0 | 0 | 0 | 0 | 0 | 0 | 0 | 0 | 0 |
| 81 | 03 | 0 | 0 | 0 | 0 | 0 | 0 | 1 | 1 | 0 | 0 | 0 | 0 | 1 |
| 82 | 06 | 0 | 0 | 0 | 0 | 0 | 1 | 1 | 0 | 0 | 0 | 0 | 1 | 0 |
| 83 | 09 | 0 | 0 | 0 | 0 | 1 | 0 | 0 | 1 | 0 | 0 | 0 | 1 | 1 |
| 84 | 0C | 0 | 0 | 0 | 0 | 1 | 1 | 0 | 0 | 0 | 0 | 1 | 0 | 0 |
| 85 | 0F | 0 | 0 | 0 | 0 | 1 | 1 | 1 | 1 | 0 | 0 | 1 | 0 | 1 |
| 86 | 12 | 0 | 0 | 0 | 1 | 0 | 0 | 1 | 0 | 0 | 0 | 1 | 1 | 0 |
| 87 | 15 | 0 | 0 | 0 | 1 | 0 | 1 | 0 | 1 | 0 | 0 | 1 | 1 | 1 |
| 88 | 18 | 0 | 0 | 0 | 1 | 1 | 0 | 0 | 0 | 0 | 1 | 0 | 0 | 0 |
| 89 | 1B | 0 | 0 | 0 | 1 | 1 | 0 | 1 | 1 | 0 | 1 | 0 | 0 | 1 |
| 8A | 1E | 0 | 0 | 0 | 1 | 1 | 1 | 1 | 0 | 0 | 1 | 0 | 1 | 0 |
| 8B | 21 | 0 | 0 | 1 | 0 | 0 | 0 | 0 | 1 | 0 | 1 | 0 | 1 | 1 |
| 8C | 24 | 0 | 0 | 1 | 0 | 0 | 1 | 0 | 0 | 0 | 1 | 1 | 0 | 0 |
| 8D | 27 | 0 | 0 | 1 | 0 | 0 | 1 | 1 | 1 | 0 | 1 | 1 | 0 | 1 |
| 8E | 2A | 0 | 0 | 1 | 0 | 1 | 0 | 1 | 0 | 0 | 1 | 1 | 1 | 0 |
| 8F | 2D | 0 | 0 | 1 | 0 | 1 | 1 | 0 | 1 | 0 | 1 | 1 | 1 | 1 |
| 90 | 31 | 0 | 0 | 1 | 1 | 0 | 0 | 0 | 0 | 1 | 0 | 0 | 0 | 0 |
| 91 | 34 | 0 | 0 | 1 | 1 | 0 | 0 | 1 | 1 | 1 | 0 | 0 | 0 | 1 |
| 92 | 37 | 0 | 0 | 1 | 1 | 0 | 1 | 1 | 0 | 1 | 0 | 0 | 1 | 0 |
| 93 | 3A | 0 | 0 | 1 | 1 | 1 | 0 | 0 | 1 | 1 | 0 | 0 | 1 | 1 |
| 94 | 3D | 0 | 0 | 1 | 1 | 1 | 1 | 0 | 0 | 1 | 0 | 1 | 0 | 0 |
| 95 | 40 | 0 | 0 | 1 | 1 | 1 | 1 | 1 | 1 | 1 | 0 | 1 | 0 | 1 |
| 96 | 43 | 0 | 1 | 0 | 0 | 0 | 0 | 1 | 0 | 1 | 0 | 1 | 1 | 0 |
| 97 | 46 | 0 | 1 | 0 | 0 | 0 | 1 | 0 | 1 | 1 | 0 | 1 | 1 | 1 |
| 98 | 49 | 0 | 1 | 0 | 0 | 1 | 0 | 0 | 0 | 1 | 1 | 0 | 0 | 0 |
| 99 | 4C | 0 | 1 | 0 | 0 | 1 | 0 | 1 | 1 | 1 | 1 | 0 | 0 | 1 |
| 9A | 4F | 0 | 1 | 0 | 0 | 1 | 1 | 1 | 0 | 1 | 1 | 0 | 1 | 0 |
| 9B | 52 | 0 | 1 | 0 | 1 | 0 | 0 | 0 | 1 | 1 | 1 | 0 | 1 | 1 |
| 9C | 55 | 0 | 1 | 0 | 1 | 0 | 1 | 0 | 0 | 1 | 1 | 1 | 0 | 0 |
| 9D | 58 | 0 | 1 | 0 | 1 | 0 | 1 | 1 | 1 | 1 | 1 | 1 | 0 | 1 |
| 9E | 5B | 0 | 1 | 0 | 1 | 1 | 0 | 1 | 0 | 1 | 1 | 1 | 1 | 0 |
| 9F | 5E | 0 | 1 | 0 | 1 | 1 | 1 | 0 | 1 | 1 | 1 | 1 | 1 | 1 |

FIG. 13B

|  | INPUT 5-BIT VALUE | OUTPUT 4-BIT VALUE |
|---|---|---|
| 0 | 00000b | 1000b |
| 1 | 00001b | 0111b |
| 2 | 00010b | 0110b |
| 3 | 00011b | 0101b |
| 4 | 00100b | 0100b |
| 5 | 00101b | 0011b |
| 6 | 00110b | 0010b |
| 7 | 00111b | 0001b |
| 8 | 01000b | 0000b |
| 9 | 01001b | 0000b |
| 10 | 01010b | 0000b |
| 11 | 01011b | 0000b |
| 12 | 01100b | 0001b |
| 13 | 01101b | 0010b |
| 14 | 01110b | 0011b |
| 15 | 01111b | 0100b |
| 16 | 10000b | 0101b |
| 17 | 10001b | 0110b |
| 18 | 10010b | 0111b |
| 19 | 10011b | 1000b |

FIG. 15

| ERROR RETENTION REGISTER 94 | LOWER 10-BIT OF 19-BIT REGISTER 90 | COMP. 85-2 OUTPUT |
|---|---|---|
| 0 | 300 | 1 |
| −(1024×1)+0+300=−724 | 300 | 0 |
| −(1024×0)+(−724)+300=−424 | 300 | 0 |
| −(1024×0)+(−424)+300=−124 | 300 | 0 |
| −(1024×0)+(−124)+300=224 | 300 | 1 |
| −(1024×1)+224+300=−500 | 300 | 0 |
| −(1024×0)+(−500)+300=−200 | 300 | 0 |
| −(1024×0)+(−200)+300=100 | 300 | 1 |
| −(1024×1)+100+300=−624 | 300 | 0 |
| −(1024×0)+(−624)+300=−324 | 300 | 0 |
| −(1024×0)+(−324)+300=−24 | 300 | 0 |
| −(1024×0)+(−24)+300=276 | 300 | 1 |
| −(1024×1)+276+300=−448 | 300 | 0 |

FIG. 17

|  | INPUT 5-BIT VALUE | OUTPUT 4-BIT VALUE |
|---|---|---|
| 0 | 00000b | 0011b |
| 1 | 00001b | 0011b |
| 2 | 00010b | 0011b |
| 3 | 00011b | 0011b |
| 4 | 00100b | 0011b |
| 5 | 00101b | 0011b |
| 6 | 00110b | 0010b |
| 7 | 00111b | 0001b |
| 8 | 01000b | 0000b |
| 9 | 01001b | 0000b |
| 10 | 01010b | 0000b |
| 11 | 01011b | 0000b |
| 12 | 01100b | 0001b |
| 13 | 01101b | 0001b |
| 14 | 01110b | 0010b |
| 15 | 01111b | 0100b |
| 16 | 10000b | 0110b |
| 17 | 10001b | 0110b |
| 18 | 10010b | 0111b |
| 19 | 10011b | 1000b |

FIG. 25

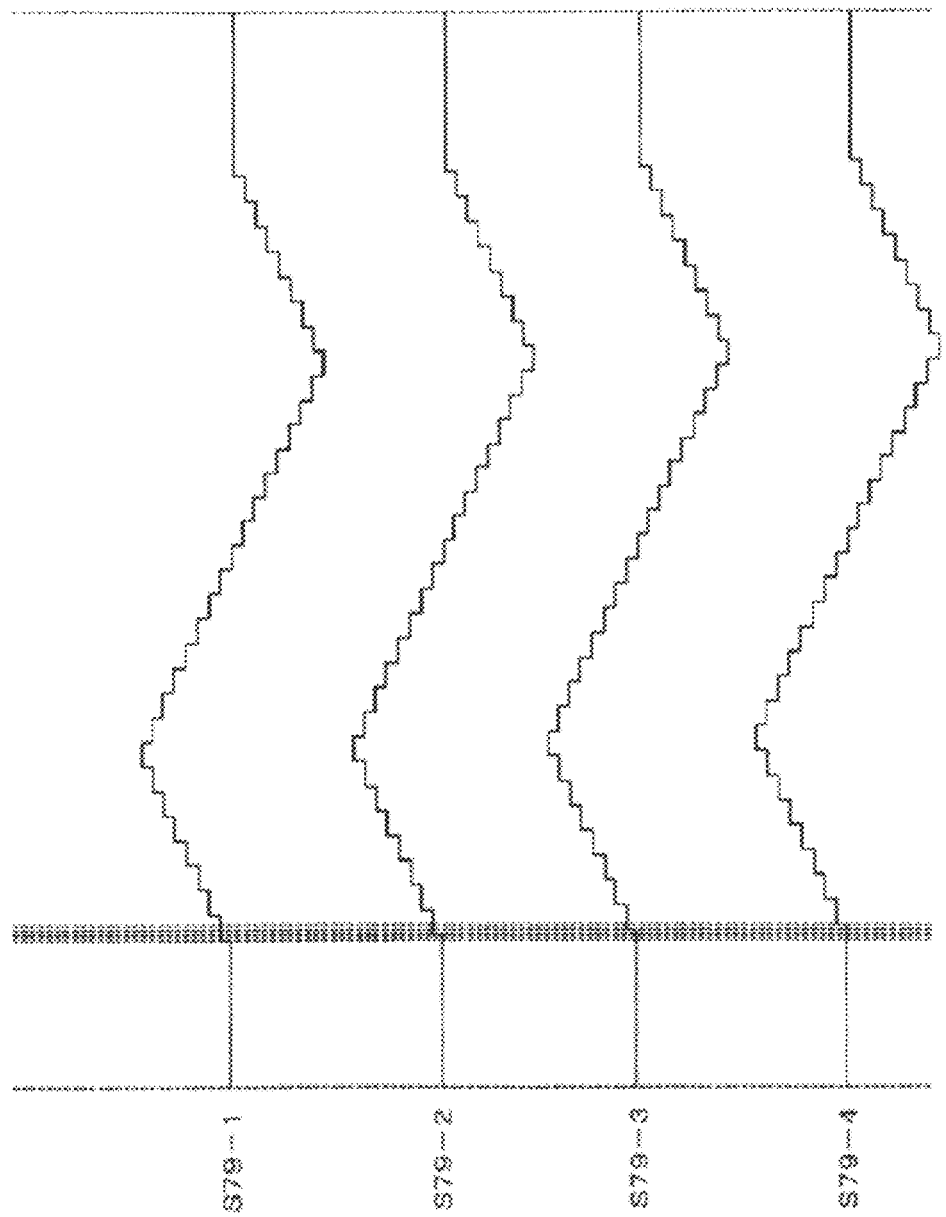

PIEZOELECTRIC TRANSFORMER DRIVING DEVICE CONTROLLED BY VARIABLE REFERENCE VOLTAGE VALUES AND IMAGE FORMING DEVICE

CROSS REFERENCE

The present application is related to, claims priority from, and incorporates by reference Japanese patent application number 2009-128630, filed on May 28, 2009.

TECHNICAL FIELD

The present claimed invention relates to a piezoelectric transformer driving device that drives a piezoelectric transformer and outputs a voltage. The present claimed invention also relates to an image forming device that use the piezoelectric transformer driving device.

BACKGROUND

A conventional piezoelectric transformer driving device that is used for an electrographic image forming device is disclosed in Japanese laid-open patent application publication number H11-206113. In this device, a piezoelectric transformer that generates a high voltage with a low voltage input by using a resonance phenomenon of a piezoelectric vibrator is controlled by an output signal of a voltage-controlled oscillator (VCO) to output the high voltage.

However, because the device with the structures discussed above is configured with an analog circuit, such as a VCO, there is a problem of having a large number of parts. There is also the additional problem that it is hard to have both a high voltage output near resonance frequency and a short rise time for the output voltage.

SUMMARY

A piezoelectric transformer driving device includes a piezoelectric transformer with a certain resonance frequency configured such that when an input voltage is intermittently applied to a primary side, an alternating high voltage is output from a secondary side, a switching part configured to generate the input voltage by switching based on a control signal having a control frequency, and configured to supply the voltage to the piezoelectric transformer, a switching control part configured to control the control frequency of the control signal based on a comparison result, and configured to supply the control signal to the switching part, a reference voltage waveform generation part configured to switch between a first voltage value as a target value, a second voltage value that is lower than the first voltage value, and a third voltage value that is higher than the first voltage value, within a given unit time so that a reference voltage waveform is generated, a monitor voltage generation part configured to generate a monitor voltage waveform based on the high voltage output from the piezoelectric transformer; and a comparison part configured to compare the reference voltage waveform with the monitor voltage waveform to generate a comparison result, and configured to supply the comparison result to the switching control part.

An image forming device according to the present claimed invention has the piezoelectric transformer driving device discussed above.

Therefore, a piezoelectric transformer driving device and an image forming device that uses the piezoelectric transformer driving device according to the present claimed invention can achieve effects in which they are configured with a small number of parts. Furthermore, it is possible to have both a stable, constant voltage control with a high voltage output near the resonance frequency using a piezoelectric transformer, and control the voltage to have a short rise time.

BRIEF DESCRIPTION OF THE DRAWINGS

FIG. 8A is a table showing numerical examples of triangle wave data that is output from a control unit shown in FIG. 1 and a target voltage that is output from a DAC shown in FIG. 1.

FIG. 8B is a table showing numerical examples of triangle wave data that is output from a control unit shown in FIG. 1 and a target voltage that is output from a DAC shown in FIG. 1. In the FIGS. 8A and 8B, SC represents a start cycle, EC represents end cycle. CUOHV represents a control unit output HEX value, and DOV represents a DAC output voltage (V).

FIG. 13A is a table showing numerical examples of a count value for an 8-bit counter in a triangle wave data generation unit shown in FIG. 7.

FIG. 13B is a table showing numerical examples of a count value for an 8-bit counter in a triangle wave data generation unit shown in FIG. 7.

FIG. 15 is a table showing input and output values of a table register shown in FIG. 6.

FIG. 17 is a table showing a relationship among values of an error holding register, values of lower 10 bits of a 19-bit register, and binary outputs of a select signal that is output from a comparison unit.

FIG. 25 is a table showing input and output values of a table register shown in FIG. 23.

FIG. 30 is a waveform diagram showing target voltages for four channels according a sixth disclosed embodiment.

DETAILED DESCRIPTION

Exemplary embodiments according to the present claimed invention will be clear with explanations for disclosed embodiments below and with reference to drawings. However, the drawings are just for explanation purposes and are not for limiting the scope of the present claimed invention.

Figure 2:
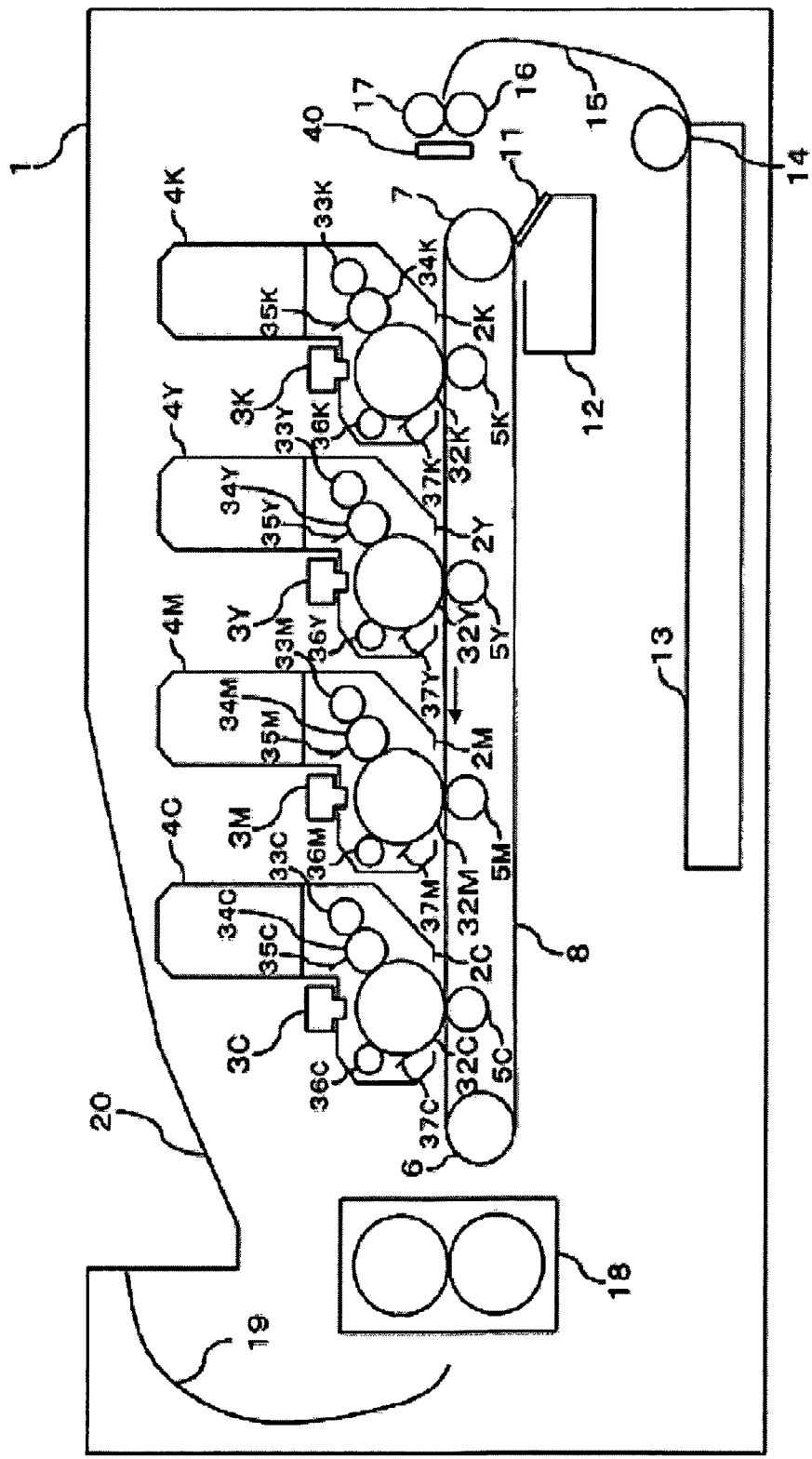
FIG. 2 is a schematic view of an image forming device that uses a piezoelectric transformer driving device according to a first disclosed embodiment¥.

First Disclosed Embodiment (Configuration of Image Forming Device) FIG. 2 is a schematic view of an image forming device that uses a piezoelectric transformer driving device according to a first disclosed embodiment.

The image forming device 1 is, for example, a color tandem-type image forming device in which a black developer 2K, a yellow developer 2Y, a magenta developer 2M, and a cyan developer 2C are detachably mounted. Each of the developers 2K, 2Y, 2M, and 2C is uniformly charged by charge rollers 36K, 36Y, 36M, and 36C for each color that contacts photoreceptor drums 32K, 32Y, 32M, and 32C for each color, respectively. Latent images are formed on each of the photoreceptor drums 32K, 32Y, 32M, and 32C through light emitted from a black light emitting diode device (LED) head 3K, a yellow LED head 3Y, a magenta LED head 3M, and a cyan LED head 3C, respectively.

Supplying rollers 33K, 33Y, 33M, and 33C for each color in each of the developers 2K, 2Y, 2M, and 2C supply toner to each of developing rollers 34K, 34Y, 34M, and 34C, respectively. Then, a toner layer is uniformly formed on each surface of the developing rollers 34K, 34Y, 34M, and 34C by developing blades 35K, 35Y, 35M, and 35C for each color, respectively. As a result, a toner image is developed on each of the photoreceptor drums 32K, 32Y, 32M, and 32C. Each of cleaning blades 37K, 37Y, 37M, and 37C in the developer 2K, 2Y, 2M, and 2C for each color scrapes remaining toner for cleaning after transferring.

A black toner cartridge 4K, a yellow toner cartridge 4Y, a magenta toner cartridge 4M, and a cyan toner cartridge 4C are detachably attached to the developers 2K, 2Y, 2M, and 2C, respectively, and supply toner from inside the cartridges to the developers 2K, 2Y, 2M, and 2C, respectively. A black transferring roller 5K, a yellow transferring roller 5Y, a magenta transferring roller 5M, and a cyan transferring roller 5C are located to apply a bias to each of transferring pressing area from the back side of a transferring belt 8. A transferring belt drive roller 6 and a transferring belt driven roller 7 are configured to carry a sheet 15 by driving the rollers 6 and 7 through tensioning of a transferring belt 8.

A transferring belt cleaning blade 11 can scrape toner from the transferring belt 8. The scraped toner is stored in a transferring belt cleaner container 12. A sheet cassette 13 is detachably attached to the image forming device 1. Sheets 15, operating as a transferring medium, are stacked in the sheet cassette 13. A sheet 15 is carried from the sheet cassette 13 via a hopping roller 14. The sheet 15 is carried to the transferring belt 8 using certain timing by registration rollers 16 and 17. A fuser 18 fuses a toner image on the sheet 15 by heat and pressure. A sheet guide 19 ejects the sheet 15 facedown to a catch tray 20.

A sheet detection sensor 40 is provided near the registration rollers 16 and 17. The sheet detection sensor 40 detects the passage of a sheet 15 by a contact or non-contact method. Timing for applying a transferring bias by a high voltage power source device at the time of transferring through the transferring rollers 5K, 5Y, 5M, and 5C is decided using a distance between the position of this sensor and the transferring pressing area, and a time that is obtained by a carrying speed of a sheet.

Figure 3:
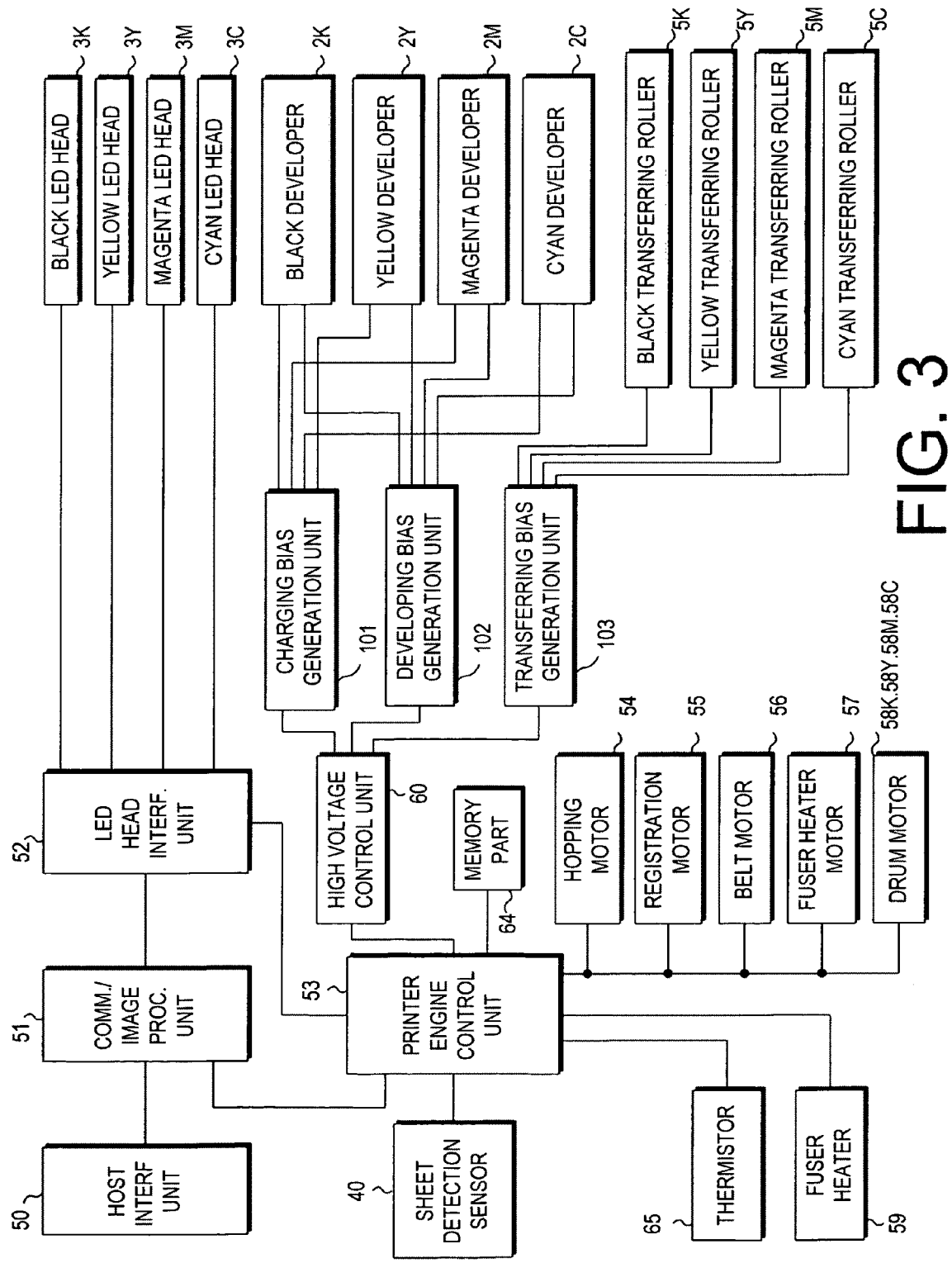
FIG. 3 is a block diagram of a control circuit of an image forming device shown in FIG. 2.

FIG. 3 is a block diagram of a control circuit of an image forming device 1 shown in FIG. 2. The control circuit has a host interface unit 50. The host interface unit 50 sends and receives data to/from a command/image processing unit 51. The command/image processing unit 51 outputs image data to an LED head interface unit 52. A head driving pulse and so on for the LED head interface unit 52 are controlled by a printer engine control unit 53 (PECU) so that the LED head interface unit 52 makes the LED heads 3K, 3Y, 3M, and 3C emit light.

The printer engine control unit 53 receives a detection signal and so on from the sheet detection sensor 40 and sends control values, such as a charging bias, a developing bias, and a transferring bias, to a high voltage control unit 60. The high voltage control unit 60 sends a signal to a charging bias generation unit 101, a developing bias generation unit 102, and a transferring bias generation unit 103. The charging bias generation unit 101 and the developing bias generation unit 102 apply a bias to each of the charge rollers 36K, 36Y, 36M, and 36C and to each of the developing rollers 34K, 34Y, 34M, and 34C, respectively, of the black developer 2K, the yellow developer 2Y, the magenta developer 2M, and the cyan developer 2C. A piezoelectric transformer driving device according to a first disclosed embodiment is located in the high voltage control unit 60 and the transferring bias generation unit 103.

The printer engine control unit 53 drives the following motors according to certain timing: a hopping motor 54, a registration motor 55, a belt motor 56, a fuser heater motor 57, and each of drum motors 58K, 58Y, 58M, and 58C for each color. A fuser heater 59 is temperature-controlled by the printer engine control unit 53 according to a detection value of a thermistor 65.

Figure 1:
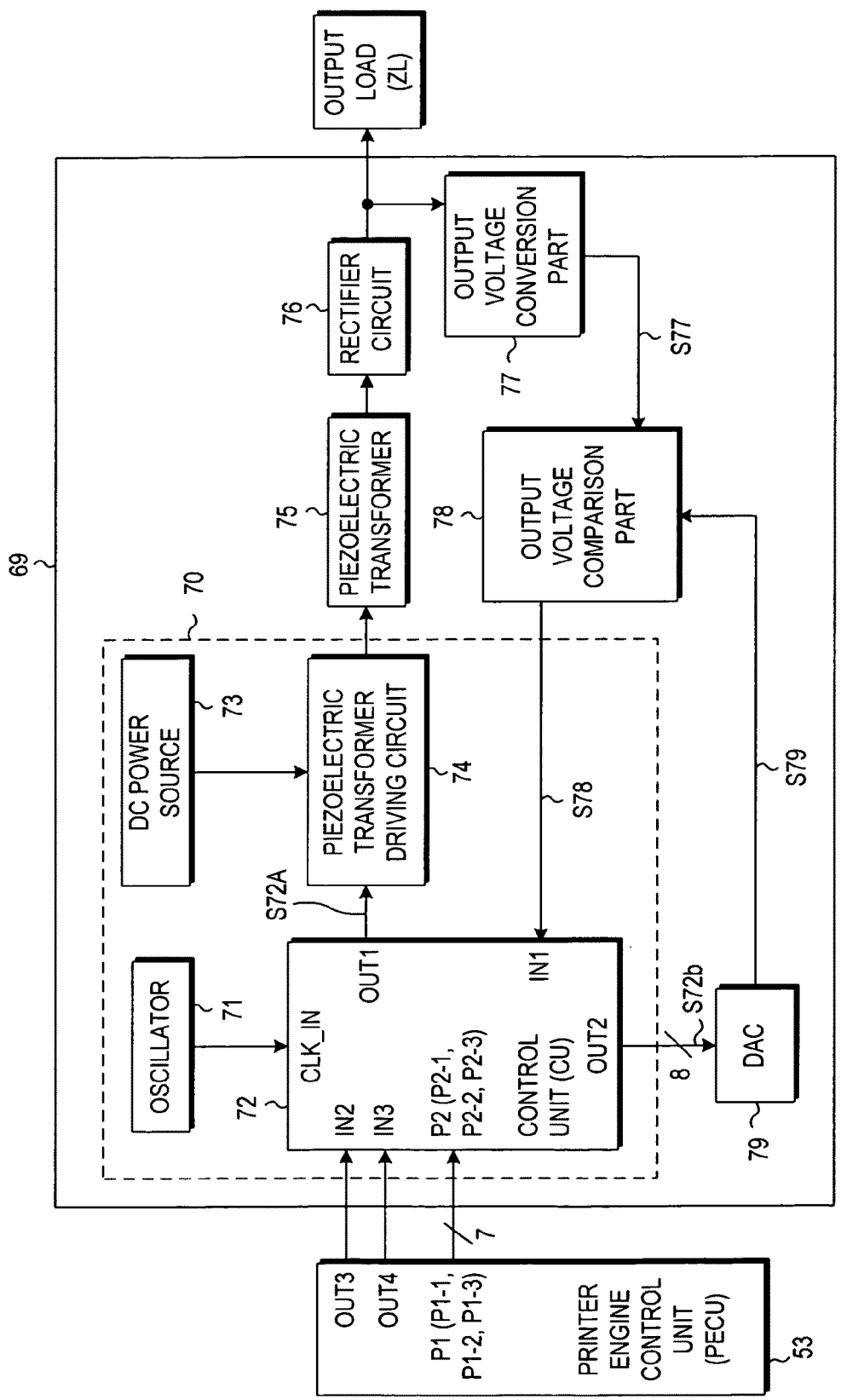
FIG. 1 is a block diagram of a high voltage power source device with a piezoelectric transformer driving device according to a first disclosed embodiment.

(Configuration of High Voltage Power Source Device) FIG. 1 is a block diagram of a high voltage power source device with a piezoelectric transformer driving device according to a first disclosed embodiment.

A high voltage power source device 69 is located in the high voltage control unit 60 and the transferring bias generation unit 103 shown in FIG. 3. A high voltage power source device 69 is provided for each of the transferring rollers 5 (5K, 5Y, 5M, and 5C) for each color. Each of the high voltage power source devices 69 for a corresponding color has the same circuit configuration so that only one of the circuit configurations is explained below by way of example.

In the high voltage power source device 69, a control signal (for example, an on and off signal (referred to as an ON/OFF signal)) is output from the printer engine control unit 53, a reset signal RESET, and a high voltage output instruction value DATA are input; and a high voltage in direct current (DC) is generated. The DC high voltage is supplied to an output load ZL (e.g., the transferring roller 5). The printer engine control unit 53 has a output port OUT3 outputting the ON/OFF signal, an output port OUT4 outputting the reset signal RESET, and a port P1 that serves as a serial communication line outputting the high voltage output instruction value DATA and so on. The port P1 for a serial communication line has a plurality of ports, for example, a port P1-1 outputting a chip select signal CS, a port P1-2 outputting a clock signal CK, and a port P1-3 outputting the high voltage output instruction value DATA.

The high voltage power source device 69 has a piezoelectric transformer driving device 70, a piezoelectric transformer (PT) 75, a rectifier circuit 76, a monitor voltage generation part 77 (for example, an output voltage conversion part), a comparison part 78 (for example, an output voltage comparison part), and a reference voltage waveform generation part 79 (for example, a digital/analog converter (DAC)).

The piezoelectric transformer driving device 70 drives the piezoelectric transformer 75 based on a control signal supplied by the printer engine control unit 53. The piezoelectric transformer driving device 70 has an oscillator 71 outputting a reference clock signal (a clock signal) CLK of a certain frequency (for example, 25 MHz), a switching control part 72 (for example, a control unit (CU)), a DC power source 73 that outputs DC 24V, and a switching part 74 (for example, a piezoelectric transformer driving circuit).

The control unit 72 is a circuit that outputs a piezoelectric transformer driving pulse S72a (a driving pulse) as a control signal by dividing the clock signal CLK supplied from the oscillator 71 based on control signals (the ON/OFF signal, the reset signal RESET, the high voltage output instruction value DATA, and so on) supplied from the printer engine control unit 53. In other words, the control unit 72 may, for example, be a circuit that is located in the high voltage control unit 60, that is operated in synchronization with the clock signal CLK supplied from the oscillator 71, and that outputs the driving pulse S72a by controlling the printer engine control unit 53.

The control unit 72 has an input port CLK_IN for inputting the clock signal CLK, an input port IN1 for inputting a comparison result S78, an input port IN2 for inputting the ON/OFF signal, an input port IN3 for inputting the reset signal RESET, a port P2 operating as a serial communication line with, for example, 7 bits for inputting the high voltage output instruction value DATA and so on, an output port OUT1 for outputting the driving pulse S72a, and an output port OUT2 for outputting a triangle wave data S72b with, for example, 8 bits. The port P2 operating as a serial communication line has, for example, a port P2-1 for inputting the chip select signal CS, a port P2-2 for inputting the clock signal CLK, and a port P2-3 for inputting the high voltage output instruction value DATA. In the control unit 72, ON/OF states for the driving pulse S72a output from the output port OUT1 are controlled by the input ON/OFF signal. And, an output setting for the output port OUT1 is initialized by the input reset signal RESET.

The control unit 72 is configured with, for example, an application specific integrated circuit (ASIC) in which circuits of several functions for a specific application are integrated into one, a microprocessor containing a central processing unit (CPU), a field programmable gate array (FPGA) as a kind of a gate array in which a user can write an own logic circuit, or the like.

Both the output port OUT1 of the control unit 72 and the DC power source 73 are connected to the piezoelectric transformer driving circuit 74. The piezoelectric transformer driving circuit 74 is a circuit configured to output a driving voltage by using a switching element. The piezoelectric transformer 75 is connected to an output side of the piezoelectric transformer driving circuit 74. The piezoelectric transformer 75 is a transformer configured to output a high voltage with an alternate current (AC) by stepping-up a driving voltage with use of resonance phenomena of a piezoelectric vibrator, such as ceramic. The rectifier circuit 76 is connected to an output side of the piezoelectric transformer 75. The rectifier circuit 76 is a circuit to convert the AC high voltage output from the piezoelectric transformer 75 into the DC high voltage and to supply it to an output load (ZL). An output voltage conversion part 77 is connected to an output side of the rectifier circuit 76.

The output voltage conversion part 77 is a circuit configured to convert a DC high voltage to a DC low voltage S77 (i.e., a monitor voltage waveform). The control unit 72 and the DAC 79 are connected to an output side of the output voltage conversion part 77 through the output voltage comparison part 78. The output voltage comparison part 78 compares the DC low voltage S77 output from the output voltage conversion part 77 and a target voltage S79 and outputs this comparison result S78 to the input port IN1 of the control unit 72. DAC 79 is a circuit to convert the triangle wave data S72b with 8 bits output from the output port OUT2 of the control unit 72 into an analog signal and to output a target voltage S79 in a triangle waveform to the output voltage comparison part 78.

The high voltage power source devices 69 are juxtaposed for each color of each of the transferring rollers 5 (5K, 5Y, 5M, and 5C), namely for each channel. However, the high voltage power source devices 69 are not limited to this structure and can be a structure in which a part of it is shared with a plurality of the channels. For example, although the piezoelectric transformer 75, the rectifier circuit 76, and so on are required for each of the channels, the oscillator 71 and the control unit 72 can be shared. In this case, the control unit 72 has input and output ports for each of the channels. The control unit 72 is located in the high voltage power source device 69; however, it may be located inside of a large-scale integrated circuit (LSI) in the printer engine control unit 53.

Figure 4:
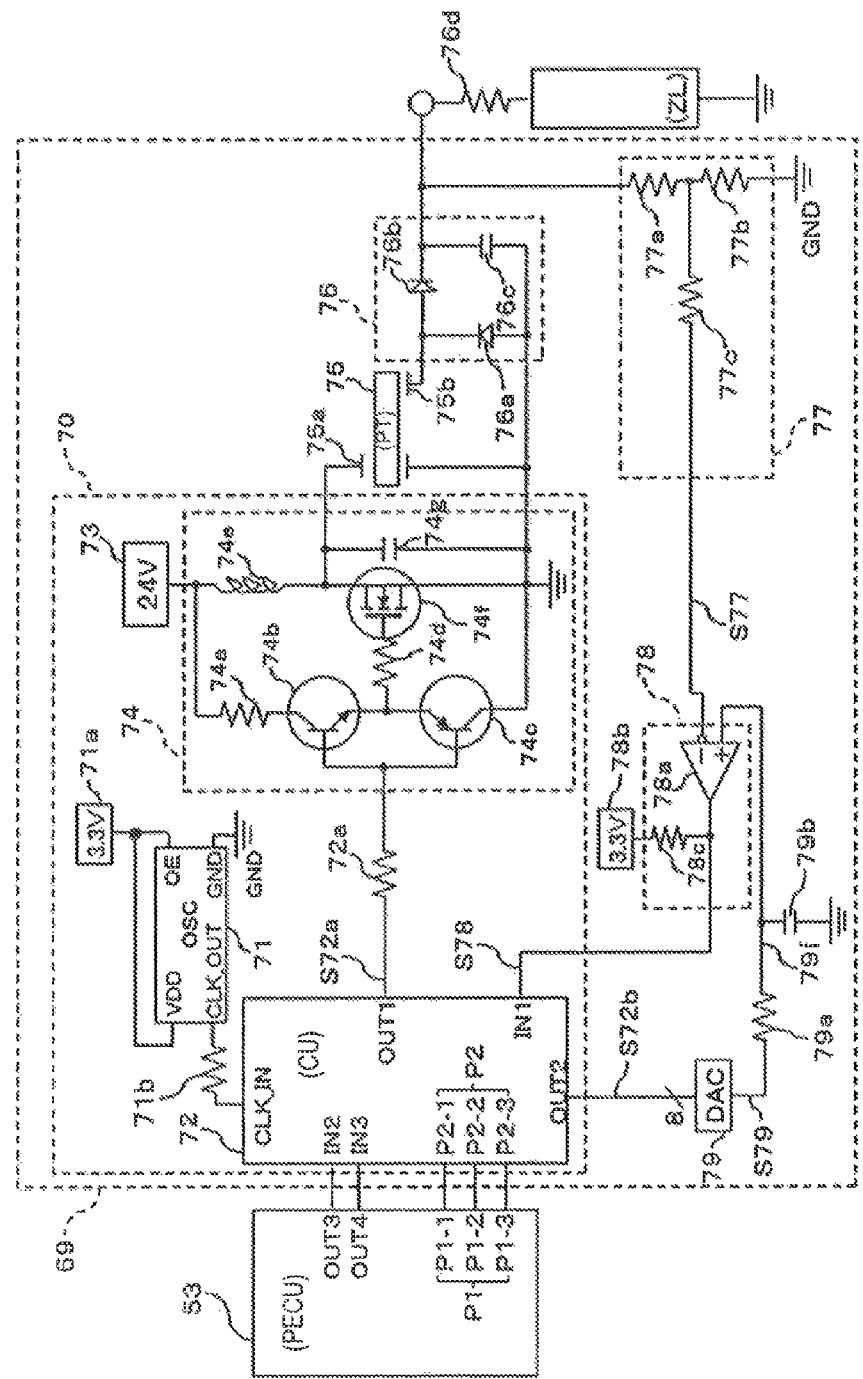
FIG. 4 is a detailed circuit diagram of a high voltage power source device shown in FIG. 1.
Figure 5:
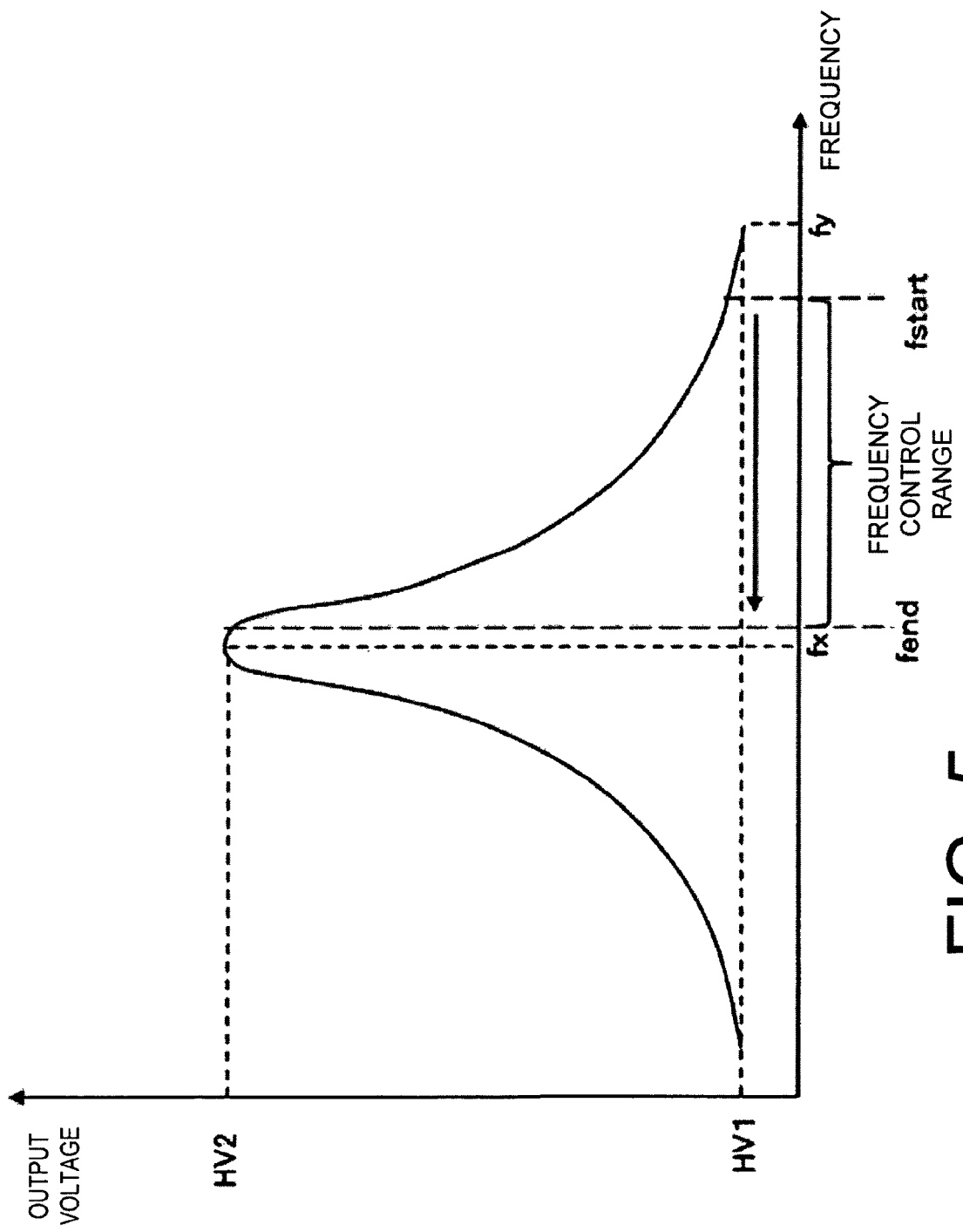
FIG. 5 is a graph of output voltage and frequency property of a piezoelectric transformer shown in FIG. 4.

FIG. 4 is a detailed circuit diagram of the high voltage power source device 69 shown in FIG. 1. FIG. 5 is a graph of output voltage and frequency property of the piezoelectric transformer 75 shown in FIG. 4.

One example of the oscillator 71 in the piezoelectric transformer driving device 70 is a circuit to perform with a voltage DC 3.3 V supplied from a power source 71a so that the oscillator 71 generates the clock signal CLK with an oscillating frequency of 25 MHz. The oscillator 71 has a power supply terminal VDD in which a power supply voltage (i.e., DC 3.3 V in this embodiment) is applied, an output enable terminal OE, a clock signal output terminal CLK_OUT outputting a clock signal CLK, and a ground terminal GND. The clock signal output terminal CLK_OUT is connected to the input port CLK_IN of the control unit 72 through a resistance 71b.

In the control unit 72, which operates in synchronization with a clock signal CLK, the piezoelectric transformer driving circuit 74 is connected to the output port OUT1, which outputs the driving pulse S72a through a resistance 72a. A DC power source 73 is connected to the piezoelectric transformer driving circuit 74. The DC power source is a power source to supply a power voltage (e.g., DC 24 V in the disclosed embodiment) using a transformed-rectifying voltage (e.g., AC 100V in the disclosed embodiment) as a commercial power source supplied from a low voltage power source device.

The piezoelectric transformer driving circuit 74 is configured with a load resistance 74a, an NPN transistor 74b and PNP transistor 74c that form a gate drive circuit to drive a driving pulse S72a input from the control unit 72 through a resistance 72a, an input resistance 74d, an inductor (e.g., a coil) 74e and capacitor 74g that form a resonance circuit, and a switching element 74f (e.g., an N channel power MOSFET (referred to as NMOS)). In the piezoelectric transformer driving circuit 74, when a pulse is input to a gate of the NMOS 74f through the gate drive circuit configured with the transistors 74b and 74c, and the input resistance 74d, the NMOS 74 enables the power voltage (DC 24V) of the DC power source 73 to perform switching. Then, the power voltage (DC 24V) is resonated by the resonance circuit configured with the inductor 74e and the capacitor 74g so that the piezoelectric transformer driving circuit 74 outputs a driving voltage of a sinusoidal pulse with approximately the transformed-rectifying voltage value (i.e., AC 100V) as a peak voltage.

A primary side input terminal 75a of the piezoelectric transformer 75 is connected to an output side of the resonance circuit. An AC high voltage in the range from 0 through several KV is output from a secondary side output terminal 75b of the piezoelectric transformer 75 according to a switching frequency of the NMOS 74f. An output voltage property of the secondary side output terminal 75b is varied according to frequency as shown in FIG. 5. A voltage rising ratio is determined according to the switching frequency of the NMOS 74f. In the piezoelectric transformer 75, a maximum voltage rising ratio is obtained at a resonance frequency $f_x$; and a voltage rising ratio is minimum near a frequency $f_y$. In the first embodiment, a frequency is controlled in the range from a start frequency $f_{start}$ that is lower than the frequency $f_y$ through a frequency $f_{end}$ that is higher than the resonance frequency $f_x$.

The rectifier circuit 76 is connected to the secondary side output terminal 75b of the piezoelectric transformer 75. The rectifier circuit 76 is a circuit that converts an AC high voltage output from the secondary side output terminal 75b of the piezoelectric transformer 75 into a DC high voltage and outputs it. The rectifier circuit 76 is configured with diodes 76a and 76b and a capacitor 76c. A transferring roller 5 operating as an output load ZL is connected to an output side of the rectifier circuit 76 through a resistance 76d. The output voltage conversion part 77 is also connected to the output side of the rectifier circuit 76.

The output voltage conversion part 77 is configured with voltage dividing resistances 77a and 77b that divide the DC high voltage of the rectifier circuit 76 and convert it into a DC low voltage S77 (for example, the low voltage is equal to or lower than DC 3.3V), and a protective resistance 77c that outputs the DC low voltage S77. In the output voltage conversion part 77, for example, a resistance value of the voltage dividing resistance 77a is 400 MΩ; a resistance value of the voltage dividing resistance 77b is 100 KΩ; and the DC high voltage output from the rectifier circuit 76 is divided into 1/4001. The output voltage comparison part 78 is connected to an output side of the protective resistance 77c.

The output voltage comparison part 78 is configured with a comparator 78a as a voltage comparator to which the power voltage (DC 24V) from the DC power source 73 is applied, a reference power source 78b that performs pull-up (e.g., at DC 3.3V) for an output terminal of the comparator 78a, and a pull-up resistor 78c. The comparator 78a has a negative (−) input terminal in which the DC low voltage S77 output from the output voltage conversion part 77 is input and a positive (+) input terminal in which a triangle waveform target voltage S79 output from a DAC 79 is input through an RC filter 79f configured with a resistance 79a and a capacitor 79b. The output voltage comparison part 78 compares voltages of the negative (−) input terminal and the positive (+) input terminal and outputs its comparison result S78 from its output terminal toward the input port IN1 of the control unit 72. An output terminal of the comparator 78a is connected to the reference power source 78b through the pull-up resistance 78c.

The DAC 79 that is connected to the positive (+) input terminal of the comparator 78a through the RC filter 79 converts a triangle waveform data S72b with 8 bits output from the output port OUT2 of the control unit 72 into an analog signal and to output the target voltage S79 (for example, 8 bits and 3.3V) in a triangle waveform.

When the target voltage S79 in a triangle waveform output from the DAC 79 is input to the positive (+) input terminal of the comparator 78a, the comparator 78a compares the DC low voltage S77 as an output voltage of the output voltage conversion part 77 and the target voltage S79 as an output voltage of the DAC 79. When the comparison result is determined according to the following formula: (output voltage of DAC 79)>(output voltage of output voltage conversion part 77), an output terminal of the comparator 78a becomes DC 3.3V (high level and referred to as "H") by pulling-up through the reference power source 78b and the resistance 77c. Then, the comparison result, "H," is input to the input port IN1 of the control unit 72. On the other hand, when the comparison result is determined according to the following formula: (output voltage of DAC 79)<(output voltage of output voltage conversion part 77), the output terminal of the comparator 78a becomes a low level (referred to as "L"). Then, the comparison result, "L," is input to the input port IN1 of the control unit 72.

Figure 6:
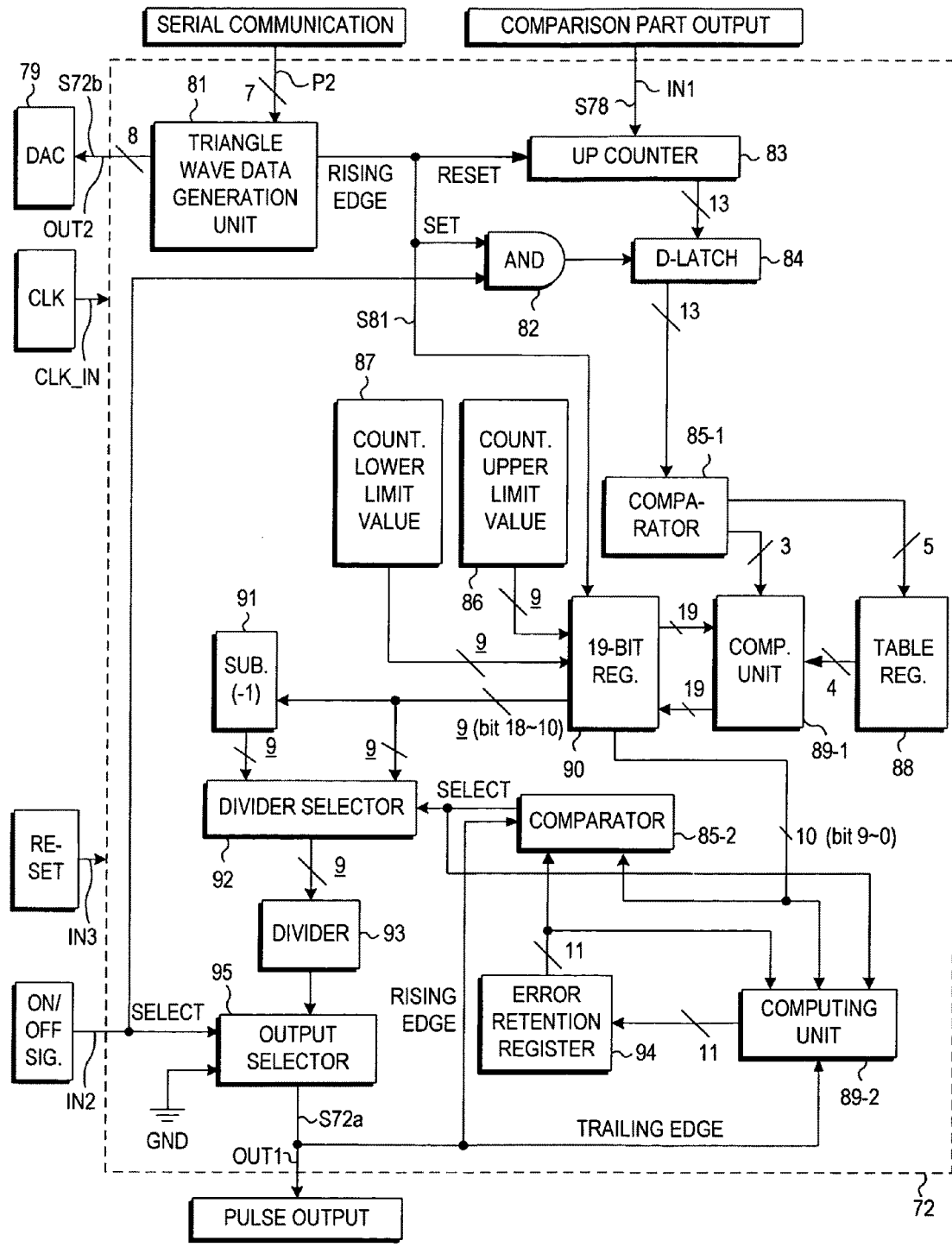
FIG. 6 is a block diagram of a control unit shown in FIG. 4.

(Control Unit in Piezoelectric Transformer Driving Device) FIG. 6 is a block diagram of a control unit 72 shown in FIG. 4.

The control unit 72 is formed by, for example, an ASIC written by a hardware description language and so on. A clock signal CLK is supplied to each circuit block that configures a synchronous circuit discussed below in the control unit 72. A reset signal RESET is supplied to each circuit block for initialization in the control unit 72.

The control unit 72 is configured with a triangle wave data generation unit 81, an AND gate 82, a 13-bit up counter 83, a 13-bit data latch (a D latch) 84, first and second comparators 85-1 and 85-2, a counter upper limit value register 86, a counter lower limit value register 87, a table register 88, first and second computing units 89-1 and 89-2, a divider ratio setting part (e.g., a 19-bit register) 90, a subtractor (−1) 91, a divider selector 92, a divider part (e.g., a divider) 93, an 11-bit error retention register 94, and an output selector 95. Note that a binarization part with an error diffusion method is configured with the 19-bit register 90, the subtractor (−1) 91, the divider selector 92, the error retention register 94, the comparators 85-2, and the computing units 89-2.

The triangle wave data generation unit 81 is connected to a serial communication line port P2 and an output port OUT2. The AND gate 82 and the up counter 83 are connected to an output side of the triangle wave data generation unit 81. The triangle wave data generation unit 81 counts the clock signal CLK and outputs 8-bit triangle wave data S72b to the DAC 79 for a certain cycle based on a high voltage output instruction value DATA and so on that is input to the port P2 through the serial communication from the port P1 of the printer engine control unit 53. The triangle wave data generation unit 81 also has a function to output a pulse S81 for set/reset at every cycle of its data array. The pulse S81, operating as a set signal "set," and an ON/OFF signal from the input port IN2 are input to the AND gate 82 so that the AND gate 82 logically multiplies the pulse S81 and the ON/OFF signal together. The D latch 84 is connected to an output side of the AND gate 82.

The up counter 83 is a 13-bit counter that operates to count the number of high "H" values of the comparison result S78 input to the input port IN1 from the output voltage comparison part 78 at a rising pulse of the clock signal CLK input to a clock signal input port CLK_IN from the oscillator 71. The up counter 83 does not increment when the input comparison result S78 has a low "L" value. The up counter 83 increments only when the input comparison result S78 is "H." The up counter 83 is reset to 0 by using the rising edge of a pulse S81 output from the triangle wave data generation unit 81 as a reset signal "reset." Similarly, the up counter 83 is cleared to 0 by using a low "L" value of a reset signal RESET input to an input port IN3 from the printer engine control unit 53. The up counter 83 stops counting while the reset signal RESET is has a low value "L." A 13-bit output signal of the up counter 83 is given to the D latch 84 in the next block.

The D latch 84 retains the 13-bit output signal of the up counter 83 by an output signal from the AND gate 82. A comparator 85-1 is connected to an output side of the D latch 84. In the D latch 84, the retained 13-bit value is cleared by a low "L" value of the reset signal RESET. The comparator 85-1 operates to compare the 13-bit value of the D latch 84 with a value (e.g., 4 values) stored in advance and to output the comparison result to a computing unit 89-1 in 3 bits, a value 0 through 4, and has a function to output the upper 5 bits of the D latch 84 to the table register 88. The table register 88 is a register that outputs a 4-bit value to the computing unit 89-1 according to a 5-bit value (e.g., 0-20 dec (decimal number)) output from the comparator 85-1.

The computing unit 89-1 updates the value of the 19-bit register 90 based on a 3-bit value of 0 through 4 output from the comparator 85-1, a 4-bit value output from the table register 88, and a current value of the 19-bit register 90 and. The 19-bit register 90 is a register that operates to retain a divider ratio. The upper 9 bits in the 19-bit register 90 correspond to an integer part of the divider ratio. The lower 10 bits in the 19-bit register 90 correspond to a fractional part of the divider ratio. The lower 10 bits correspond to (10 bits)/1024; and its real-value is (upper 9 bits)+(lower 10 bits)/1024.

In the 19-bit register 90, the lower 10 bits are cleared at the time of inputting a low value "L" of the reset signal RESET so that a 9-bit value of the counter lower limit value register 87 is set to be equal to the upper 9 bits of the 19-bit register 90. The upper 9 bits of the 19-bit register 90 are output to the subtractor (−1) 91 and the divider selector 92. The lower 10 bits of the 19-bit register 90 are output to the comparator 85-2 and the computing unit 89-2. The value of the 19-bit register 90 is updated by the rising edge of the pulse S81 input from the triangle wave data generation unit 81. This update means that the value of the 19-bit register 90 is rewritten with a 19-bit value output from the computing unit 89-1. When the upper 9 bits are smaller than the value of the counter lower limit value register 87, the upper 9 bits are set as an output value of the counter lower limit value register 87. When the upper 9 bits are larger than the value of the counter upper limit value register 86, the upper 9 bits are set as an output value of the counter upper limit value register 86. The counter upper limit value register 86 is a 9-bit register in which an upper limit value of the divider ratio is set. The counter lower limit value register 87 is a 9-bit register in which a lower limit value of the divider ratio is set.

The subtractor (−1) 91 outputs a 9-bit value in which 1 is subtracted from the upper 9 bits (i.e., a divider ratio integer part 9-bit value) output from the 19-bit register 90 to the divider selector 92. The comparator 85-2 compares the contents of the error retention register 94 with the lower 10 bits of the 19-bit register 90 at the rising edge of the driving pulse S72a output from the output selector 95. And, when (the lower 10 bits of the 19-bit register 90)=0 or (the 11 bits of the error retention register 94)<0, the comparator 85-2 has a function to output a low value "L" to the divider selector 92. When (the lower 10 bits of the 19-bit register 90)≠0 or (the 11 bits of the error retention register 94)≧0, the comparator 85-2 has a function to output a high value "H" to the divider selector 92.

When a select signal "select" output from the comparator 85-2 is "L," the divider selector 92 selects the 9 bits output from the subtractor (−1) 91 and outputs them to the divider 93. When the select signal "select" is "H," the divider selector 92 selects the upper 9 bits output from the 19-bit register 90 and outputs them to the divider 93.

The computing unit 89-2 operates to update the error retention register 94 with the computing result by computing based on input of the lower 10 bits of the 19-bit register 90, the 11 bits of the error retention register 94, and 1 bit output from the comparator 85-2. The update is performed at the trailing edge of the driving pulse S72a output from the output selector 95. Computation of the computing unit 89-2 is performed as follows: when an output of the comparator 85-2 is "H," a computing result is determined to be (the lower 10 bits of the 19-bit register)+(the 11-bit value of error retention register)−1024; and when an output of the comparator 85-2 is "L," the computing result is determined to be (the lower 10 bits of 19-bit register)+(the 11-bit value of the error retention register). The error retention register 94 is updated by this computing result of the computing unit 89-2. The error retention register 94 is an 11-bit register; and a topmost bit is a signed value that shows a sign.

The divider 93 outputs a periodic pulse, which is made by dividing the clock signal CLK by the divider ratio of a 9-bit value output from the divider selector 92, to the output selector 95 with a certain on-duty. The certain on-duty in the disclosed embodiments is about 30%-50%, where consumed power is low (e.g., 30%).

An ON/OFF signal that is used as a select signal "select" is input to the output selector 95. When the select signal "select" is at a low value, "L," the output selector 95 always outputs a low value "L" as a ground GND electric potential. When the select signal "select" is at a high value "H," the output selector 95 outputs a pulse output from the divider 93 as the driving pulse S72a.

Figure 7:
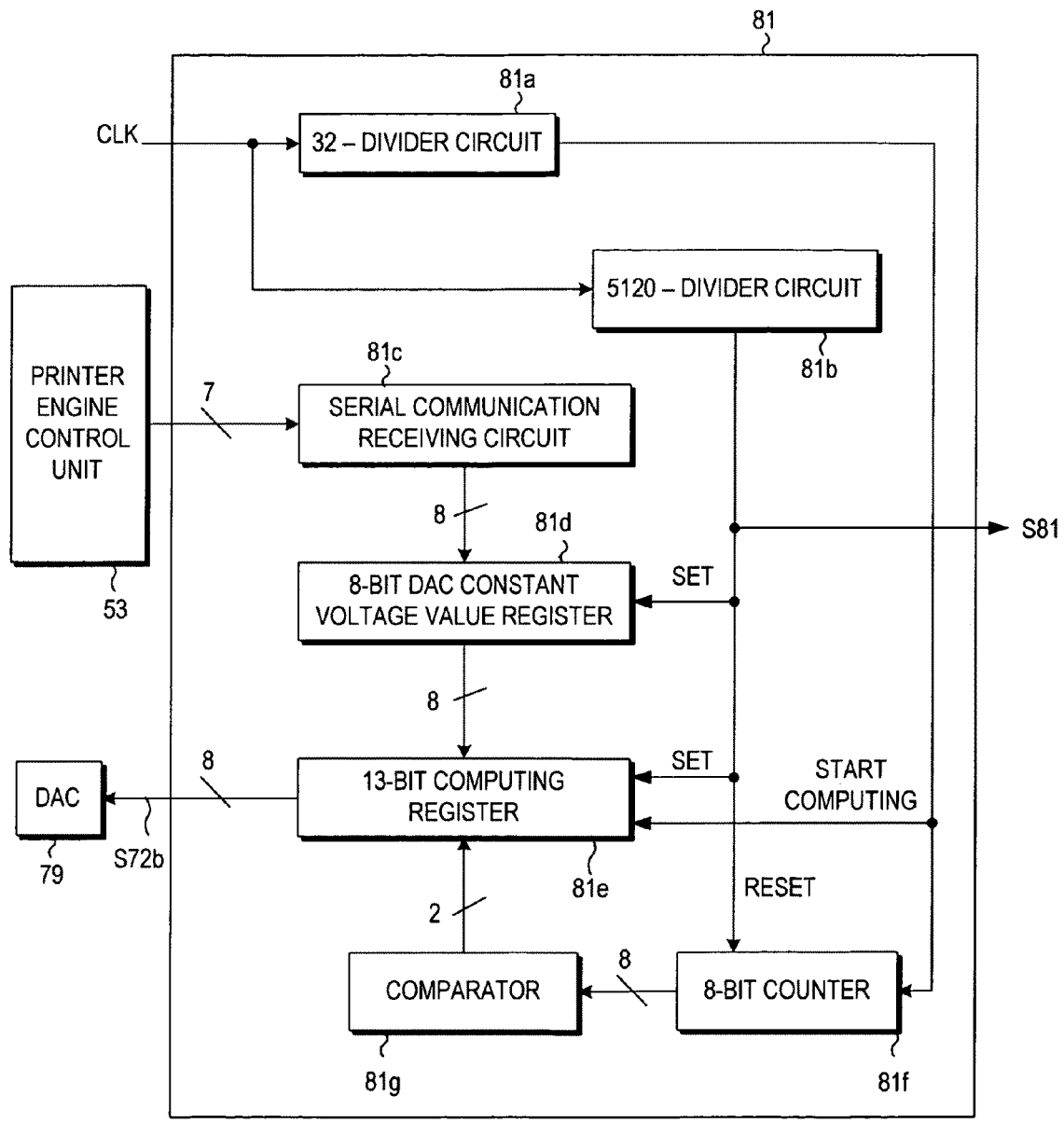
FIG. 7 is a block diagram of a triangle wave data generation unit shown in FIG. 6.

FIG. 7 is a block diagram of a triangle wave data generation unit 81 shown in FIG. 6. The triangle wave data generation unit 81 is configured with a 32-divider circuit 81a, a 5120-divider circuit 81b, a serial communication receiving circuit 81c, an 8-bit DAC constant voltage value register 81d, a 13-bit computing register 81e, an 8-bit counter 81f, and a comparator 81g.

The 32-divider circuit 81a is a circuit that divides the 25 MHz clock signal CLK by 32 and outputs the result to the 13-bit computing register 81e and the 8-bit counter 81f. The 5120-divider circuit 81b is a circuit that divides the 25 MHz clock signal CLK by 5120 to output a pulse S81, and supplies the pulse S81 to the 8-bit DAC constant voltage value register 81d and the 13-bit computing register 81e. The serial communication receiving circuit 81c is a register that receives 7-bit high voltage output instruction value DATA that is input from the printer engine control unit 53 through a three-wire system serial communication line and, and retains it as 8-bit data by adding 0 as the topmost bit. An initial value of the serial communication receiving circuit 81c at the time of reset is 0. The 8-bit DAC constant voltage value register 81d is a register in which an initial value at the time of reset is 0. The rising edge of the pulse S81 output from the 5120-divider circuit 81b is input as a set signal "set" to the 8-bit DAC constant voltage value register 81d so that the 8-bit DAC constant voltage value register 81d latches an 8-bit signal output from the serial communication receiving circuit 81c.

The rising edge of the pulse S81 output from the 5120-divider circuit 81b as a set signal "set" is input to the 13-bit computing register 81e so that the 13-bit computing register 81e sets the 8-bit value of the DAC constant voltage value register 81d as the upper 8 bits, i.e., bit 12~bit 5, of the 13 bits and sets the value "00000b (binary number)" as the lower 5 bits, i.e., the bit 4~bit 0 of the 13 bits. The 13-bit computing register 81e computes at the rising edge of the pulse output from the 32-divider circuit 81a according to a 2-bit output signal from the comparator 81g. When the output signal from the comparator 81g is "00b," the 13-bit computing register 81e does not compute as an exception.

As discussed below, when the rising edges of the pulse S81 output from the 5120-divider circuit 81b and the pulse output from the 32-divider circuit 81a are generated at the same time, an output signal of the comparator 81g is "00b." An output signal "01b" of the comparator 81g means addition. Similarly, an output signal "10b" means subtraction. An output signal "11b" is not output.

The 13-bit computing register 81e adds/subtracts the 8-bit value of the DAC constant voltage value register 81d to/from the retained 13 bits according to an output signal from the comparator 81. Triangle wave data S72b output from the 13-bit computing register 81e is 8 bits and is supplied to the DAC 79. The 13-bit computing register 81e outputs a value in which a bit 4 value is added to the upper 8 bits value, i.e., bit 12~bit 5, of the computing register. For example, if the 13-bit value is "0110 0000 00000b," then "60H" is output. When the 13-bit value is "0110 0000 10000b," "61H" is output.

The 8-bit counter 81f is a counter register that operates to count a pulse output from the 32-divider circuit 81a. When the pulse S81, serving as a reset signal "reset," output from the 5120-divider circuit 81b is input to the 8-bit counter 81f, the 8-bit counter is reset. A count value of the 8-bit counter 81f is 8 bits and is output to the comparator 81g. The comparator 81g operates to output "00b," "01b," and "10b," to the 13-bit computing register 81e based on the count value output from the 8-bit counter 81f.

(Operation of Entire Image Forming Device) In FIGS. 2 and 3, when print data that is written by page description language (PDL) or the like is input from external equipment (not shown) through a host interface unit 50 to an image forming device 1, the print data is converted into bitmap data (i.e., image data) by a command/image processing unit 51 and is sent to an LED head interface unit 52 and a printer engine control unit 53. A heater 59 in a fuser 18 is controlled by the printer engine control unit 53 according to a detection value by a thermistor 65 so that a heat fusing roller in the fuser 18 reaches a certain temperature. As a result, a print the operation is started.

A sheet 15 set in a sheet feeding cassette 13 is fed by a hopping roller 14. The sheet 15 is carried on a transferring belt 8 by registration rollers 15 and 16 at timing synchronized with an image-forming operation discussed below. A toner image is formed on each of photoreceptor drums 32K, 32Y, 32M, and 32C through an electrographic process at each of developers 2K, 2Y, 2M, and 2C for each color. At this time, each of LED heads 3K, 3Y, 3M, and 3C lights up according to the bitmap data. After the toner image is developed by each of the developers 2K, 2Y, 2M, and 2C for each color, the toner image is transferred onto the sheet 15 that is carried on the transferring belt 8. The toner image is transferred by a high voltage DC bias that is applied to each of transferring rollers 5K, 5Y, 5M, and 5C from a power source device 70. After the toner image in four kinds of color is transferred onto the sheet 15, the toner image is fused by the fuser 18. Then, the sheet 15 is ejected.

Figure 9:
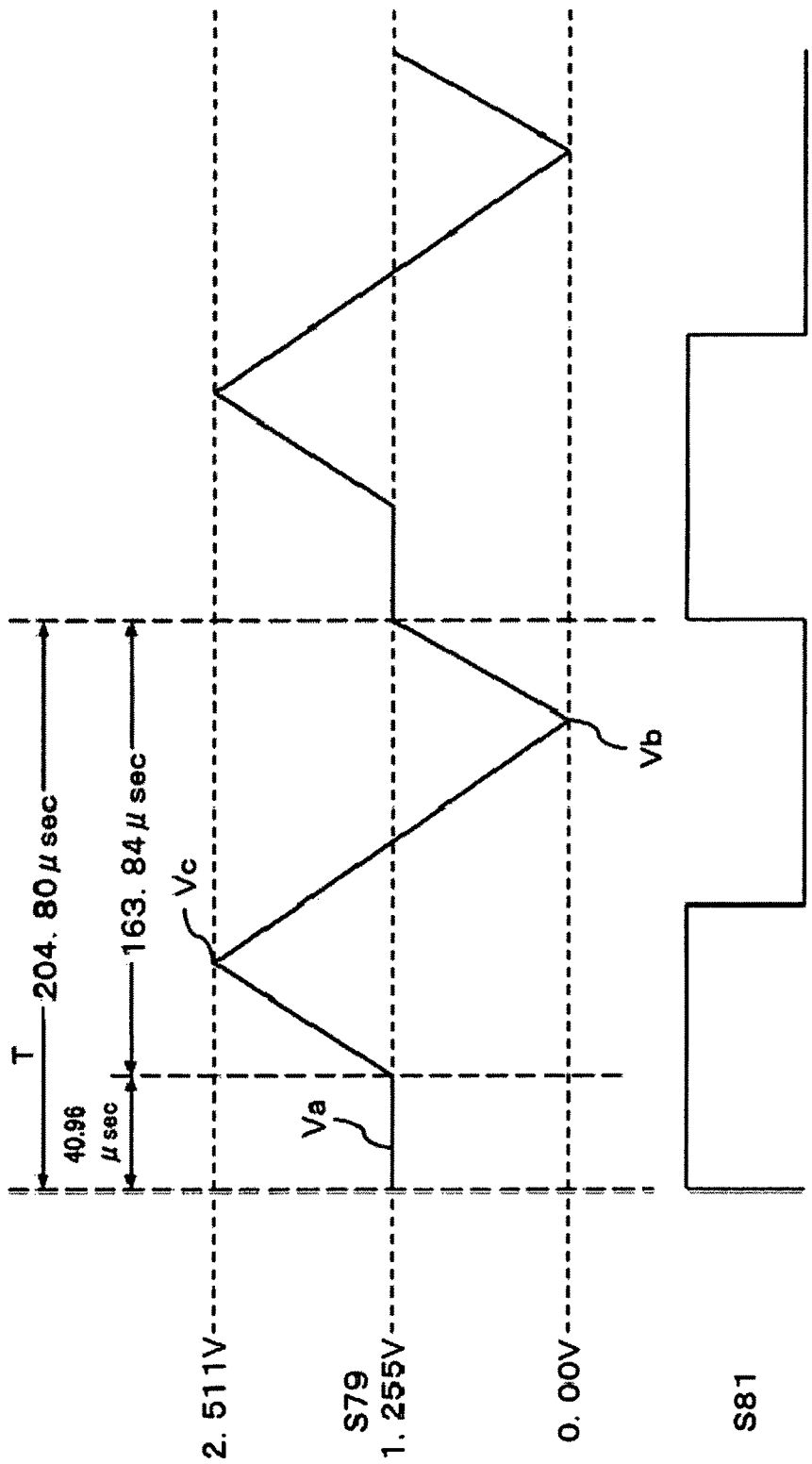
FIG. 9 is a waveform diagram showing a target voltage that is output from a DAC shown in FIG. 1 and a pulse that is generated in a triangle wave data generation unit.

(Operation of High Voltage Power Source Device) FIGS. 8A and 8B are tables showing numerical examples of triangle wave data S72b (i.e., DAC output HEX value) that is output from a control unit 72 shown in FIG. 1, and a target voltage S79 that is output from a DAC 79 shown in FIG. 1. Further, FIG. 9 is a waveform diagram showing the target voltage S79 that is output from the DAC 79 shown in FIG. 1, and a pulse S81 that is generated in the triangle wave data generation unit 81.

First, a brief operation of a high voltage power source device 69 of FIG. 1 is explained with reference to FIGS. 8A, 8B, and 9.

In a color-image-forming-device, transcription has four kinds of outputs. However, those four circuits have the same structure so that the operation of a high voltage power source device with one output is explained by way of example in the present embodiment. This explanation could easily be extended to cover an embodiment that used multiple outputs.

The printer engine control unit 53 outputs high voltage output instruction value DATA and so on through a serial communication line connected to a port P1 and sets a DC output voltage of the high voltage power source device 69. For example, when the DC output voltage is 5 KV, a high voltage output instruction value of "97" is obtained because a range is 1.25V and 8 bits/3.3V. Then, after the "97" value is converted into hexadecimal number (hex), "61H" (i.e., 1.255V), the printer engine control unit 53 sends a high voltage output instruction value DATA, "61H" (1.255V), to a control unit 72. Because an input value is converted (e.g., doubled in value) at the triangle wave data generation unit 81 in a control unit 70 discussed later, the high voltage output instruction value DATA and so on is sent in 7-bit data through serial communication from the printer engine control unit 53 to the control unit 72. The control unit 72 outputs triangle wave data S72b as an 8-bit digital signal according to the 7-bit data of the high voltage output instruction value DATA and so on that is received through a port P2 to the DAC 79. The triangle wave data S72b is converted into a target voltage S79 in an analog signal by the DAC 79.

The triangle wave data S72b and the target voltage S79 have, for example, 5120 cycles (i.e., a 204.8 μsec cycle T) as shown in FIG. 9. During the cycle T, 1024 cycles (40.96 μsec) of a constant voltage with a first voltage value Va (i.e., 1.255V) are output, and then 4096 cycles (163.84 μsec) of triangle wave with a third voltage Vc (i.e., 2.511V) as a peak voltage are output.

FIGS. 8A and 8B show numerical values of the triangle wave data S72b output as a digital signal from the control unit 72. FIG. 9 shows a waveform in which the output triangle wave data S72b is converted into the target a voltage S79 in an analog signal by the DAC 79.

In other words, FIGS. 8A and 8B corresponds to cycle 0~cycle 5119 of the DAC output data in a total of 5120 cycles and 204.8 μsec of the output digital data. The "61H" of the high voltage output instruction value DATA output from the printer engine control unit 53 is shown. In the target voltage S79 in FIG. 9, the constant first voltage Va (i.e., 1.255V) is output during a first 40.96 μsec cycle. And then, the triangle waveform in which the peak voltage is a third voltage Vc (i.e., 2.511 V), and a bottom voltage, or second voltage Vb, of 0.000V is output during a 163.84 μsec cycle. The constant voltage and the triangle waveform are alternatively output, giving the total of a 204.80 μsec cycle T. Note that a pulse S81 shown in FIG. 9 is output at every cycle T. The detail is explained later.

In this time, an ON/OFF signal is in an off state ("L") for the control unit 72; and an output to a piezoelectric transformer driving circuit 74 is disabled. The control unit 72 outputs a driving pulse S72a that is divided from the clock signal output from the oscillator 71 according to a control signal from the printer engine control unit 53 to the piezoelectric transformer driving circuit 74. The control unit 72 changes a divider ratio based on a state of a comparison result S78 output from the output voltage comparison part 78. The detail is explained later.

The piezoelectric transformer driving circuit 74 drives a primary side of a piezoelectric transformer 75 by switching the DC 24V supplied from the DC power source 73 through the driving pulse S72a from the control unit 72 and then outputs an AC high voltage from a secondary side of the piezoelectric transformer 75. The AC high voltage is rectified by the rectifier circuit 74 so that the rectified AC high voltage is converted into a DC high voltage and is supplied to an output load ZL. The output voltage conversion part 77 converts the output DC high voltage into a DC low voltage S77 in 1/4001 so that the DC low voltage S77 is input to the output voltage comparison part 78. The output voltage comparison part 78 compares the DC low voltage S77 of the output voltage conversion part 77 with the target voltage S79 output from the DAC 79. If the DC low voltage S77 of the output voltage conversion part 77 is lower than the target voltage S79, the output voltage comparison part 78 outputs a high voltage "H" (e.g., 3.3V) as a comparison result to the control unit 72. If the DC low voltage S77 of the output voltage conversion part 77 is higher than the target voltage S79, the output voltage comparison part 78 outputs a low voltage "L" as a comparison result to the control unit 72.

Figure 10:
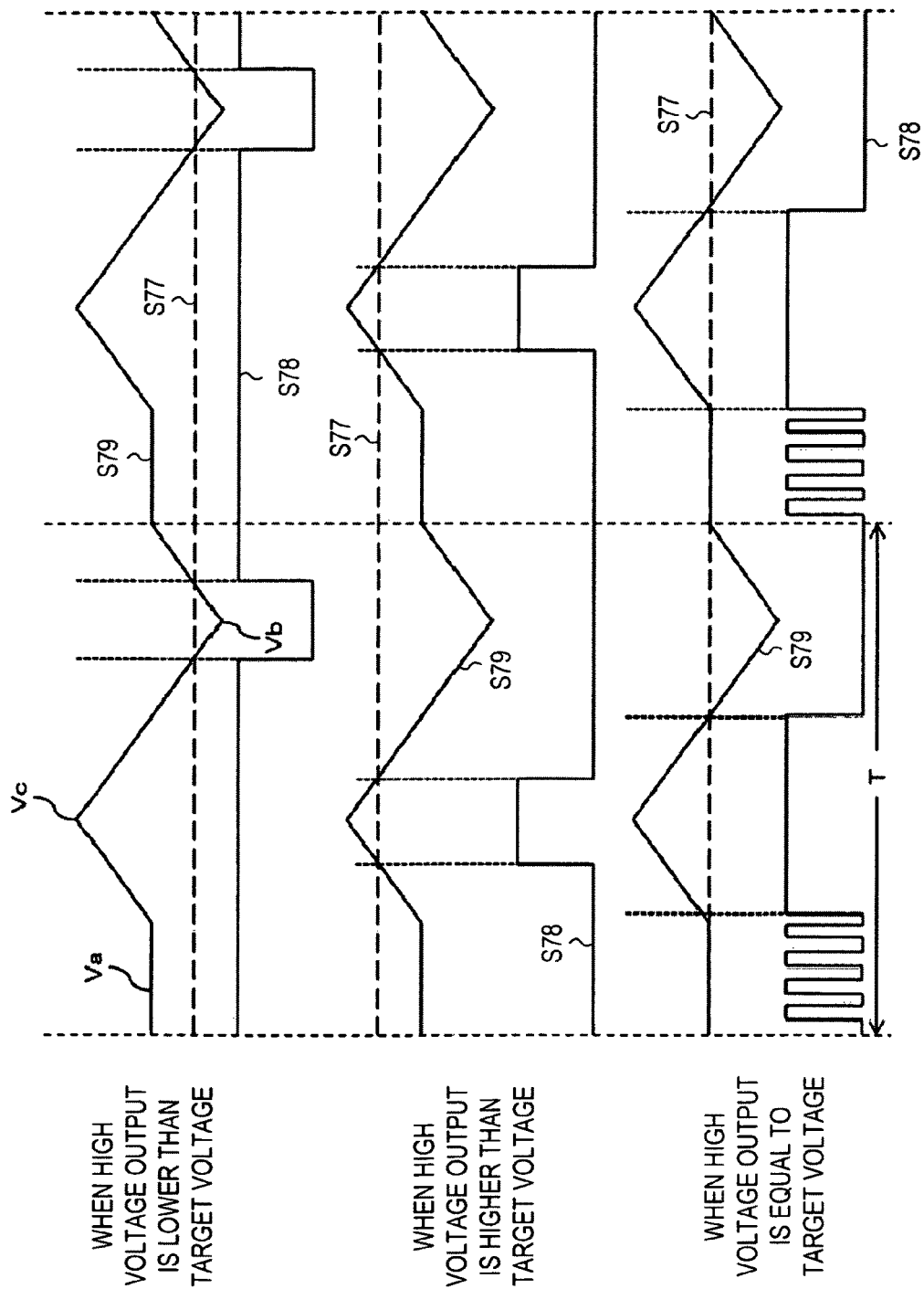
FIG. 10 is a waveform diagram of the operation of a high voltage power source device shown in FIG. 4.
Figure 11B:
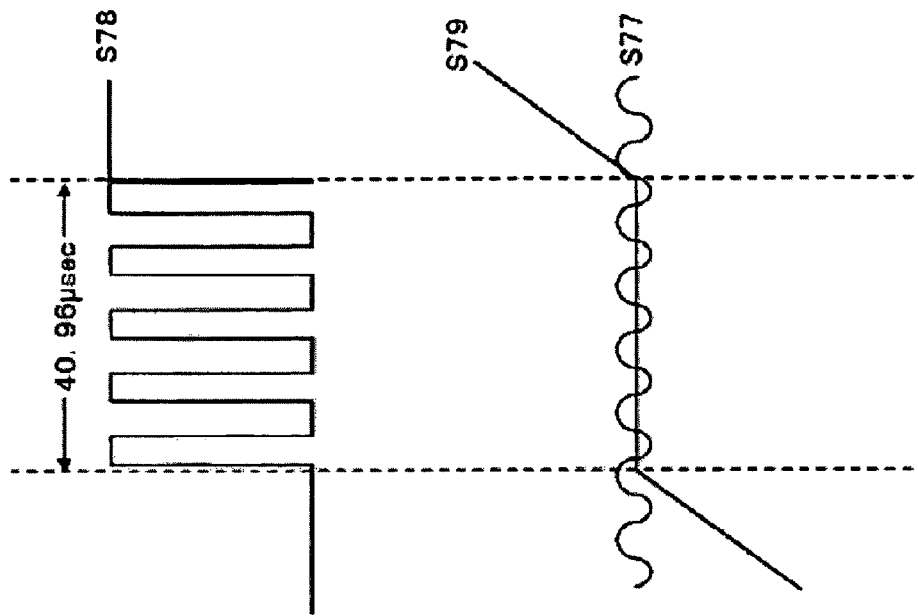
FIGS. 11A and 11B are waveform diagrams of the operation of a high voltage power source device shown in FIG. 4.
Figure 11A:
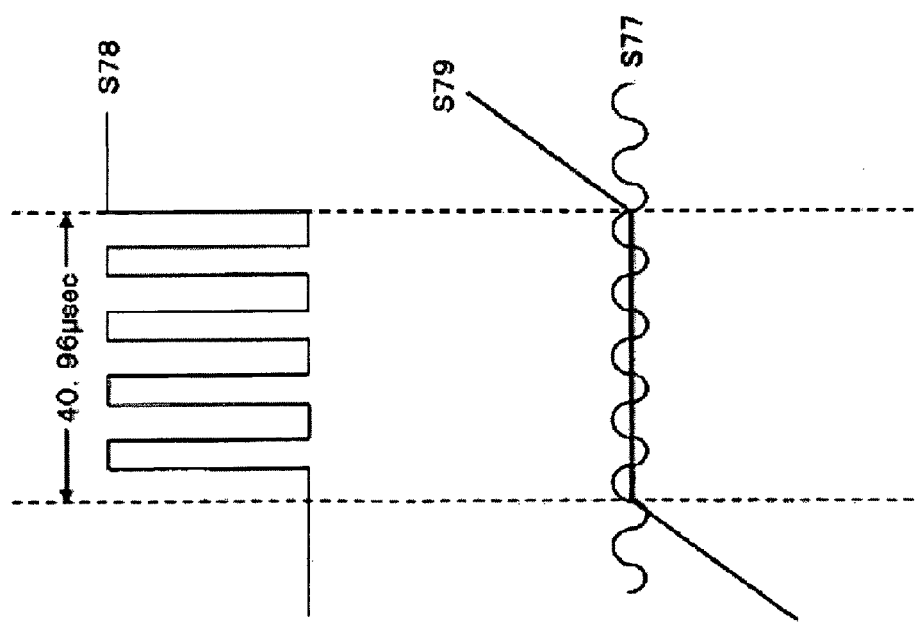

FIGS. 10, 11A, and 11B are waveform diagrams of the operation of the high voltage power source device 69 shown in FIG. 4.

Next, the detailed operation of the high voltage power source device 69 in FIG. 4 is explained with reference to FIGS. 10, 11A, and 11B.

An output port OUT4 of the printer engine control unit 53 is set at a low value "L" so that a reset signal RESET is input to an input port IN3 of the control unit 72. Then, several settings of output of an output port OUT1 for the control unit 72 is reset. This reset signal is a "low true" signal. A divider ratio and so on of output of the output port OUT1 becomes an initial value by the reset operation. The printer engine control unit 53 outputs the high voltage output instruction DATA as 7-bit data with respect to the target voltage value to the control unit 72. For example, in the case of 5 KV, "61H" is output to the control unit 72 through serial communication. First, the printer engine control unit 53 sets a chip select signal CS output from a port P1-1 as a low value "L." Then, the printer engine control unit 53 changes the high voltage output instruction DATA in synchronization with the clock signal CLK output from a port P1-2 and outputs it from a port P1-3. Because the serial communication method is well known, its explanation is omitted.

After the target voltage S79 for use of target voltage control shown in FIG. 9 is output from the DAC 79, the printer engine control unit 53 changes the output port OUT4 into a high value "H" at certain timing so that the reset signal RESET is released. When the reset signal RESET that is input to the input port IN3 is released, the control unit 72 divides the clock signal CLK that is input from an input port CLK_IN by an initial value divider ratio (e.g., on-duty 30%). The initial value divider ratio is explained later. Note that while an output port OUT3 of the printer engine control unit 53 from which an ON/OFF signal is output is at a low value "L," the divided driving pulse S72 is not output from the output port OUT1 of the control unit 72. And the output port OUT1 is retained at a low value "L."

The oscillator 71 is connected to the input port CLK_IN of the control unit 72 through a resistance 71b. In the oscillator 71, 3.3V of the DC power source 71a is supplied to a power source terminal VDD and an output enable terminal OE. Just after power is turned on, the clock signal CLK of 25 MHz and a 40 nsec cycle is output from a clock terminal CLK_OUT in the oscillator 71.

While the output port OUT1 of the control unit 72 is retained at a low value "L," an NPN transistor 74b in the piezoelectric transformer driving circuit 74 is turned off so that an NMOS 74f is also turned off. Therefore, the DC 24V supplied from a 24V power source 73 is directly applied to a primary side input terminal 75a of the piezoelectric transformer 75. In this state, because a current value of the DC 24V is nearly 0 and the piezoelectric transformer 75 does not vibrate, a voltage of a secondary side output terminal 75b of the piezoelectric transformer 75 is also 0V. As a result, an output DC low voltage S77 of a resistance 77c that is voltage-divided by resistances 77a and 77b that configure the output voltage conversion part 77 is a ground GND level.

In the above state, the target voltage S79 output from the DAC 79 shown in FIG. 9 is input to a positive (+) input terminal of a comparator 78a in the output voltage comparison part 78; and a negative (−) input terminal of the comparator 78a is connected to the ground GND through the resistance 77c. Therefore, the output voltage of the comparator 78a is nearly DC 3.3V that is pulled-up by the 3.3V power source 78b so that the high value "H" as the comparison result S78 output from the output voltage comparison part 78 is input to the input port IN1 of the control unit 72.

Next, in the printer engine control unit 53 at certain timing, the output port OUT3 is set at a high value "H"; the ON/OFF signal is input to the input port IN2 of the control unit 72; and a high voltage output is an ON state. As a result, the driving pulse S72a that is divided by the initial value is output from the output port OUT1 of the control unit 72. The divider ratio and so on are explained later. The output driving pulse S72a enables the NMOS 74f to perform switching through the gate drive circuit that is configured with the NPN transistor 74b and the PNP transistor 74c so that a sinusoidal pulse with tens of volts is applied to the primary side input terminal 75a of the piezoelectric transformer 75 through the inductor 74e, the capacitor 74g, and the piezoelectric transformer 75.

A step-up AV high voltage is generated at the secondary side output terminal 75b of the piezoelectric transformer 75.

The AC high voltage is converted into a DC high voltage by a rectifier circuit 76 that is configured with diodes 76a, 76b and a capacitor 76c. The converted DC high voltage is supplied to the output load ZL through a resistance 76d. The converted DC high voltage is divided by a resistance 77a of 400 MΩ and a resistance 77b of 100 KΩ in the output voltage conversion part 77 into a DC low voltage S77. The DC low voltage S77 is input to the negative (−) input terminal of the comparator 78a in the output voltage comparison part 78 through a resistance 77c.

The comparator 78a in the output voltage comparison part 78 compares the target voltage S79 that is output from the DAC 79 and that is input to the positive (+) input terminal of the comparator 78a with the DC low voltage S77 output from the output voltage conversion part 77. Then, the comparison result S78 is output from the output voltage comparison part 78 to the input port IN1 of the control unit 72. In other words, as shown in FIG. 10, when (the target voltage S79 output from the DAC 79)>(the DC low voltage S77 output from the output voltage conversion part 77), the output voltage comparison part 78 outputs a high value "H" of pull-up DC 3.3V. When (the target voltage S79 output from the DAC 79)<(the DC low voltage S77 output from the output voltage conversion part 77), the output voltage comparison part 78 outputs a low value "L." When the DC low voltage S77 output from the output voltage conversion part 77 is lower than the target voltage S79 in the cycle T (unit of time) in which the target voltage S79 (a pair of constant voltage and triangle wave) is output from the DAC 79, a pulse width modulation (PWM) output in which a duty is more than the following formula is obtained as the comparison result S78: {(constant voltage cycle)+(triangle wave cycle)/2}/{(triangle wave cycle)+(constant voltage cycle)}. When the DC low voltage S77 output from the output voltage conversion part 77 is higher than the target voltage S79, the PWM output in which a duty is less than the following formula is obtained as the comparison result S78: {(triangle wave cycle)/2}/((triangle wave cycle)+(constant voltage cycle)}.

When the DC low voltage S77 output from the output voltage conversion part 77 is equal to the target voltage S79, rectangular waves of a 50% duty in a triangle wave cycle and in an output pulse cycle of the output port OUT1 in a constant voltage cycle are obtained. As a result, the comparison result S78 output from the output voltage comparison part 78 is in the following formula: ("H" level output time)=("L" level output time). Because a cycle T of a mix wave (target voltage S79) mixing with a constant voltage and triangle wave is not synchronized with a cycle of the driving pulse S72a, a high "H" level period and a low "L" level period as outputs of the output voltage comparison part 78 during the constant voltage period are affected by a phase difference at each of the mix waves. Its waveform diagrams are shown in FIGS. 11A and 11B.

For example, when the driving frequency is approximately 110 kHz with a 9.1 μsec cycle, and when an "H"/"L" ratio of the target voltage S79 output from the DAC 79 is equal during a period of the constant voltage (Va), the number of "H" level pulses of rectangular waves for the output voltage comparison part 78 are four in FIG. 11A; and the number of "H" level pulses of rectangular waves for the output voltage comparison part 78 are five in FIG. 11B. In this case, a minimum value of ratio of a period of "H" during only the constant voltage (Va) part is calculated by the following: (9.1×4/2)/40.96=0.444. Similarly, its maximum value is calculated by the following: (9.1×5/2)/40.96=0.555. When the triangle waves are included, its minimum value is calculated by the following: (163.84/2+9.1×4/2)/(40.96+163.84)=0.488. Similarly, its maximum value is calculated by the following: (163.84/2+9.1×5/2)/(40.96+163.84)=0.511.

As shown in FIG. 5, since a resonance frequency fx of the piezoelectric transformer 75 according to the first disclosed embodiment is near to 110 kHz, a frequency control range is approximately 108 kHz-130 kHz. When this phase shifting is considered, a constant voltage control value is set at a "H" or "L" level period ratio of 47.5-52.5%. The ratio of the constant voltage part is calculated by the following: 40.96/(40.96+163.84)=0.2. Therefore, if the value is set as 40-60%, oscillation may be occurred at the time of the constant voltage control so that the value is shorter than the constant voltage period ratio. In the first disclosed embodiment, it is within a range of 41-59%. A range of 47.5-52.5% is used in the first disclosed embodiment. However, when a range of 45-50% is used, a relationship between the output voltage and the DAC value is only slightly changed. When a narrow range of 49-51% is used, there is no problem so long as driving frequency control resolution is high.

In the first disclosed embodiment, the constant voltage period is 40.96 μsec, and the triangle wave period is 163.48 μsec. However, they are not limited to those numbers. The constant voltage period is arbitrarily set in a range equal to or more than a resonance frequency cycle fx of the piezoelectric transformer 75, i.e., in the piezoelectric transformer according to the first disclosed embodiment, this would be 9 μsec or more. The triangle wave period is arbitrarily set based on a frequency control sampling cycle. The "H" or "L" level period ratio is changed according to the constant voltage period and the triangle wave period.

As discussed later, the control unit 72 counts the "H" time of the comparison result S78 that is input to the input port IN1 by the output cycle of the pulse S81 that is generated by the triangle wave data generation unit 81 located in the control unit 72. Then, the control unit 72 controls a divider ratio of the driving pulse S72a that is output from the output port OUT1 to be 47.5-52.5% for the "H" period. The detailed control is explained later.

Figure 12:
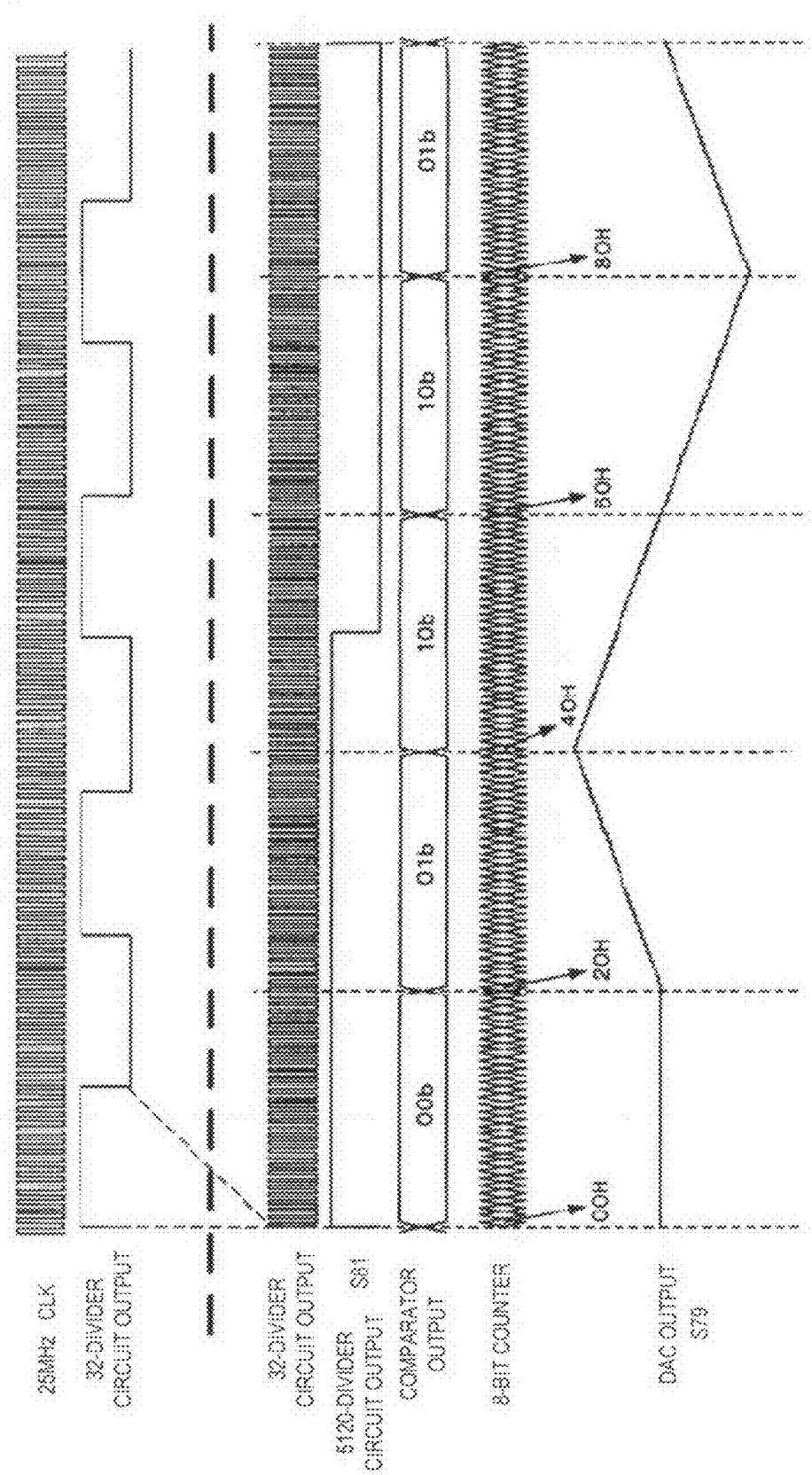
FIG. 12 is a timing diagram of the operation of a triangle wave data generation unit shown in FIG. 7.

(Operation of Control Unit in High Voltage Power Source Device) FIG. 12 is a timing diagram of the operation of a triangle wave data generation unit 81 shown in FIG. 7. Further, FIGS. 13A and 13B are tables showing numerical examples of count values for an 8-bit counter 81f in a triangle wave data generation unit 81 shown in FIG. 7.

A generation method is explained with reference to FIGS. 12, 13A, and 13B for a triangle wave data S79 as digital data shown in FIGS. 8A and 8B that are output from the triangle wave generation unit 81 of FIG. 7 located in the control unit 72 of FIG. 6.

In FIG. 7, the printer engine control unit 53 sends "61H" in 7-bit data as a high voltage output instruction value DATA to the serial communication receiving circuit 81c in the triangle wave data generation unit 81 through three-wire system serial communication. The serial communication receiving circuit 81c outputs "61H" as 8-bit parallel data by adding "0" as an upper bit 7 of the received serial data.

As shown in FIG. 12, the 32-divider circuit 81a divides the input 25 MHz clock signal CLK by 32 and outputs it to the 13-bit computing register 81e and the 8-bit counter 81f. Further, the 5120-divider circuit 81b also divides the 25 MHz clock signal CLK by 5120 to obtain a pulse S81 and outputs the pulse S81 to the 8-bit DAC constant voltage value register 81d and the 13-bit computing register 81e. The 8-bit counter 81f is reset to "0" by the rising edge of the pulse S81 and by the time of reset. The 8-bit counter 81f counts up according to the rising edge of an output pulse from the 32-divider circuit 81a and outputs this count value to the comparator 81g.

The comparator 81g outputs a 2-bit value to the 13-bit computing register 81e based on the input count value of the 8-bit counter 81f. In the comparator 81g, when the count value of the 8-bit counter 81f is, for example, 00-1FH, "00b" is output; when the count value is 20-3FH, "01b" is output; when the count value is 40-7FH, "10b" is output; and when count value is 80-9FH, "01b" is output.

At the time of reset, the 13-bit computing register 81e is reset when all of contents are "0." An 8-bit value of the 8-bit DAC constant voltage value register 81d is set to be equal to the upper 8 bits of the 13-bit computing register 81e by the rising of the pulse S81 output from the 5120-divider circuit 81b. In this case, because "61H" is output from the 8-bit DAC constant voltage value register 81d, a 5-bit value shifted to the left is set in the 13-bit computing register 81e. In other words, "0110 0001b" is converted to "0110 0001 00000b," and the converted one is set in the 13-bit computing register 81e. At this time, a value of "0" is set to lower 5 bits of the 13-bit computing register 81e.

Next, the 13-bit computing register 81e performs computing according to the 2-bit value output from the comparator 81g by the rising edge of a pulse input from the 32-divider circuit 81a. Since the output value of the comparator 81g is "00b" when the count value of the 8-bit counter 81f is 0-1FH, a value of the 13-bit computing register 81e is still "0110 0001 00000b." When the count value of the 8-bit counter 81f becomes "20H," the output value of the comparator 81g becomes "01b." By the next rising of the output pulse of the 32-divider circuit 81a, a value of the 8-bit DAC constant voltage value register 81d is added to the previous 13-bit value, "0110 0001 00000b," therefore, the 13-bit value becomes "0110 0100 00001b." As a result, "64H" in which the bit 4 value "0" is added to the 8-bit value "64H" of the bit 12 through bit 5, as a triangle wave data S72b, is output to the DAC 79.

As shown in FIGS. 13A and 13B, in the 13-bit computing register 81e, addition and subtraction are performed according to the output value of the comparator 81g shown in the timing diagram of FIG. 12. The triangle wave data S72b with 8 bits output from the 13-bit computing register 81e is converted into the target voltage S79 with analog by the DAC 79.

Next, the operation of other circuit in the control unit 72 shown in FIG. 6 is explained. In the control unit 72 in FIG. 6, when a reset signal RESET with a low value "L" is input, each internal count value of the up counter 83, the D latch 84, the 19-bit register 90, and the error retention register 94 are initialized.

When the input reset signal RESET is released, and the low value "L" becomes a high value "H," the input ON/OFF signal is set to a low value "L" so that a "disable" state is retained. Because the input comparison result S78 of the output voltage comparison part 78 becomes a high value "H" in an OFF state for a high voltage output, the up counter 83 performs to count up. This count value is output to the D latch 84. While the ON/OFF signal is at a low value "L," the D latch 84 does not latch a count value of the up counter 83 so that the D latch 84 retains a "0" clear state at the time of reset. The comparator 85-1 outputs 3 bits to the computing unit 89-1 and outputs 5 bits to the table register 88 based on a 13-bit output value of the D latch 84.

Figure 14:
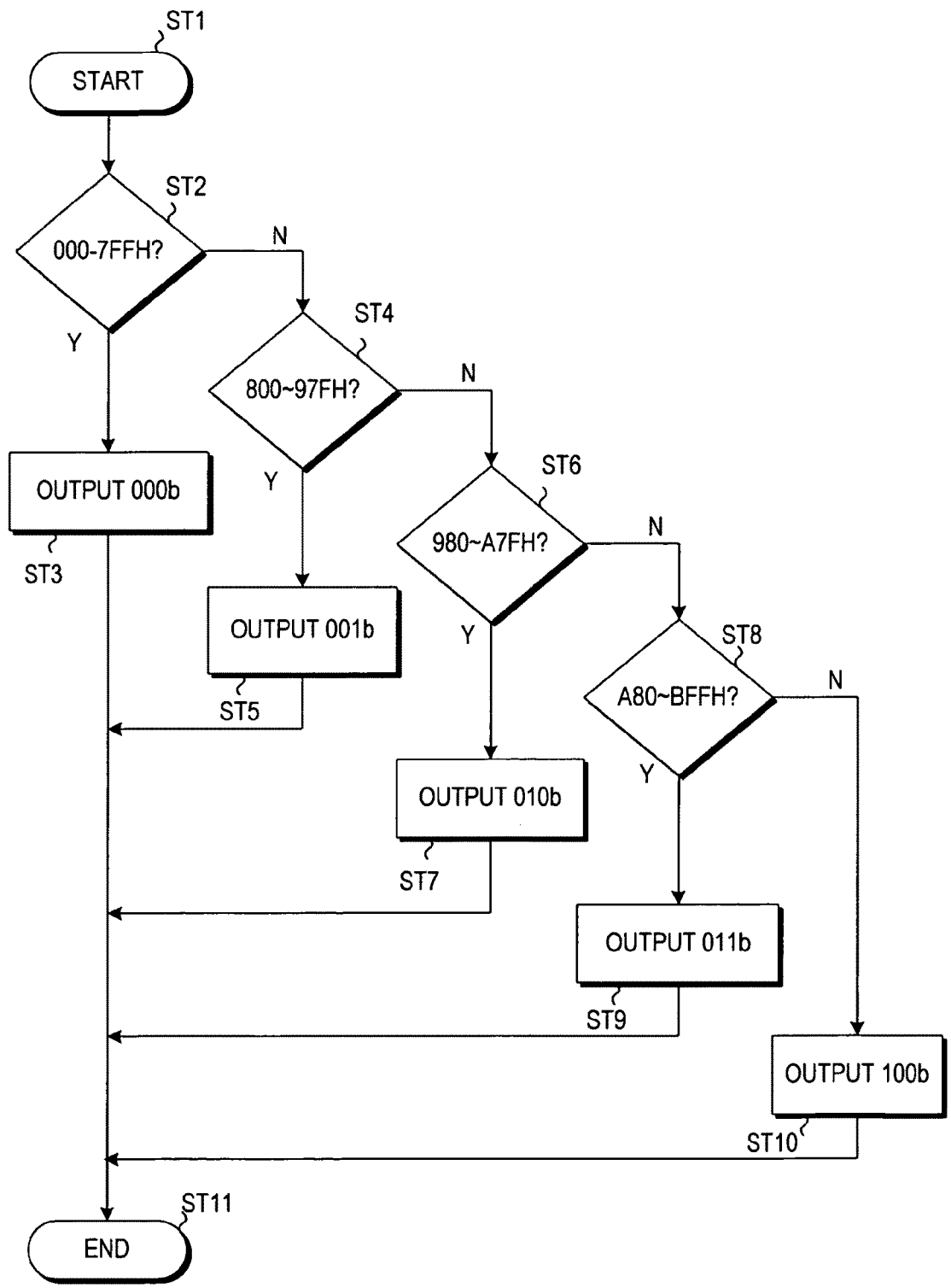
FIG. 14 is a flow diagram showing the operation for a case in which a comparator outputs a 3-bit value to a computing unit shown in FIG. 6.

FIG. 14 is a flow diagram showing the operation for a case in which the comparator 85-1 outputs a 3-bit value to the computing unit 89-1 shown in FIG. 6.

A 3-bit value output operation of the comparator 85-1 is explained with reference to the flow diagram of FIG. 14.

Note that the flow diagram in FIG. 14 is made with hardware description language and runs for parallel comparison.

In ST1, the operation of the comparator 85-1 is started. In ST2, it is determined whether or not the value of the D latch 84 is in a range of 000-7FFH. If it is, the flow goes to ST3. If it is not, the flow goes to ST4. In ST3, the comparator 85-1 outputs "000b" to the computing unit 89-1, and processing ends in ST11. In ST4, it is determined whether or not the value of the D latch 84 is in a range of 800-97FH. If it is, the flow goes to ST5. If it is not, the flow goes to ST6. In ST5, the comparator 85-1 outputs "011b" to the computing unit 89-1, and processing ends in ST11.

In ST6, it is determined whether or not the value of the D latch 84 is in a range of 980-A7FH. If it is, the flow goes to ST7. If it is not, the flow goes to ST8. In ST7, the comparator 85-1 outputs "100b" to the computing unit 89-1, and processing ends in ST11. In ST8, it is determined whether or not the value of the D latch 84 is in a range of A80-BFFH. If it is, the flow goes to ST9. If it is not, the flow goes to ST10.

In ST9, the comparator 85-1 outputs "011b" to the computing unit 89-1, and processing ends in ST11. In ST10, the comparator 85-1 outputs "100b" to the computing unit 89-1, and processing ends in ST11.

As explained above, the comparator 85-1 outputs five values, 000-100b, to the computing unit 89-1 according to high value "H" periods, 0-40%, 40-47.5%, 47.5-52.5%, 52.5-60%, and 60-100%. The comparator 85-1 outputs 3 bits to the computing unit 89-1 and outputs the upper 5 bits of the input 13 bits from the D latch 84 to the table register 88. Because a value of the D latch in an initial state is "0," the comparator 85-1 outputs "000b" to the computing unit 89-1 and outputs "00000b" to the table register 88.

FIG. 15 is a table showing input and output values of the table register 88 shown in FIG. 6. In the table register 88, the relationship between input 5-bit values and output 4-bit values is defined by one-to-one, and the output 4-bit values are output to the computing unit 89-1. As shown in (1)-(6) below, the computing unit 89-1 computes a 19-bit value based on a 3-bit output value of the comparator 85-1, a 19-bit output value of the 19-bit register 90, and a 4-bit output value of the table register 88, and outputs the computing result to the 19-bit register.

(1) When the output value of the comparator 85-1 is "000b," the computing unit 89-1 performs as follows: a number of bits of a 19-bit value, which correspond to a value shown by a 4-bit value in a range 0-9 output from the table register, 00001H, is shifted to the left; the shifted 19-bit value is subtracted from a value of the 19-bit register 90; and the 19-bit value as the subtraction result is output to the 19-bit register 90.

(2) When the output value of the comparator 85-1 is "001b," the computing unit 89-1 performs as follows: a 19-bit value, 00001H, is subtracted from a value of the 19-bit register 90; and the 19-bit value as the subtraction result is output to the 19-bit register 90.

(3) When the output value of the comparator 85-1 is "010b," the computing unit 89-1 performs as follows: a value as a 19-bit value of the 19-bit register 90 is output to the 19-bit register without change.

(4) When the output value of the comparator 85-1 is "011b," the computing unit 89-1 performs as follows: a 19-bit value, 00001H, is added to a value of the 19-bit register 90; and the 19-bit value as the addition result is output to the 19-bit register 90.

(5) When the output value of the comparator 85-1 is "100b," the computing unit 89-1 performs as follows: number of bits, which corresponds to a value shown by a 4-bit value in a range 0-9 output from the table register, of a 19-bit value, 00001H, is shifted to the left; the shifted 19-bit value is added to value of the 19-bit register 90; and the 19-bit value as the addition result is output to the 19-bit register 90.

(6) In an initial state, because a 5-bit value is "00000b," and a value of the table register is "8," the computing unit 89-1 outputs a value, which is computed by subtracting "100h" from a value of the 19-bit register 90, to the 19-bit register 90.

A 9-bit counter upper limit value register 86 retains a limit value, "228 dec (0E4 hex)," of a divider ratio integer part. In the first disclosed embodiment, a fixed value is 9 bits. However, a rewritable value may be used in alternate embodiments. A value that can be externally set may also be used. A retention value of the counter upper limit value register 86 is always output to the 19-bit register 90. An initial value (start divider ratio), "192 dec (0C0 hex)," of a divider ratio integer part is set in a 9-bit counter lower limit value register 87. In the first disclosed embodiment, a fixed value is 9 bits. However, a rewritable value may be used in alternate embodiments. A value that can be externally set may also be used in alternate embodiments. A retention value of the counter lower limit value register 87 is always output to the 19-bit register 90.

In the 19-bit register 90, at the time of reset, lower 10 bits as a fractional part is cleared to "0," and a value of the counter lower limit value register 87 is set to the upper 9 bits as an integer part. A set 19-bit value is output to the computing unit 89-1. After that, the 19-bit register 90 compares the 19-bit value output from the computing unit 89-1 with the values of the counter upper limit value register 86 and the counter lower limit value register 87 at the rising edge of the pulse S81 output from the triangle wave data generation unit 81. When a formula, (the counter lower limit 9-bit value)<(the upper 9-bit value of a 19-bit value output from computing unit 89-1)<(the counter upper limit 9-bit value), is applied, the 19-bit register 90 updates a value of the 19-bit register 90 by the 19-bit value output from the computing unit 89-1. When a formula, (the counter lower limit 9-bit value)>(the upper 9-bit value of a 19-bit value output from computing unit 89-1), is applied, the 19-bit register 90 updates the upper 9-bit value of the 19-bit register 90 by the 9-bit value of the counter lower limit value register 87, and "0" is set to the lower 10 bits. When a formula, (the counter upper limit 9-bit value)<(the upper 9-bit value of a 19-bit value output from computing unit 89-1), is applied, the 19-bit register 90 updates the upper 9-bit value of the 19-bit register 90 by the 9-bit value of the counter upper limit value register 86, and "0" is set to the lower 10 bits. In an initial state, because "000 hex" is set as the upper 9 bits of the 19-bit register 90, "3000 hex" is set as a value of the 19-bit register 90. A value (2F000 hex) that is obtained by subtracting "100 hex" from "30000 hex," is output from the computing unit 89-1. The 19-bit register 90 compares the upper 9 bits, "0BC hex," of the "2F000 hex" value with "000 hex" of the counter lower limit value register 86 at the rising edge of the pulse S81 output from the triangle wave data generation unit 81. In this case, because a formula, (the counter lower limit 9-bit value)>(the upper 9-bit value of a 19-bit value output from computing unit 89-1), is satisfied, a value of the 19-bit register 90 is not updated. The integer part of the upper 9 bits of the 19-bit register 90 is output to the divider selector 92 and the subtractor (−1) 91. The fractional part of the lower 10 bits of the 19-bit register 90 is output to the comparator 85-2 and the computing unit 89-2.

Since a lower 10-bit output value of the 19-bit register 90 is "0," the comparator 85-2 outputs a select signal "select," at a low value "L," to the divider selector 92. The 11-bit output values of the computing unit 89-2 and the error retention register 94 are retained as "0" at the time of reset. The subtractor (−1) 91 subtracts "1" from "192 dec (0C0 hex)" as the upper 9-bit value of the 19-bit register 90 and outputs a 9-bit value, "191 dec (0BF hex)" to the divider selector 92.

Because the select signal "select" input from the comparator 85-2 is "L," the divider selector 92 outputs a 9-bit value of a 9-bit input, "191 dec (0BF hex)," from the subtractor (−1) 91 to the divider 93. The divider 93 counts the input clock signal CLK and outputs 191-cycle as a divider selector output 9-bit, i.e., a pulse with 7.64 μsec (191×40/1000=7.64), to the output selector 95. The pulse has a turn-on time, 2.16 μsec, in order to have approximately 30% on-duty. The turn-on time is calculated by determining the sum of a ¼ value, a 1/32 value, and a 1/64 value of the output of the 9-bit value output by the subtractor (−1) 91. If the 9-bit value is 191 dec (0BF hex), then the ¼ value "02F hex" is obtained by shifting "0BF hex" to the right by 2 bits, the 1/32 value "005 hex" is obtained by shifting "0BF hex" to the right by 5 bits, and the 1/32 value "002 hex" is obtained by shifting "0BF hex" to the right by 6 bits. The sum of "02F hex," "005 hex," and "002 hex" is "036 hex" (54 dec), giving a pulse width of 54×40/1000=2.16 μsec.

While the ON/OFF signal that is input as the select signal "select" is at a low value "L," the output selector 95 keeps its output port OUT1 that is for outputting the driving pulse S72*a* as a low value "L." As discussed above, after the reset is released, the output port OUT1 of the control unit 72 retains a low value "L" so long as the ON/OFF signal is in a low value "L" state. But, an internal divider 93 keeps generating a pulse with an initial divider ratio.

When the ON/OFF signal from the printer engine control unit 53 is switched to a high value "H," the output selector 95 selects a pulse that is output from the divider 93 and outputs the pulse as the driving pulse S72*a* to the output port OUT1 of the control unit 72. The driving pulse S72*a* enables the piezoelectric transformer driving circuit 74 to perform switching so that the piezoelectric transformer 75 is driven. Then, an AC high voltage is output from the secondary side output terminal 75*b* of the piezoelectric transformer 75. The AC high voltage is converted into a DC high voltage by the rectifier circuit 76. Further, the DC high voltage is converted into a DC low voltage S77 by the output voltage conversion part 77. The DC low voltage S77 is input to the output voltage comparison part 78.

When the piezoelectric transformer 75 is driven by a divider of the initial setting, a high voltage output is raised. As a result, the comparison result S78 output from the output voltage comparison part 78 becomes a PWM waveform output, which corresponds to a waveform in the case in which the high voltage output is lower than the target voltage S79 in FIG. 10, with a 204.80 μsec cycle and a duty over 60%.

The up counter 83 shown in FIG. 6 is reset by the rising of the pulse S81 with a 204.80 μsec cycle output from the triangle wave data generation unit 81. The up counter 83 counts up a period of a high value "H" for the comparison result S78 with a 204.80 μsec cycle. The up counter 83 counts the comparison result S78 in a range of 0 through 5119 in 5120 cycles with a 204.80 μsec cycle.

When the ON/OFF signal that is input with reset at the same time is at a high value "H," data is latched in the D latch 84. A latched value decreases when the high voltage output rises. As discussed above, a value of the 19-bit register 90 as a frequency control value is updated by the comparator 85-1, the table register 88, and computing unit 89-1. When an output value of the comparator 85-1 becomes a value corresponding to ST6 shown in the flow diagram in FIG. 14, the value of the 19-bit register 90 is fixed so that constant voltage control is performed. When the latched value is changed due to load change and so on, a value of the table register 88 and an output of the comparator 85-1, which are control values, are updated. As a result, frequency control is performed once again.

A relationship between the high voltage output and the comparison result S78 output from the output voltage comparison part 78 is shown in FIG. 10.

Figure 16:
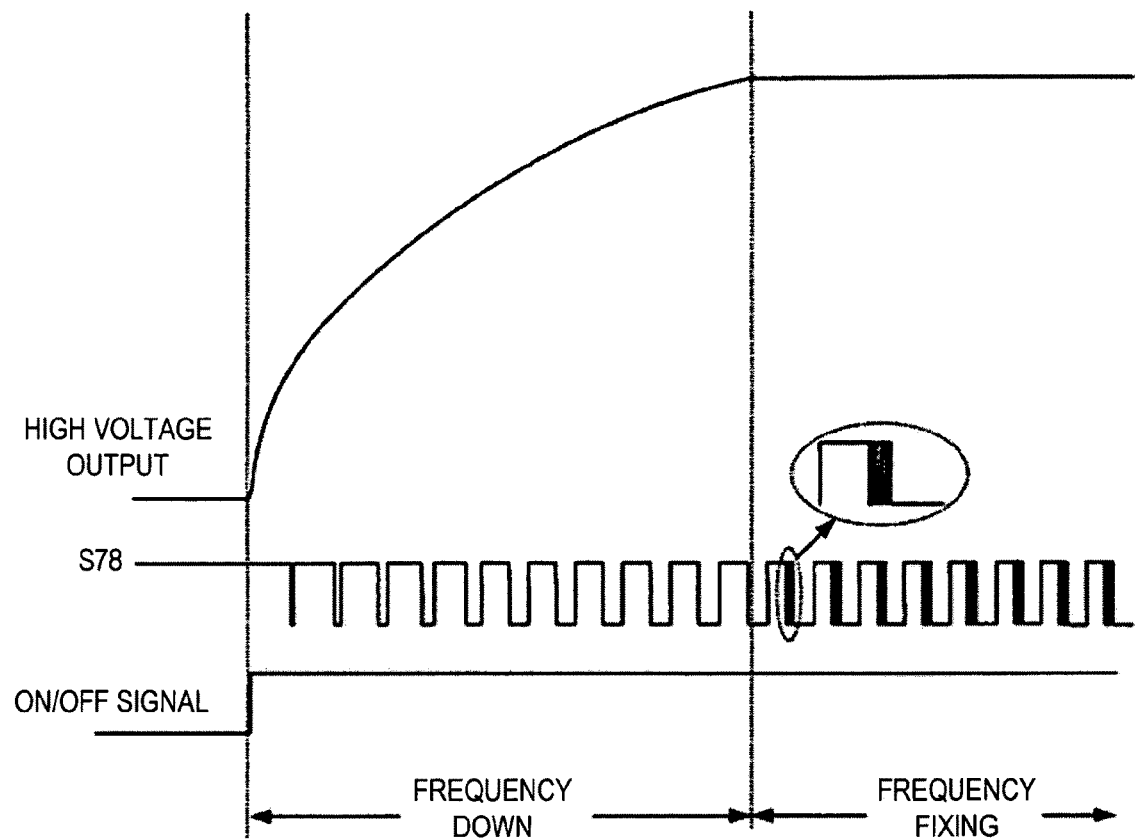
FIG. 16 a schematic diagram showing a relationship between rise of a high voltage output and a comparison result that is output from an output voltage comparison part.

FIG. 16 a schematic diagram showing a relationship between the rise of the high voltage output and the comparison result S78 that is output from the output voltage comparison part 78.

As explained above, a frequency is set as the following (1) through (10) depending on a "H" period ratio in a mix wave cycle for a digital value of the comparison result S78 that compares the mix wave of a constant wave and triangle wave with a conversion output of the high voltage output in the output voltage comparison part 78.

(1) When the "H" period ratio is approximately 95-100%, an addition is performed with a step of "100 hex" in the 19-bit register 90 so that the 19-bit register 90 is set for lowering a frequency.

(2) When the "H" period ratio is approximately 90-95%, an addition is performed with a step of "80 hex" in the 19-bit register 90 so that the 19-bit register 90 is set for lowering a frequency.

(3) When the "H" period ratio is approximately 85-90%, an addition is performed with a step of "40 hex" in the 19-bit register 90 so that the 19-bit register 90 is set for lowering a frequency.

(4) When the "H" period ratio is approximately 80-85%, an addition is performed with a step of "20 hex" in the 19-bit register 90 so that the 19-bit register 90 is set for lowering a frequency.

(5) When the "H" period ratio is approximately 75-80%, an addition is performed with a step of "10 hex" in the 19-bit register 90 so that the 19-bit register 90 is set for lowering a frequency.

(6) When the "H" period ratio is approximately 70-75%, an addition is performed with a step of "8 hex" in the 19-bit register 90 so that the 19-bit register 90 is set for lowering a frequency.

(7) When the "H" period ratio is approximately 65-70%, an addition is performed with a step of "4 hex" in the 19-bit register 90 so that the 19-bit register 90 is set for lowering a frequency.

(8) When the "H" period ratio is approximately 60-65%, an addition is performed with a step of "2 hex" in the 19-bit register 90 so that the 19-bit register 90 is set for lowering a frequency.

(9) When the "H" period ratio is approximately 52.5-60%, an addition is performed with a step of "1 hex" in the 19-bit register 90 so that the 19-bit register 90 is set for lowering a frequency.

(1) When the "H" period ratio is approximately 47.5-52.5%, a value of the 19-bit register 90 is not changed.

As discussed above, a high voltage output is controlled so as to be a target voltage by updating the 19-bit register 90 as a frequency control value. A pulse frequency that is controlled by the setting result of the 19-bit register 90 is explained below.

When a high voltage output exceeds a target voltage due to load change or overshoot, a frequency is set as the following (1) through (9) as a duty control equal to below 47.5%.

(1) When duty is approximately 40-45%, a subtraction is performed with a step of "1 hex" in the 19-bit register 90 so that the 19-bit register 90 is set for upping a frequency.

(2) When duty is approximately 35-40%, a subtraction is performed with a step of "2 hex" in the 19-bit register 90 so that the 19-bit register 90 is set for upping a frequency.

(3) When duty is approximately 30-35%, a subtraction is performed with a step of "4 hex" in the 19-bit register 90 so that the 19-bit register 90 is set for upping a frequency.

(4) When duty is approximately 25-30%, a subtraction is performed with a step of "8 hex" in the 19-bit register 90 so that the 19-bit register 90 is set for upping a frequency.

(5) When duty is approximately 20-25%, a subtraction is performed with a step of "10 hex" in the 19-bit register 90 so that the 19-bit register 90 is set for upping a frequency.

(6) When duty is approximately 15-20%, a subtraction is performed with a step of "20 hex" in the 19-bit register 90 so that the 19-bit register 90 is set for upping a frequency.

(7) When duty is approximately 10-15%, a subtraction is performed with a step of "40 hex" in the 19-bit register 90 so that the 19-bit register 90 is set for upping a frequency.

(8) When duty is approximately 5-10%, a subtraction is performed with a step of "80 hex" in the 19-bit register 90 so that the 19-bit register 90 is set for upping a frequency.

(9) When duty is approximately 0-5%, a subtraction is performed with a step of "90 hex" in the 19-bit register 90 so that the 19-bit register 90 is set for upping a frequency.

FIG. 17 is a table showing a relationship among values of an error holding register 94, values of the lower 10 bits of a 19-bit register 90, and binary outputs of a select signal that is output from a comparison unit 85-2.

The comparator 85-2 in FIG. 6 compares the lower 10 bits as a fractional part of the 19-bit register 90 with the signed 11 bits of the error retention register 94 and outputs a select signal "select" for selecting either N-dividing or (N−1)-dividing to the divider selector 92. When the lower 10 bits of the 19-bit register 90 are "0," the comparator 85-2 outputs a value of "0" (i.e., "L") to the divider selector 92. For example, when upper 9 bits of the 19-bit register 90 is "221 dec (0DD hex)," and when the lower 10 bits are "0," a pulse with 220-dividing is output. Since a value of the error retention register 94 is "0," the lower 10 bits of the 19-bit register 90 are "0," and the output value of the comparator 85-2 is "L," the computing unit 89-2 updates the value of the error retention register 94 to "0."

For example, when a value of the 19-bit register 90 is "3752C hex," an integer part of upper 9 bits is "221 dec (0DD hex)," and lower bits are "300 dec (12C hex)." As shown in FIG. 17, when the lower 10 bits of the 19-bit register 90 are not "0," an output value of the comparator 85-2 is decided based on the sign of the error retention register 94. In a first row in which a value of the error retention register 94 is "0," an output value of the comparator 85-2 is a value of "1" (i.e., "H") so that a pulse with 222-dividing is output. In the next pulse, because an output value of the comparator 85-2 is "1," a value of the error retention register 94 is updated to "−724 (52C hex/11 bits) by adding "−1024" and "300" a value of the 19-bit register 90 as shown in the second row. In the next pulse, because a value of the error retention register 94 is negative, an output value of the comparator 85-2 is "0" (i.e., "L") so that a pulse with 220-dividing is output. The error retention register 94 always retains the difference between a value of a divider ratio fractional part and an actual divider ratio. Therefore, a mean divider ratio for a certain period of time is approximately is as follows: (the upper 9 bits of the 19-bit register)+(the lower 10 bits of the 19-bit register)/1024.

Even though the 19-bit register 90 is updated, a value of the error retention register 94 retains previous error values. Therefore, the divider selector 92 selects a divider ratio by comparing the lower 10 bits of the newly updated 19-bit register 90 with the signed 11 bits of the error retention register 94. When a high voltage output becomes a target voltage, a high "H" rate in unit time (cycle T in FIG. 10) of the comparison result S78 output from the output voltage comparison part 78 is in a range of 52.5-47.5% so that the value of the 19-bit register 90 is fixed. When it is out of the range of 52.5-47.5%, the lower bits of the 19-bit register are repeated up and down. However, since the mean resolution is 30/1024 nsec, a nearly stabled high voltage output with a constant voltage is obtained.

Another Example of First Embodiment

In the first embodiment, the following other examples (a) through (f) can be used.

(a) In the first embodiment, N-dividing or (N−1)-dividing of 25 MHz is changeably output. However, for example, 2N-dividing or (2N−2)-dividing of 50 MHz is changeably output.

(b) In the first embodiment, 25 MHz is used. When a different divider ratio is used, a lower value of 20 MHz can be realized in the same manner.

(c) When the ON/OFF signal from the printer engine control unit 53 becomes a low value "L," a pulse output from the output selector 95 is stopped, and an output from the piezoelectric transformer 75 is also decayed in a moment.

(d) Values of the table register shown in FIG. 15 are merely given as examples. Optimum values are different according to load condition and obtained rising speed so that the values of the first embodiment are not limited. A high "H" rate in unit time of the comparison result S78 output from the output voltage comparison part 78 is defined by a step of 5% in the table. Other values, a step of 10%, 1%, or the like, may be used.

(e) Frequency resolution used for frequency control is not limited to a value of the first embodiment. Several combinations together with values discussed above are possible. With respect to an output cycle T of a mix wave of a constant voltage and triangle wave of the triangle wave data generation unit 81, it is possible to have a high speed one by decreasing resolution; and it is possible to have a longer cycle by increasing resolution.

(f) In the first embodiment, the DAC 79 is explained as 8 bits. However, a higher resolution DAC can be used in alternate embodiments, such as 10 bits or 12 bits.

Effect of First Embodiment

In the first embodiment, because a constant voltage value showing a target voltage S79 output from the DAC 79 and a triangle wave output are mixed and output, it is possible to have both stable constant voltage control with a high voltage output near resonance frequency by the piezoelectric transformer 75 and control with a short rise time.

Second Embodiment

An image forming device and a control circuit according to a second disclosed embodiment operate in the same manner as FIGS. 2 and 3 according to the first disclosed embodiment. A high voltage power source device according to the second disclosed embodiment located in the image forming device is substantially the same as FIGS. 1 and 4 according to the first disclosed embodiment. The difference between the first and second disclosed embodiments is a configuration of a control unit located in a piezoelectric transformer driving device 70 in FIGS. 1 and 4. The different control unit is explained below.

Configuration of Second Disclosed Embodiment

Figure 18:
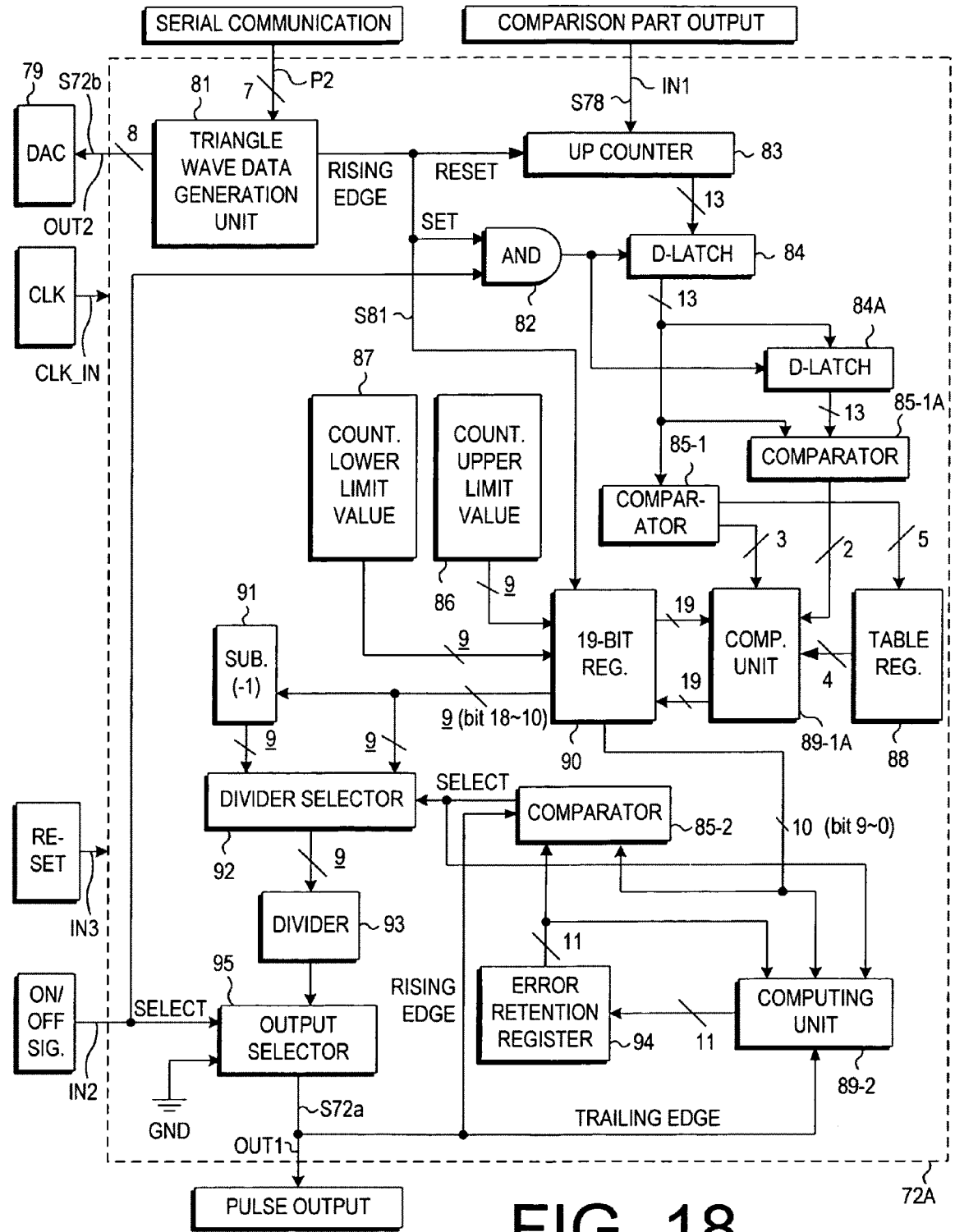
FIG. 18 is a block diagram of a control unit according to a second disclosed embodiment.

FIG. 18 is a block diagram of a control unit 72A according to a second disclosed embodiment. Elements that are the same as elements of the control unit 72 according to the first disclosed embodiment in FIG. 6 are assigned the same reference numerals.

A control unit 72A according to the second disclosed embodiment is a circuit located inside the piezoelectric transformer driving device 70 shown in FIGS. 1 and 4 in the same manner of the first disclosed embodiment. In the control unit 72A, a computing unit 89-1A that has a different function to and replaced with the computing unit 89-1 in the control unit 72 according to the first disclosed embodiment shown in FIG. 6 is provided. Further, a new retention part (for example, a D latch) 84A and a comparator 85-1A are added.

The D latch 84A is connected to output sides of the D latch 84 and the AND gate 82. The comparator 85-1A is connected to output sides of the D latch 84A and the D latch 84. The computing unit 89-1A is connected to an output side of the comparator 85-1A.

The D latch 84A latches a 13-bit value of the D latch 84 in a preceding block at the rising of an output signal of the AND gate 82 and gives the 13-bit value as a latch result to the comparator 85-1A. The comparator 85-1A compares a 13-bit value of the D latch 84 with a 13-bit value of the D latch 84A and gives a 2-bit value as a comparison result to the computing unit 89-1A. The computing unit 89-1A has the following differences (a)-(e) compared with the computing unit 89-1 according to the first disclosed embodiment.

(a) When the comparison result of the comparator 85-1 is "000b," a 19-bit value, "00001H," is shifted to the left with 4 bits of 0-9 output from the table register 88. The shifted result is subtracted from a value of the 19-bit register 90. A 19-bit value as a subtraction result is output to the 19-bit register 90.

(b) When the comparison result of the comparator 85-1 is "001b," a 19-bit value, "00001H," is subtracted from a value of the 19-bit register 90. A 19-bit value as a subtraction result is output to the 19-bit register 90.

(c) When the comparison result of the comparator 85-1 is "010b," a 19-bit value of the 19-bit register 90 is not changed. The unchanged 19-bit value is output to the 19-bit register 90.

(d) When the comparison result of the comparator 85-1 is "011b," a 19-bit value, "00001H," is added to a value of the 19-bit register 90. A 19-bit value as an addition result is output to the 19-bit register 90.

(e) When the comparison result of the comparator 85-1 is "001b," a 19-bit value, "00001H," is shifted to the left with 4 bits of 0-9 output from the table register 88. The shifted result is multiplied by a value of 1-4 in which 1 is added to a 2-bit value of 0-3 of the comparison result of the comparator 85-1A. A 19-bit value as an addition result is output to the 19-bit register 90.

Other structures are the same as the first disclosed embodiment.

Operation of Second Disclosed Embodiment

The entire operation of an image forming device according to the second disclosed embodiment is the same as the first disclosed embodiment. In the second disclosed embodiment, the operation of the control unit 72A is different from the control unit 72 of the first embodiment shown in FIG. 6. Only the difference is explained.

A 13-bit value of the D latch 84 means that an output "H" period as a mix wave cycle of an immediate preceding constant voltage and triangle wave of the comparison result S78 of the output voltage comparison part 78 is retained. A 13-bit value of the D latch 84A means that an output "H" period of the preceding 1 cycle (preceding 204.8 µsec) is retained as the 13-bit value of the D latch 84 of the output voltage comparison part 78. Under the condition of the following: (the output value of the D latch 84)>3072 and (the output value of the D latch 84A)>3072, the comparator 85-1A performs as follows. When 5 bits of each of latch output 13 bits are the same, a 2-bit data, "01b," is output. When the upper 6 bits are the same, a 2-bit value, "10b," is output. When the upper 7 bits are the same, a 2-bit value, "11 b," is output. In other cases, a 2-bit value, "00b," is always output.

When change of each unit time (204.8 µsec) in the "H" period of the comparison result S78 output from the output voltage comparison part 78 is small, a 2-bit value in a range of "01b-11b" is output. Amount of the frequency change is large by multiplying a value of 2-4 in which 1 is added to the "01b-11b" (value of 1-3) in the computing unit 89-1A by outputting a 2-bit value of "01b-11b.".

Figure 19:
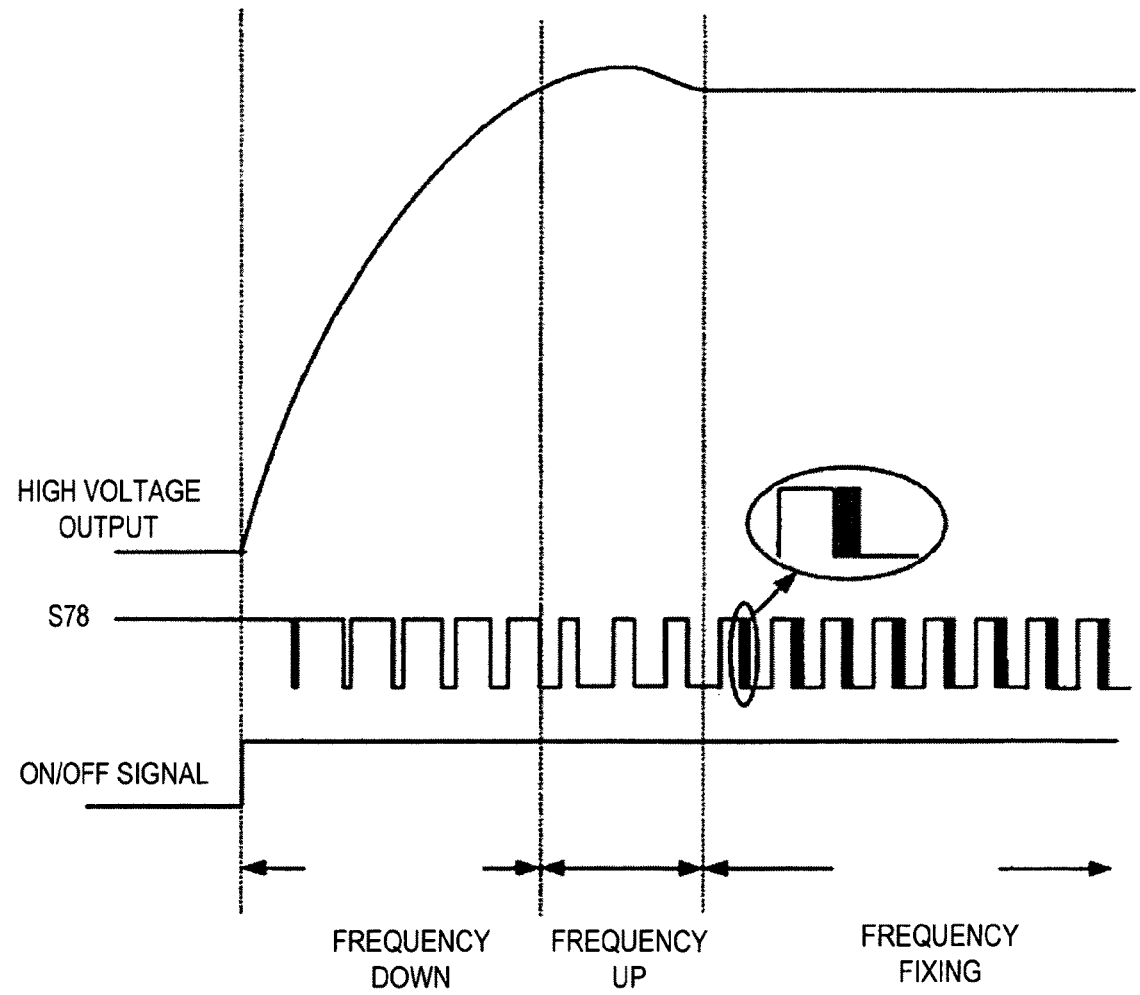
FIG. 19 is a schematic diagram showing a relationship between rise of a high voltage output and a comparison result that is output from an output voltage comparison part according to a second disclosed embodiment.

FIG. 19 is a schematic diagram showing a relationship between the rise of a high voltage output and the comparison result S78 that is output from the output voltage comparison part 78 according to the second disclosed embodiment. FIG. 19 corresponds to FIG. 16 according to the first disclosed embodiment.

In the second disclosed embodiment, when amount of change of the comparison result S78 in each sampling in the output voltage comparison part 78 is small, frequency instruction value change is controlled to be large. As a result, it is possible to have control with a further shortened rise time.

When the gain at the time of rising is as large as the second disclosed embodiment, overshoot occurs as shown in FIG. 19. In this case, because an "H" period ratio of the comparison result S78 output from the output voltage comparison part 78 is equal to or less than 40%, control for increasing a frequency is immediately performed so that it is possible to have stable constant voltage control.

Effect of Second Disclosed Embodiment

In the second disclosed embodiment, because gain adjustment at the time of rising are furthermore finely performed by retaining and comparing the comparison result S78 output from the output voltage comparison part 78 in each unit time through providing the D latch 84A and the comparator 85-1A, it is possible to have a fast rise time and stable constant voltage control regardless of load change.

Third Disclosed Embodiment

An image forming device and a control circuit according to a third disclosed embodiment are substantially the same as FIGS. 2 and 3 according to the first disclosed embodiment. A high voltage power source device according to the third disclosed embodiment located in the image forming device is substantially the same as FIGS. 1 and 4 according to the first disclosed embodiment. The difference between the first and third disclosed embodiments is a configuration of a control unit located in a piezoelectric transformer driving device 70 in FIGS. 1 and 4. The different control unit is explained below.

Configuration of Third Disclosed Embodiment

Figure 20:
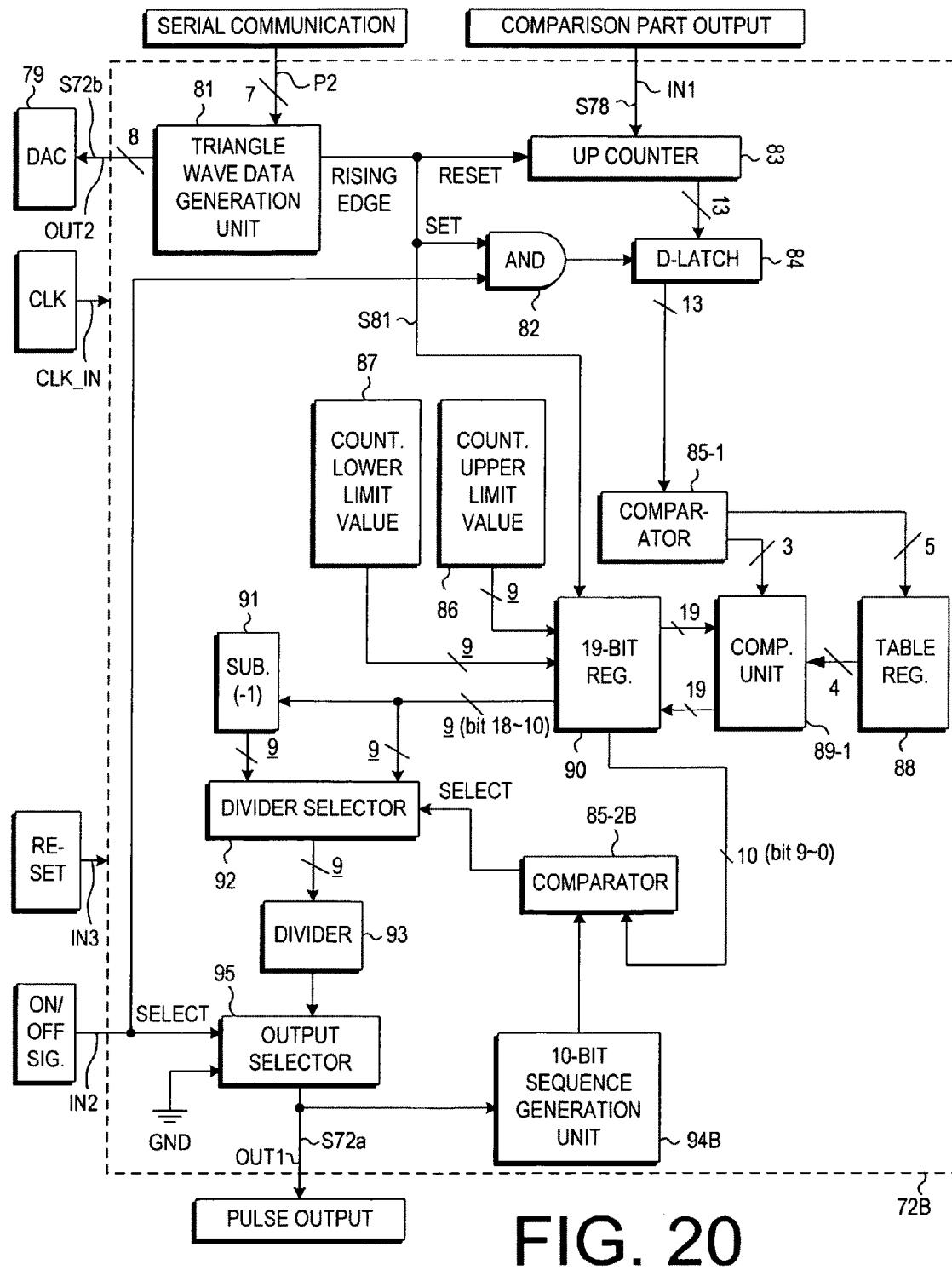
FIG. 20 is a block diagram of a control unit according to a third disclosed embodiment.

FIG. 20 is a block diagram of a control unit 72B according to a third disclosed embodiment. Elements that are the same as elements of the control unit 72 according to the first disclosed embodiment in FIG. 6 are assigned the same reference numerals.

A control unit 72B according to the third disclosed embodiment is a circuit located inside the piezoelectric transformer driving device 70 shown in FIGS. 1 and 4 in the same manner of the first disclosed embodiment. In the control unit 72B, a comparator 85-2B that has a different function to and is replaced with the comparator 85-2 in the control unit 72 according to the first disclosed embodiment shown in FIG. 6 is provided. Further, a 10-bit numerical sequence generation unit 94B is provided to replace the computing unit 89-2 and the error retention register 94 according to the first disclosed embodiment. A binarization means with a threshold matrix is configured with the 19-bit register 90, the subtractor (−1) 91, the divider selector 92, the 10-bit numerical sequence generation unit 94B, and the comparator 85-2B.

The 10-bit numerical sequence generation unit 94B is connected to an output side of the output selector 95. The comparator 85-2B is connected to an output side of the 10-bit numerical sequence generation unit 94B.

The comparator 85-2B compares two input values: the lower 10 bits input from the 19-bit register 90 as a fractional part, and a 10-bit value input from the 10-bit numerical sequence generation unit 94B. The comparator 85-2B then outputs a 1-bit select signal "select" to the divider selector 92 based on the comparison result. In this case, each of the 10-bit values is treated as an unsigned integer. When the comparison result is in the following formula: (the lower 10 bits of the 19-bit register)>(the output value of the 10-bit numerical sequence generation unit), the comparator 85-2B outputs a high value "H" as a select signal "signal" to the divider selector 92. As a result, the divider selector 92 outputs the upper 9 bits of the 19-bit register 90 to the divider 93. On the other hand, when the comparison result is in the following formula: (the lower 10 bits of the 19-bit register) 5 (the output value of the 10-bit numerical sequence generation unit), i.e., other than the previous condition, the comparator 85-2B outputs a low value "L" as a select signal "signal" to the divider selector 92. As a result, the divider selector 92 outputs a 9-bit value of the subtractor (−1) 91 to the divider 93.

The 10-bit numerical sequence generation-unit 94B has an internal counter that counts a rising edge of the driving pulse S72a output from the output selector 95 and operates to flip the values of bit-0-bit-9 of the counter vertically and to output the result to the comparator 85-2B. In other words, when upper to lower output bits, i.e., bit 9 to bit 0, are defined as bit 9_0-bit 0_0, and when upper to lower counter bits, i.e., bit 9 to bit 0, are defined as bit 9_C_bit 0_C, those bits have the following relationship: bit 9_0=bit 0_C; bit 8_0=bit 1_C, bit 7_0=bit 2_C, bit 6_0=bit 3_C, bit 5_0=bit 4_C, bit 4_0=bit 5_C, bit 3_0=bit 6_C, bit 2_0=bit 7_C, bit 1_0=bit 8_C, and bit 0_0=bit 9_C.

Other structures are the same as the first disclosed embodiment.

Operation of Third Disclosed Embodiment

The entire operation of an image forming device according to the third disclosed embodiment is the same as the first disclosed embodiment. In the third disclosed embodiment, the operation of the control unit 72B is different from the control unit 72 of the first disclosed embodiment shown in FIG. 6. Only the difference is explained below.

In FIG. 20, the lower 10 bits of a value set in the 19-bit register 90 are output to the comparator 85-2B. The comparator 85-2B compares them with the 10 bits output from the 10-bit numerical sequence generation unit 94B. When the lower 10 bits of the 19-bit register 90 are larger than the 10 bits output from the 10-bit numerical sequence generation unit 94B, the comparator 85-2B outputs a high value "H" as a select signal "select" to the divider selector 92. In this case, comparison of the 10-bit values is treated as an unsigned integer.

For example, when the upper 9 bits of the 19-bit register 90 are "221 dec," the lower 10 bits are "512 dec," (i.e., "10_0000_0000b"), and when the internal counter of the 10-bit numerical sequence generation unit 94B has the following values, 0, 1, 2, 3, and 4 (i.e., 00_0000_0000b, 00_0000_0001b, 00_0000_0010b, 00_0000_0011b, 00_0000_0100b), an output value of the 10-bit numerical sequence generation unit 94B is as follows because the 10-bit values are flipped vertically, 0, 512, 256, 768, and 128 (i.e., 00_0000_0000b, 10_0000_0000b, 01_0000_0000b, 11_0000_0000b, and 00_1000_0000b. As discussed above, after the comparator 85-2B compares, the select signal "select" is output from the comparator 85-2B as follows: 1, 0, 1, 0, 1. As a result, the values 295, 294, 295, 294, 295 are output from the divider selector 92. Before the counter of the 10-bit numerical sequence generation unit 94B counts 0-1023, 221-dividing and 220-dividing are each occurred 512 times. As a result, the mean divider ratio is 220.5-dividing. An integer part is 221, and a fractional part is 512 that are values of the 19-bit register 90 as a divider ratio instruction means. Namely, the fraction 512/1024=0.5 is equal to the fractional dividing factor.

Another example of Third Disclosed Embodiment

In the third disclosed embodiment, the following other examples (a) and (b) can be used.

(a) In the third disclosed embodiment, the 10-bit numerical sequence generation unit 94B is provided. With it, 10 bits and bit sorting are realized. When a lower resolution of about 5 bits is used, the internal count value may be directly used, and a table instead of the internal counter may be used.

(b) A frequency is binarized by using a threshold value with respect to a target value through the 10-bit numerical sequence generation unit 94B, the 19-bit register 90, the comparator 85-2B, the subtractor (−1) 91, and the divider selector 92. It is controlled such that a real-valued set divider ratio is obtained through the mean for a plurality of pulses of the binarized divider ratio. In the third disclosed embodiment, it is explained that a value of the 19-bit register 90 is not changed. However, the value of the 19-bit register 90 may be changed in alternate embodiments according to an output value of the comparator 85-1. In this case, since a value that is obtained by subtracting 1 from the means value of the 19-bit register per unit time is equal to the mean divider ration value per unit time, effects that are substantially the same as the third disclosed embodiment can be obtained.

Effect of Third Disclosed Embodiment

In the third disclosed embodiment, because a divider ratio is binarized by using a threshold matrix through the 10-bit numerical sequence generation unit 94B, the 19-bit register 90, the comparator 85-2B, the subtractor (−1) 91, and the divider selector 92, high voltage output voltage resolution can be sufficiently obtained under a low clock signal frequency, such as tens of MHz. It is possible to have both frequency controllability with high voltage output in resonance frequency of the piezoelectric transformer 75 and a fast rise time in addition to control by a mix wave of a triangle wave and constant voltage.

Fourth Disclosed Embodiment

An image forming device according to a fourth disclosed embodiment is similar to FIG. 2 according to the first disclosed embodiment. The printer engine control unit 53 in the control circuit in FIG. 2 according to the first embodiment and the piezoelectric transformer driving device 70 in FIGS. 1 and 4 according to the first disclosed embodiment are different from the fourth disclosed embodiment. The differences are explained below.

Figure 21:
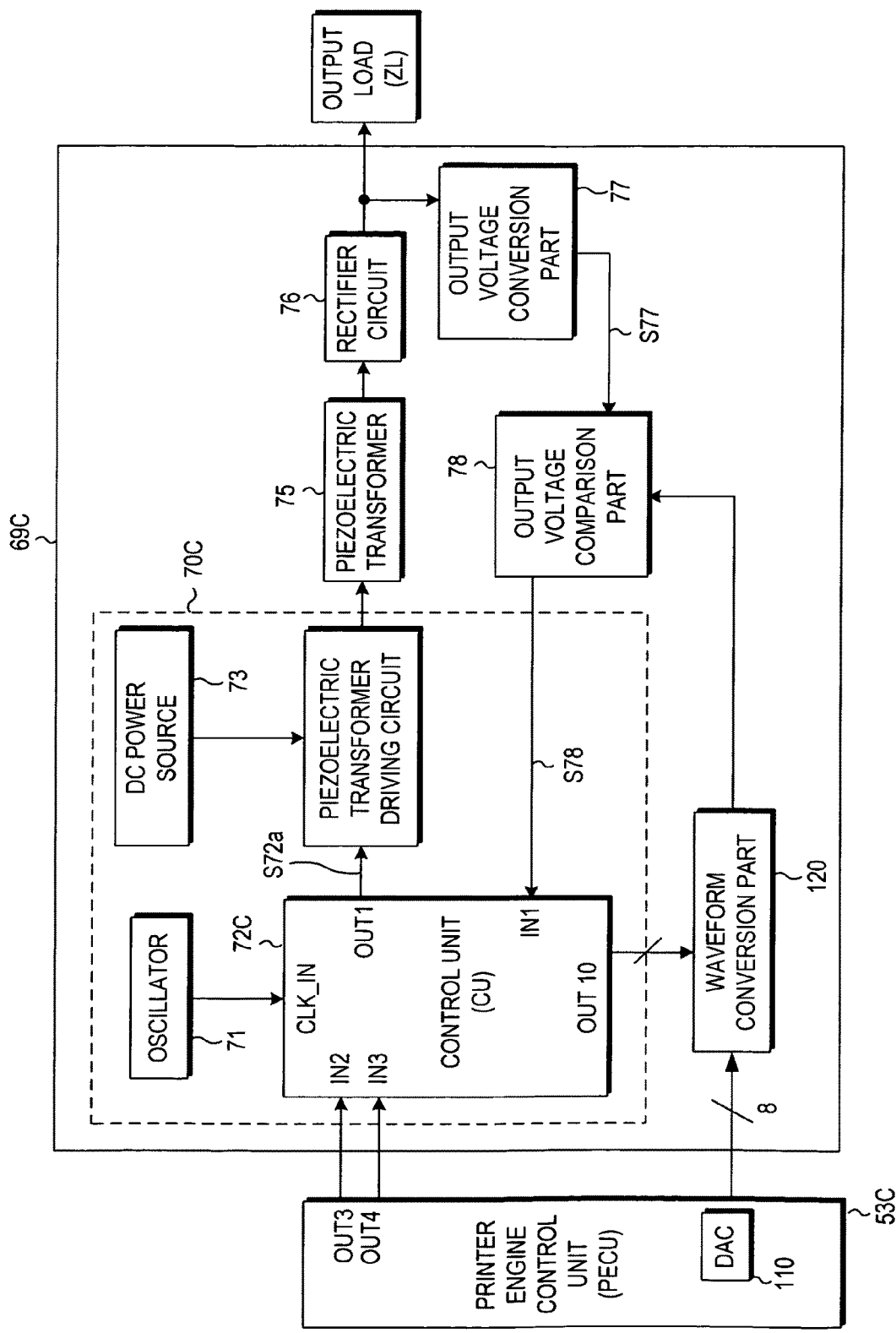
FIG. 21 is a block diagram of a high voltage power source device with a piezoelectric transformer driving device according to a fourth disclosed embodiment.

(Configuration of High Voltage Power Source Device) FIG. 21 is a block diagram of a high voltage power source device with a piezoelectric transformer driving device according to a fourth disclosed embodiment. Elements that are the same as elements of the high voltage power source device according to the first disclosed embodiment in FIG. 1 are assigned the same reference numerals.

In the fourth disclosed embodiment, a printer engine control unit 53C that has different configurations from the printer engine control unit 53 according to the first disclosed embodiment is provided by replacing the printer engine control unit 53 according to the first disclosed embodiment. A piezoelectric transformer driving device 70C that has different configurations from the piezoelectric transformer driving device 70 in the high voltage power source device 69 according to the first disclosed embodiment shown in FIG. 1 is provided in a high voltage power source device 69C according to the fourth disclosed embodiment that is connected the printer engine control unit 53C by replacing the piezoelectric transformer driving device 70. A waveform conversion part 120 is provided by replacing the DAC 79 according to the first disclosed embodiment.

The printer engine control unit 53C according to the fourth disclosed embodiment has output ports OUT3 and OUT4, and a DAC 110 with 8 bits that correspond to the DAC 79 according to the first disclosed embodiment. In the first disclosed embodiment, the printer engine control unit 53 communicates in 7-bit data with the control unit 72 in the high voltage power source device 69. On the other hand, in the fourth disclosed embodiment, a high voltage instruction value with an 8-bit value that is obtained by shifting the 7-bit data according to the first disclosed embodiment to the left, with one bit through the DAC 110 and with 8 bits located in the printer engine control unit 53C, is set in the waveform conversion part 120 in the high voltage power source device 69C. In other words, the DAC 110 outputs a voltage that is double a voltage corresponding to a target voltage value that is compared at the output voltage comparison part 78 in the high voltage power source device 69C.

The high voltage power source device 69C according to the fourth disclosed embodiment has the piezoelectric transformer driving device 70C and the waveform conversion part 120 that are different from the first disclosed embodiment, and has the piezoelectric transformer 75, the rectifier circuit 76, the output voltage conversion part 77, and the output voltage comparison part 78 that are the same as the first disclosed embodiment. The piezoelectric transformer driving device 70C has the oscillator 71, the DC power source 73, and the piezoelectric transformer driving circuit 74 that are the same as the first disclosed embodiment, and the control unit 72C that has a different function from the control unit 72 according to the first disclosed embodiment.

The control unit 72C has an input port CLK_IN, an input port IN1 in which the comparison result S78 from the output voltage comparison part 78 is input, an input port IN2 inputting an ON/OFF signal, an input port IN3 inputting a reset signal "RESET," an output port OUT1 outputting a driving pulse S72a, and an output port OUT10 having two signal lines. The control unit 72C operates to output the driving pulse S72a to the piezoelectric transformer driving circuit 74 and two control signals to the waveform conversion part 120 from the output port OUT10 based on an input clock signal CLK, the ON/OFF signal, and the reset signal "RESET." The waveform conversion part 120 operates to convert a constant voltage output from the DAC 110 by the two control signals output from the control unit 72C and to output it to the output voltage comparison part 78.

Figure 22:
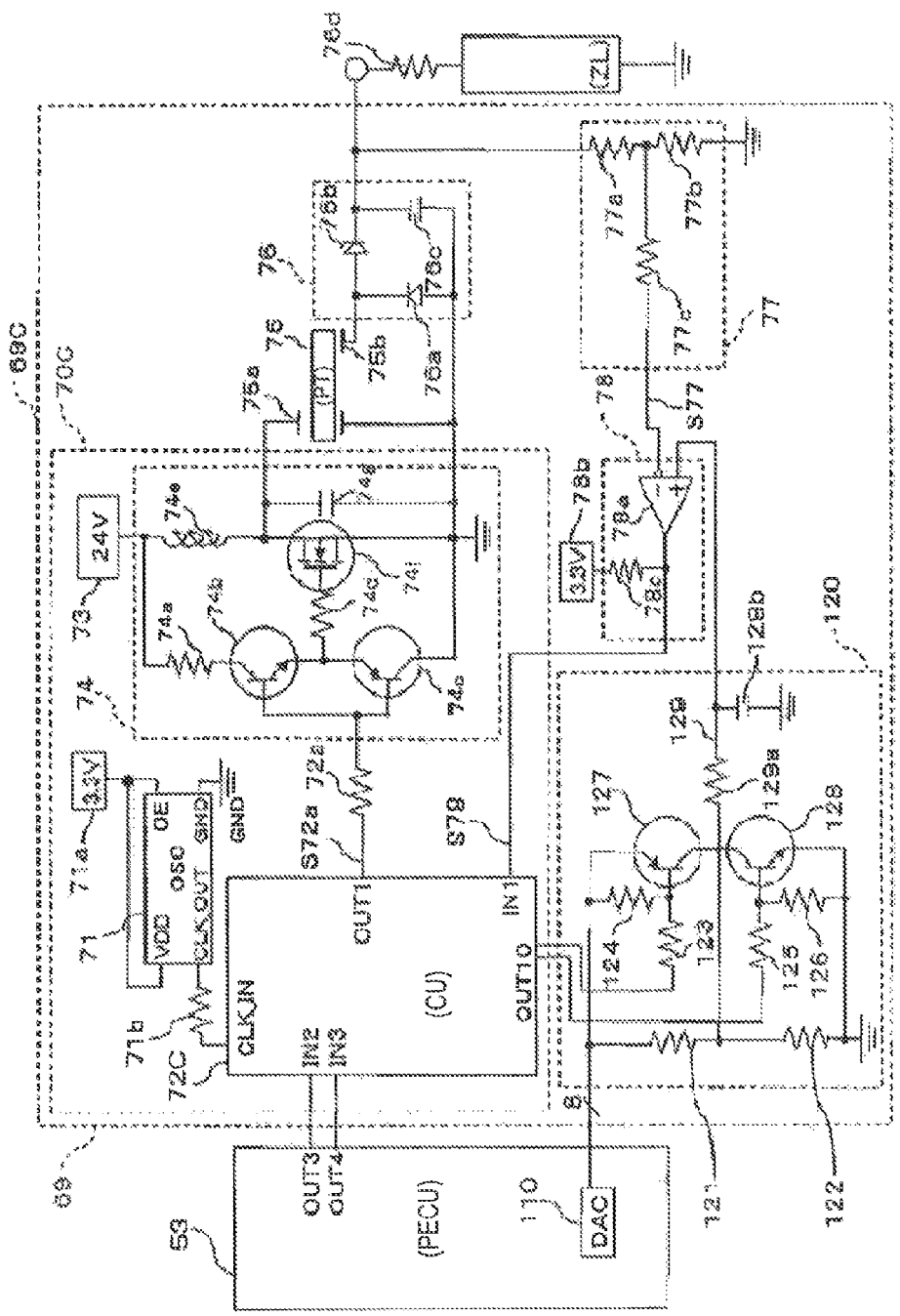
FIG. 22 is a detailed circuit diagram of a high voltage power source device shown in FIG. 21.

FIG. 22 is a detailed circuit diagram of the high voltage power source device 69C shown in FIG. 21. Elements that are the same as elements of the high voltage power source device 69 according to the first disclosed embodiment in FIG. 4 are assigned the same reference numerals.

The waveform conversion part 120 operates to divide the constant voltage output from the DAC 110 in half and to give it to the output voltage comparison part 78. The waveform conversion part 120 is configured with six of resistances 121-126, a PNP transistor 127 and an NPN transistor 128, and an RC filter 129 that are formed by a resistance 129a and a capacitor 129b. Resistance values for the resistances 121 and 122 are the same. A voltage input to the resistance 129 is configured to be ½ of the DAC output voltage.

Other structures are the same as the first disclosed embodiment.

Figure 23:
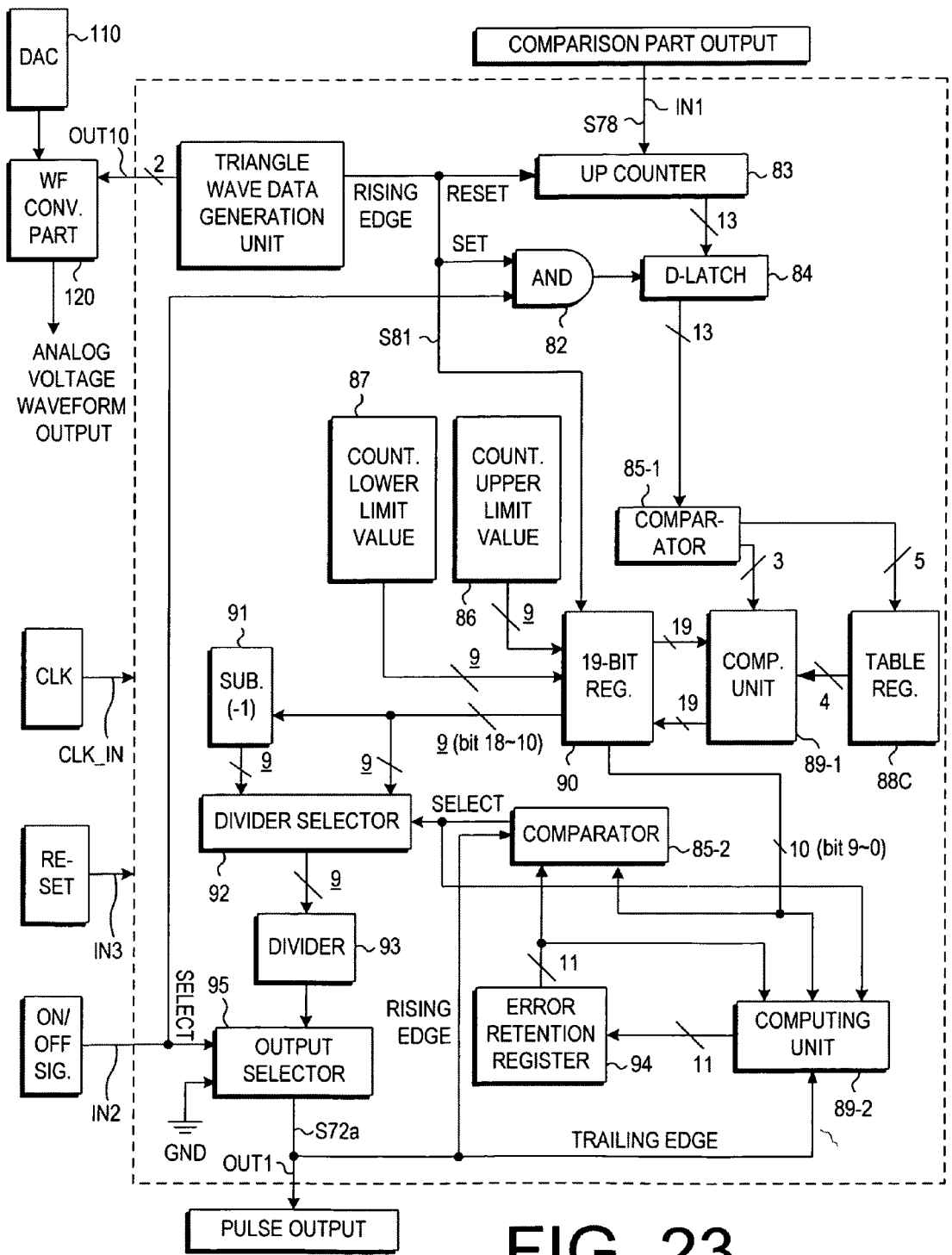
FIG. 23 is a block diagram of a control unit shown in FIG. 22.

(Configuration of Control Unit in Piezoelectric Transformer Driving Device) FIG. 23 is a block diagram of the control unit 72C shown in FIG. 22. Elements that are the same as elements of the control unit 72 according to the first disclosed embodiment in FIG. 6 are assigned the same reference numerals.

In the control unit 72C according to the fourth disclosed embodiment, a waveform data generation unit 81C that is different from the triangle wave data generation unit 81 in the control unit 72 according to the first disclosed embodiment is provided by replacing the triangle wave data generation unit 81. Further, a table register 88C that is different from the table register 88 according to the first disclosed embodiment is provided by replacing the table register 88. The control unit 72C is configured by, for example, an ASIC in the same manner of the first disclosed embodiment.

The waveform data generation unit 81C operates to alternatively output two control signals to the waveform conversion part 120 from the output port OUT10 at certain timing and to output a pulse S81 in synchronization with the control signals. Input and output structures of the table register 88C are the same as the table register 88 according to the first disclosed embodiment. Only the correspondence for input and output is different.

Figure 24:
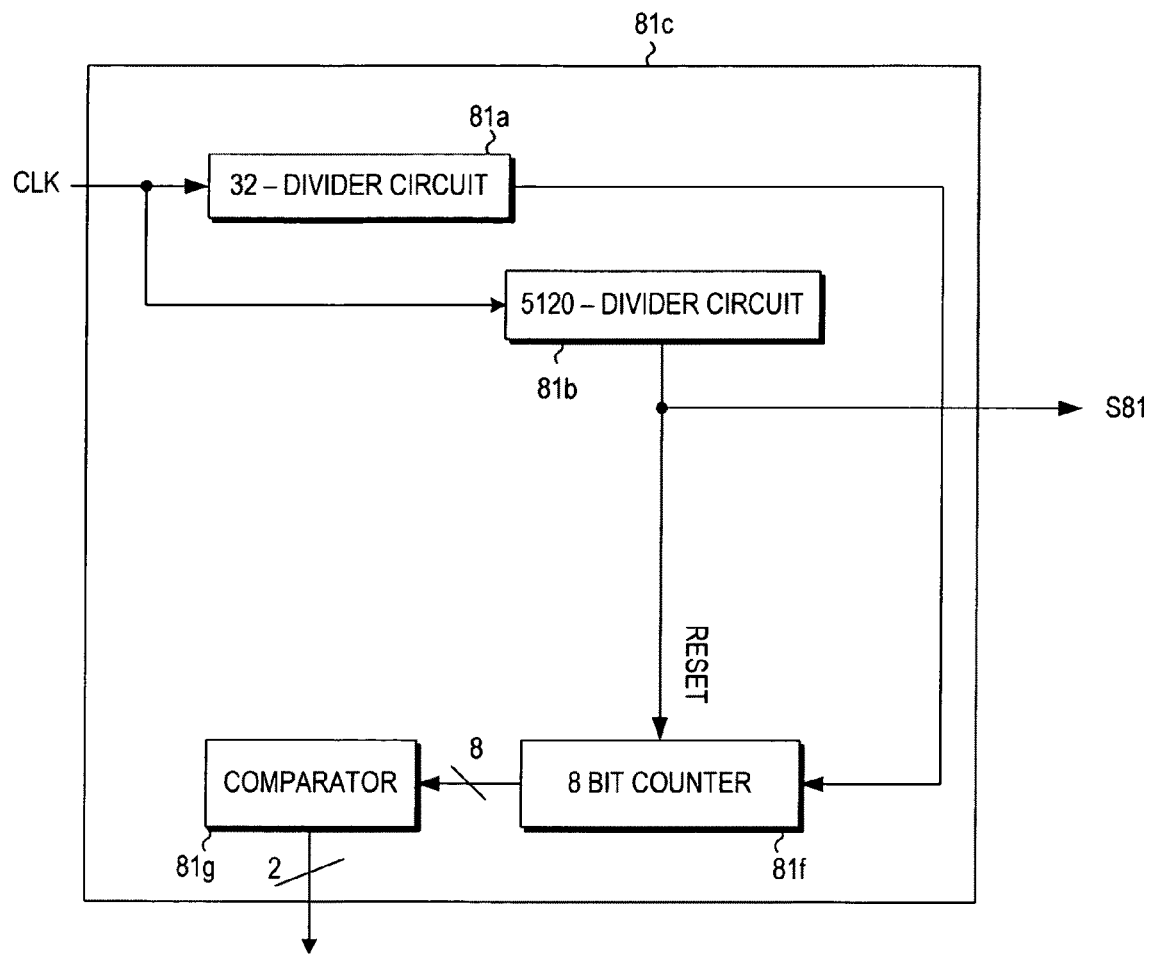
FIG. 24 is a block diagram of a waveform data generation unit shown in FIG. 23.

FIG. 24 is a block diagram of the waveform data generation unit 81C shown in FIG. 23. Elements that are the same as elements of the triangle wave data generation unit 81 according to the first disclosed embodiment in FIG. 7 are assigned the same reference numerals.

The waveform data generation unit 81C according to the fourth disclosed embodiment is configured with the 32-divider circuit 81a, the 5120-divider circuit 81b, the 8-bit counter 81f, and comparator 81g that are the same as the first disclosed embodiment. The comparator 81g outputs a 2-bit signal according to the 8-bit data output from the 8-bit counter 81f. An initial state at the time of reset of the comparator 81g is "00b" so that both bits are output with a low value "L."

FIG. 25 is a table showing input and output values of the table register 88C shown in FIG. 23. Elements that are the same as elements of the table register 88 according to the first disclosed embodiment in FIG. 15 are assigned the same reference numerals.

In the table register 88C according to the fourth disclosed embodiment, the relationship between input 5-bit values and output 4-bit values is defined by one-to-one, and the output 4-bit values are output to the computing unit 89-1.

Other structures are the same as the first disclosed embodiment.

Operation of Fourth Disclosed Embodiment

The entire operation of an image forming device according to the fourth disclosed embodiment is the same as for the first disclosed embodiment. In the fourth disclosed embodiment, the operation of the high voltage power source device 69C is different from the high voltage power source device 69 of the first disclosed embodiment. Only the difference is explained.

A DC output voltage for the high voltage power source device 69C is set by the printer engine control unit 53C in FIG. 21. For example, when the DC output voltage is 5 kV, "194" is obtained through 2.5V and a range of 8 bits/3.3V. "194" is converted into hexadecimal number, "C2H" (2.51V) that is set at the DAC 110. Then, "C2H" is output to the waveform conversion part 120 in the high voltage power source device 69C. The control unit 72C in the high voltage power source device 69C outputs a 2-bit control signal to the waveform conversion part 120 from the output port OUT10. An output control signal is, for example, a 5120-cycle signal (i.e., 204.8 μsec). During the cycle, as discussed later, a constant voltage, 1.255V, that is divided in half is given to a ground GND side and a 2.51V side for a 20.48 μsec period for each of the transistors 127 and 128 in FIG. 22. A waveform mixing with a constant voltage period and rectangular wave is generated and is supplied to the output voltage comparison part 78.

Figure 26:
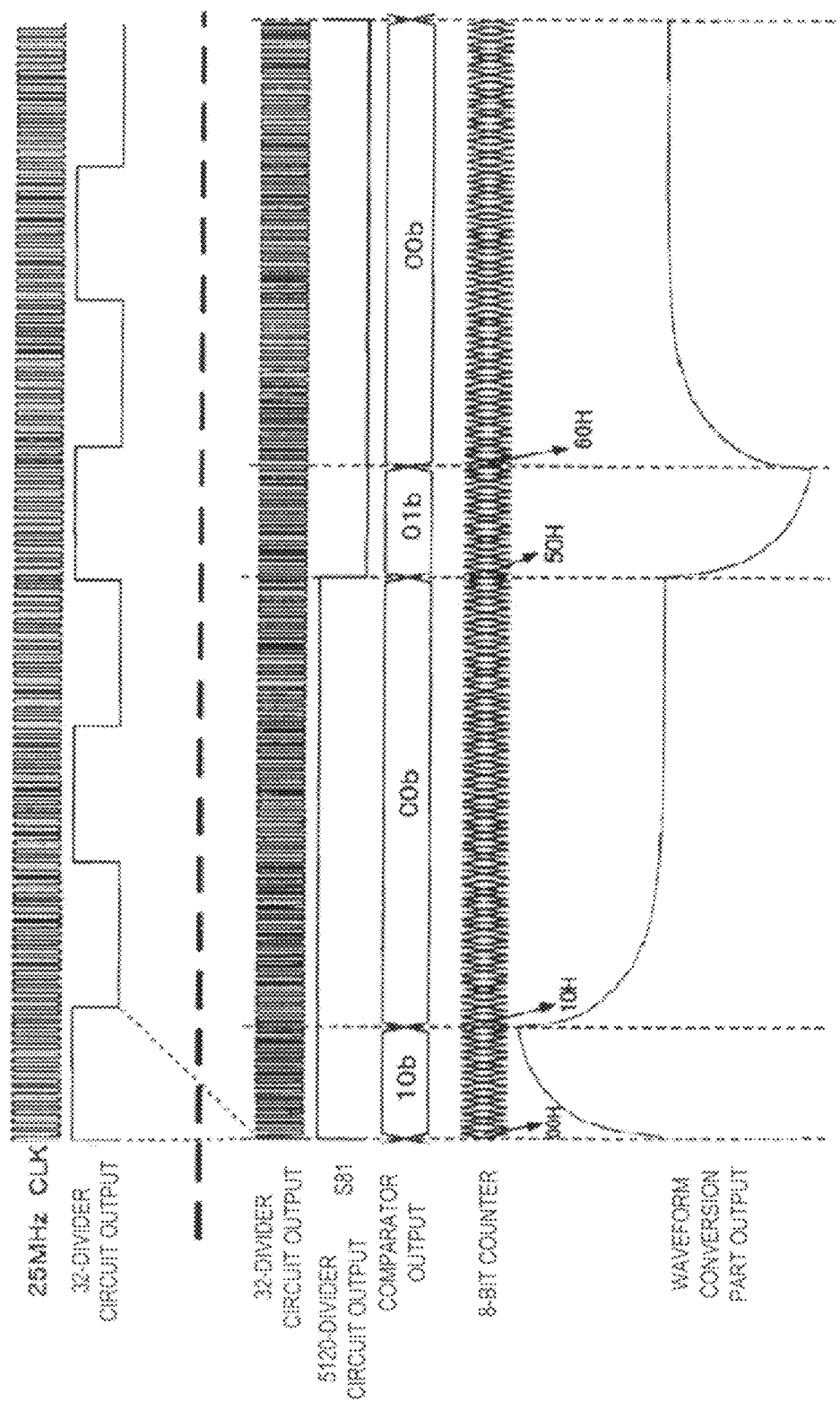
FIG. 26 is a timing diagram of the operation of a waveform conversion part shown in FIG. 22 and a waveform data generation unit shown in FIG. 24.

FIG. 26 is a timing diagram of the operation of the waveform conversion part 120 shown in FIG. 22 and the waveform data generation unit 81C shown in FIG. 24. These timing diagrams correspond to the timing diagram in FIG. 12 according to the first disclosed embodiment.

In FIG. 22, an output voltage of the DAC 110 in the printer engine control unit 53C is divided in half by the resistances 121 and 122 located in the waveform conversion part 120 in the high voltage power source device 69C so that 1.255V is input to the comparator 78a in the output voltage comparison part 78. The control unit 72C alternatively outputs a high value "H" from the two signal lines of the output port OUT10 so that the control unit 72C enables the PNP transistor 127 and the NPN transistor 128 to perform switching. A dividing voltage that is the DAC output voltage divided in half. It is generated by switching, and is almost a rectangular wave. However, it is converted to a waveform shown in FIG. 26 by the RC filter 129.

In FIGS. 23 and 24, the waveform data generation unit 81C in the control unit 72C outputs an output signal of the comparator 81g shown in FIG. 26. The 8-bit counter 81f becomes "00H." An output signal of the comparator 81g becomes "10b." As a result, the PNP transistor 128 in FIG. 22 is turned ON so that the DAC output voltage is gently increased toward near double the DAC output voltage by the RC filter 129.

When the 8-bit counter 81f is "10H," an output signal of the comparator 81g is "00b" so that the PNP transistor 127 is turned OFF. An input voltage to the comparator 78a is gently decayed to the original 1.255V by the RC filter 129. When the 8-bit counter 81f is "50H," the output signal of the comparator 81g is "01b" so that the NPN transistor 128 is turned ON. In contrast, an input voltage to the comparator 78a is gently decreased toward near 0V. When the 8-bit counter 81f is "60H," the output signal of the comparator 81g is "00b" so that the input voltage is gently increased to 1.255V by the RC filter 129.

In FIG. 25, input and output correspondence values are shown. Because an analog waveform is different from the first disclosed embodiment, it is a different table. Operations other than ones that are explained are the same as the first disclosed embodiment.

Effect of Fourth Disclosed Embodiment

In the fourth disclosed embodiment, because the waveform conversion part 120 is configured with an analog circuit, number of signal lines can be small when the high voltage output becomes a multi-channel, such as a color image forming device. And it is possible to obtain the high voltage power source device 69C in which both rising control and constant voltage control are stable.

Fifth Disclosed Embodiment

An image forming device according to a fifth disclosed embodiment is similar to FIG. 2 according to the first disclosed embodiment. The printer engine control unit 53 in the control circuit in FIG. 2 according to the first disclosed embodiment and the piezoelectric transformer driving device 70 in FIGS. 1 and 4 according to the first disclosed embodiment are different from the fifth disclosed embodiment. The differences are explained below.

Configuration of Fifth Disclosed Embodiment

Figure 27:
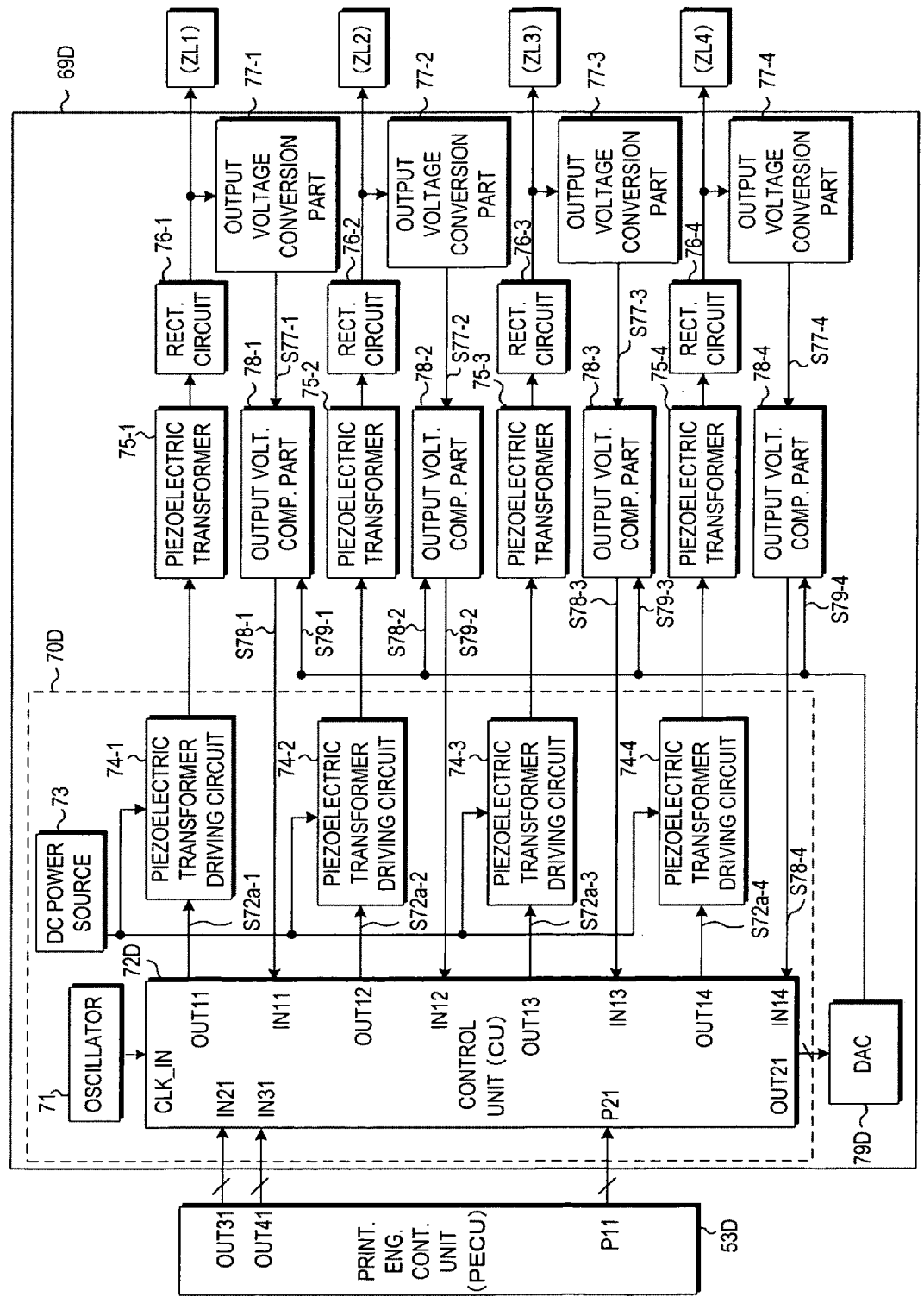
FIG. 27 is a block diagram of a high voltage power source device with a piezoelectric transformer driving device according to a fifth disclosed embodiment.

FIG. 27 is a block diagram of a high voltage power source device with a piezoelectric transformer driving device according to a fifth disclosed embodiment. Elements that are the same as elements of the high voltage power source device 69 according to the first disclosed embodiment in FIG. 1 are assigned the same reference numerals.

In the first disclosed embodiment, only one channel structure of the high voltage power source device 69 for developing is explained. However, in the fifth disclosed embodiment, four channels of the high voltage power source device 69D are explained for developing of black (K), yellow (Y), magenta (M), and cyan (C).

In the first disclosed embodiment, when the high voltage power source device 69 is provided in parallel for a required number of channels, it can be understood how to form a plurality of channels. Therefore, only the structure of one channel was explained by way of example. However, in the fifth embodiment, a four-channel structure is described to explain particular structures required for a plurality of channels.

The printer engine control unit 53D according to the fifth disclosed embodiment can individually control output ports OUT11-OUT14 for outputting a 4-channel driving pulse of the control unit 70D located in the high voltage power source device 69D through four output ports 31 for an ON/OFF signal and four output ports 41 for a reset signal "RESET." A serial communication line that is connected to a port P11 of the printer engine control unit 53 is a three-wire system communication line that is the same as the first disclosed embodiment so that a hardware configuration is the same. But communication contents are different.

The high voltage power source device 69D has the piezoelectric transformer driving device 70D for the 4-channel (K, Y, M, and C), piezoelectric transformers 75-1-75-4 for 4 channels, rectifier circuits 76-1-76-4 for 4 channels, output voltage conversion part 77-1-77-4 for 4 channels that output DC low voltages S77-1-S77-4 for 4 channels, and a DAC 79D that outputs target voltages S79-1-S79-4 for 4 channels based on serial communication. In each of the piezoelectric transformers 75-1-75-4, each of the rectifier circuits 76-1-76-4, and each of the output voltage conversion part 77-1-77-4, a structure that is the same as the first disclosed embodiment is parallel arranged in four. A DC high voltage output from each of the rectifier circuits 76-1-76-4 is supplied to output load ZL1, ZL2, ZL3, and ZL4 in a developing roller side for each C, M, Y, and K.

The piezoelectric driving device 70D has the oscillator 71, the DC power source 73 with 24V, the control unit 72D for 4 channels, and the piezoelectric transformer driving circuit 74-1-74-4 for 4 channels. The control unit 72D has an input port CLK_IN, input ports IN11-IN14 in which comparison results S79-1-S79-4 for 4 channels are input, input ports IN21 in which an ON/OFF signal is input for 4 channels, input ports IN31 in which a reset signal "RESET" is input for 4 channels, a port P21 that is connected to the serial communication lines for 4 channels, output ports OUT11-OUT14 outputting driving pulses S73a-1-S73a-4 for 4 channels, and an output port OUT21 outputting a triangle wave data D72b.

Figure 28:
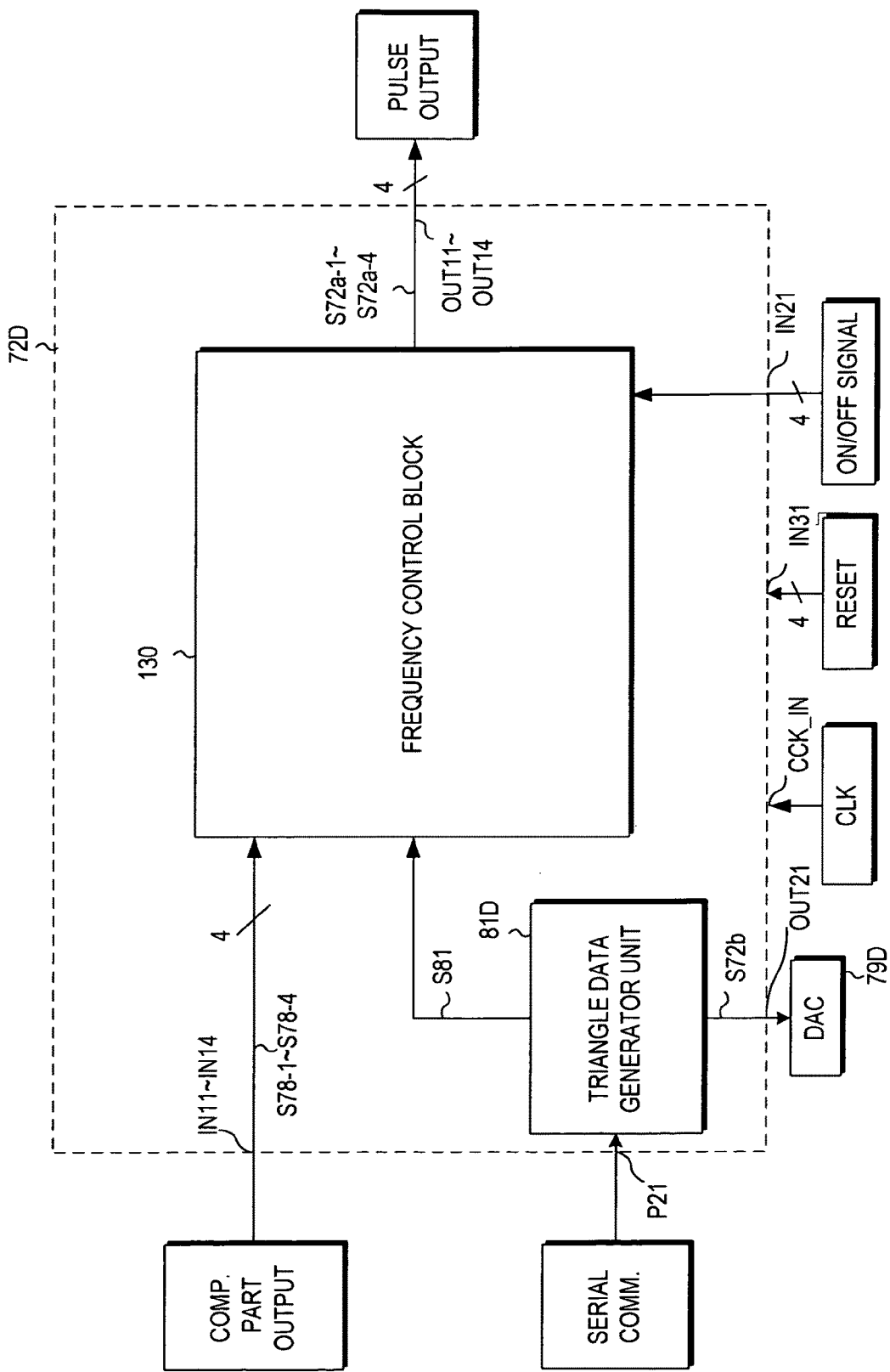
FIG. 28 is a block diagram of a control unit shown in FIG. 27.

FIG. 28 is a block diagram of the control unit 72D shown in FIG. 27. The comparison results S78-1-S78-4 for 4 channels from the output voltage comparison part 78-1 and 78-4, serial communication from the printer engine control unit 53D, the clock signal CLK, the reset signal "RESET" for 4 channels, and the ON/OFF signal for 4 channels are input. The control unit 72D has a triangle wave data generation unit 81D and a frequency control block 130. The triangle wave data generation unit 81D operates to input serial communication from the printer engine control unit 53D, to output triangle wave data S72b, and to output a pulse S81 to a frequency control block 130 for each cycle of a mix wave mixed with a constant voltage and a triangle wave. The frequency control block 130 operates to output driving pulses S72a-1-S72a-4 for 4 channels based on the comparison results S78-1-S78-4 for the 4 channels and the pulse S81.

Operation of Fifth Disclosed Embodiment

The entire operation of an image forming device according to the fifth disclosed embodiment is essentially the same as the first disclosed embodiment. In the fifth disclosed embodiment, the operation of the high voltage power source device 69D is different from the high voltage power source device 69 of the first embodiment. Only the difference is explained below.

Figure 29:
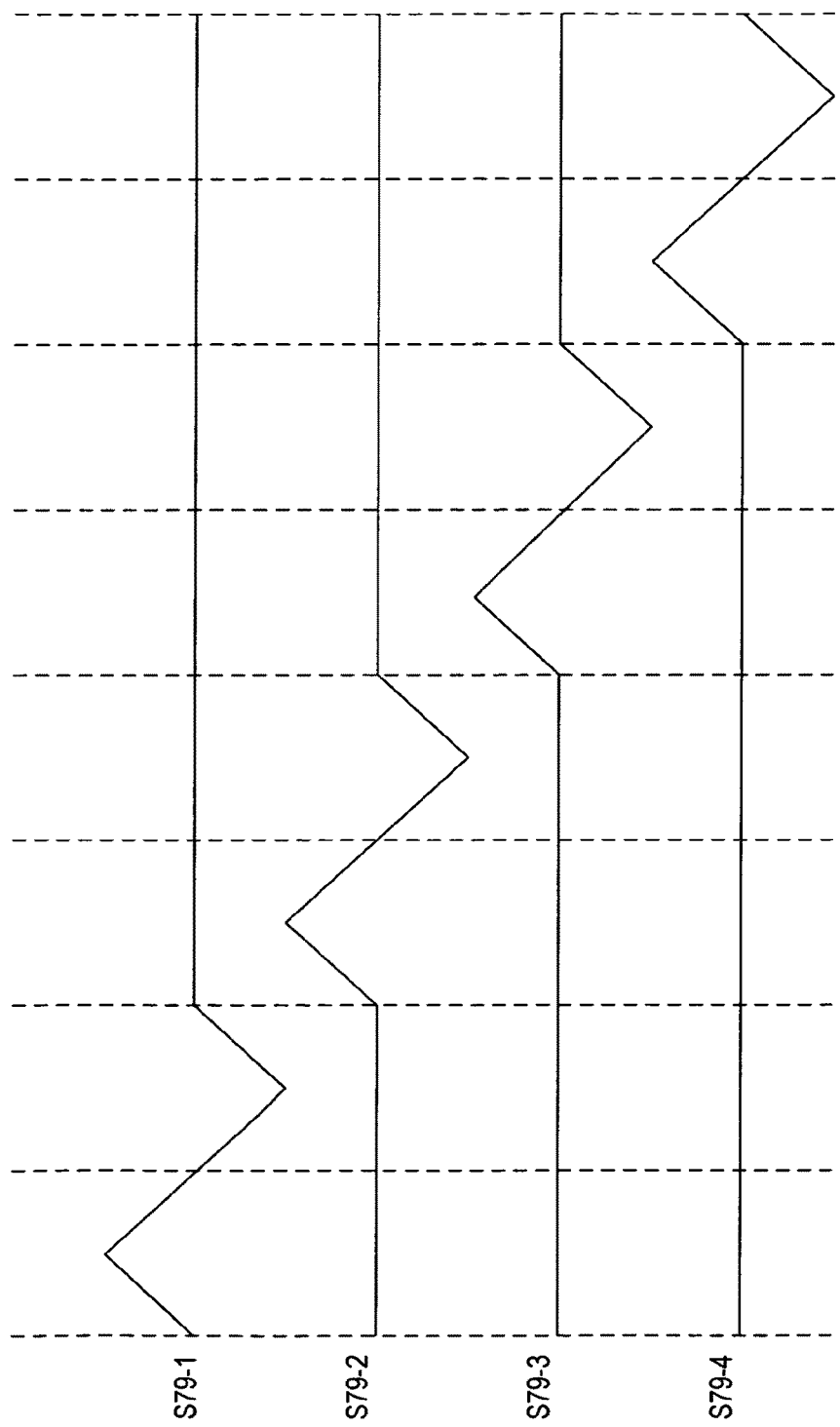
FIG. 29 is a waveform diagram showing target voltages for four channels that are output from a DAC shown in FIG. 27.

FIG. 29 is a waveform diagram showing target voltages S79-1-S79-4 for 4 channels that are output from a DAC 79D shown in FIG. 27.

In the high voltage power source device 69D shown in FIGS. 27 and 28, an internal part of the control unit 72D is substantially the same as a structure in which four internal blocks shown in FIG. 6 according to the first disclosed embodiment are arranged in parallel. Therefore, the operation of the different parts is explained.

When the control unit 72D receives a high voltage output instruction value for 4 channels through serial communication from the printer engine control unit 53D, a triangle wave data generation unit 81D located inside set a digital value of the triangle wave data S72a according to the high voltage output instruction value in the DAC 79D. A method for setting is omitted because data setting according to the first disclosed embodiment is only changed from parallel to serial. In serial communication, it is set by sending an output channel of the DAC 79D and an output value.

In serial communication, the DAC 79D converts a digital value of the input triangle wave data S72b into an analog signal and sequentially generates the target voltages S79-1-S79-4 for C, M, Y, K for one channel at a time as shown in FIG. 29. Because output values of the target voltages S79-1-S79-4 that are once set by communication are retained, the target voltage S79-1 is generated by varying the output value for one channel only, and the remaining three channels output a constant voltage.

In the first disclosed embodiment, the "H" period ratio for a mix wave (target voltage) mixing the constant voltage and triangle wave is as follows: 0-40%, 40-47.5%, 47.5-52.5%, 52.5-60%, and 60-100%. However, in the fifth disclosed embodiment, the "H" period ratio is controlled by the following ranges: 0-12.5%, 12.5-25%, 25-50%, 50-87.5%, and 87.5-100%. The next ranges may also be used in alternate embodiments: 0-12.5%, 12.5-40%, 40-60%, 60-87.5%, and 87.5-100%. In this case, the table register 88 in FIG. 6 to change gain is referred through 0-12.5% and 87.5-100%.

Effect of Fifth Disclosed Embodiment

In the fifth disclosed embodiment, it is easy to form multi-channel structures without increasing number of signal lines. And it is possible to obtain both fast rising control and stable high voltage output under digitalization.

Sixth Disclosed Embodiment

Configuration of Sixth Disclosed Embodiment

An image forming device and high voltage power source device according to a sixth disclosed embodiment are similar to the fifth disclosed embodiment.

Operation of Sixth Disclosed Embodiment

FIG. 30 is a waveform diagram showing target voltages S79-1-S79-4 for 4 channels according to the sixth disclosed embodiment.

In the sixth disclosed embodiment, the operation of the triangle wave data generation unit 81D in FIG. 28 according to the fifth disclosed embodiment is different. A digital value of the triangle wave data S72b output from the triangle wave data generation unit 81D according to the sixth disclosed embodiment is converted into the target voltages S79-1-S79-4 by the DAC 79D. As shown in FIG. 30, the target voltages S79-1-S79-4 are sequentially set by the DAC 79D through serial communication. An output is sequentially shifted by a serial communication cycle with respect to the DAC 79D. In one cycle of a mix wave, when a constant voltage output part is included, four outputs are the same cycle. Therefore, the sixth disclosed embodiment is similar to the first and fifth disclosed embodiments other than a DAC output.

Effect of Sixth Disclosed Embodiment

In the sixth disclosed embodiment, the target voltages S79-1-S79-4 for the 4 channels are sequentially set using the DAC 79D through serial communication. A control cycle is the same as for one channel. And the number of signal lines is lower for multi-channel. Therefore, even though they are configured with a small number of parts and lines under digital control, it is possible to obtain both a short rise time control and high voltage output.

Another Example of First—Sixth Disclosed Embodiments

The present claimed invention is not limited to the above first through sixth disclosed embodiments. Other embodiments and alterations are possible.

For example, In the first through sixth disclosed embodiments, the color tandem-type image forming device 1 and the high voltage power source device 69, 69A-69D having the piezoelectric transformer driving device 70, 70A-70D that are provided in the image forming device 1 are explained. The piezoelectric transformer driving device 70, 70A-70D can be used for another high voltage power source device, such as charge. The present claimed invention is not limited to a color image forming device but can be used for a black and white and so on image forming device.

The piezoelectric transformer driving device and the image forming device being thus described, it will be apparent that the same may be varied in many ways. Such variations are not to be regarded as a departure from the sprit and scope of the claimed invention, and all such modifications as would be apparent to one of ordinary skill in the art are intended to be included within the scope of the following claims.

What is claimed is:

1. A piezoelectric transformer driving device, comprising:
a piezoelectric transformer with a certain resonance frequency configured such that when an input voltage is intermittently applied to a primary side, an alternating high voltage is output from a secondary side;
a switching part configured to generate the input voltage by switching based on a control signal having a control frequency, and configured to supply the voltage to the piezoelectric transformer;
a switching control part configured to control the control frequency of the control signal based on a comparison result, and configured to supply the control signal to the switching part;
a reference voltage waveform generation part configured to switch between a first voltage value as a target value, a second voltage value that is lower than the first voltage value, and a third voltage value that is higher than the first voltage value, within a given unit time so that a reference voltage waveform is generated;
a monitor voltage generation part configured to generate a monitor voltage waveform based on the high voltage output from the piezoelectric transformer; and
a comparison part configured to compare the reference voltage waveform with the monitor voltage waveform to generate the comparison result, and configured to supply the comparison result to the switching control part, wherein
the reference voltage waveform is a single continuous waveform that varies between the first voltage value, the second voltage value and the third voltage value.

2. The piezoelectric transformer driving device according to claim 1, wherein the switching control part is configured to control the frequency of the control signal based on the comparison result per unit time generated in the comparison part.

3. The piezoelectric transformer driving device according to claim 1, wherein the first voltage value is a constant voltage value over a certain period of time.

4. The piezoelectric transformer driving device according to claim 1, wherein
the first voltage value is a constant voltage value over a certain period of time,
a triangle wave voltage value is formed by the second voltage value and the third voltage value, and
the first voltage value and the triangle wave voltage value are exchanged when the triangle wave voltage value reaches the first voltage value.

5. The piezoelectric transformer driving device according to claim 4, wherein
the triangle wave formed by the second voltage value and the third voltage value is output through a digital-to-analog converter,
a change step for an output of the triangle wave is 2N (where N is a arbitrarily number), and
an output time of the first voltage value is greater than or equal to one cycle of the resonance frequency of the piezoelectric transformer.

6. The piezoelectric transformer driving device according to claim 4, wherein
the piezoelectric transformer driving device includes a plurality of channels,
an output cycle of the first voltage value is multiplied by N times a cycle of the triangle wave that is formed with the second voltage value and third voltage value,
the triangle wave is sequentially formed between a plurality of the channels, and
N is an arbitrarily number.

7. The piezoelectric transformer driving device according to claim 4, wherein
the piezoelectric transformer driving device includes a plurality of channels, and
the triangle wave is sequentially formed between the plurality of channels.

8. The piezoelectric transformer driving device according to claim 1, wherein
the first voltage value is a constant voltage value for a certain period of time,
the second voltage value and the third voltage value are formed by a pulse wave, and
one of the following two patterns of voltages is sequentially output from the reference voltage generation part:
(1) repeating the first voltage value, the second voltage value, the first voltage value, and the third voltage value; and
(2) alternating the first voltage value, the third voltage value, the first voltage value, and the second voltage value.

9. The piezoelectric transformer driving device according to claim 1, wherein the frequency is either increased, fixed, or decreased according to the comparison result per unit time generated in the comparison part.

10. The piezoelectric transformer driving device according to claim 1, wherein a gain for control of the control frequency is changed according to the comparison result per unit time generated in the comparison part.

11. The piezoelectric transformer driving device according to claim 1, further comprising:
a retention part configured to retain the comparison result per unit time generated in the comparison part, wherein
a gain for control of the frequency is changed according to an amount of change between a value retained at the retention part and the comparison result obtained at the comparison part.

12. The piezoelectric transformer driving device according to claim 1, further comprising:
a divider part configured to divide a clock signal, and
a divider ratio setting part configured to set a divider ratio for the clock signal, wherein
the divider ratio setting part has an integer part and a fractional part, and
the fractional part is binarized by a binarization part and is added to the integer part so that the frequency is controlled by the divider ratio per unit time as a first dividing and a second dividing.

13. The piezoelectric transformer driving device according to claim 12, wherein the binarization part binarizes the fractional part by error diffusion method.

14. The piezoelectric transformer driving device according to claim 12, wherein the binarization part binarizes the fractional part using a threshold matrix.

15. The piezoelectric transformer driving device according to claim 12, wherein increasing the frequency or decreasing the frequency are performed by changing a value of the fractional part in the divider ratio setting part.

16. An image forming device comprising:
the piezoelectric transformer driving device according to claim 1.

17. The piezoelectric transformer driving device according to claim 1, wherein
the reference voltage waveform oscillates at a predetermined frequency between the second voltage value as a bottom value and the third voltage value as a peak value.

18. A piezoelectric transformer driving device, comprising:
a piezoelectric transformer with a certain resonance frequency configured such that when an input voltage is intermittently applied to a primary side, an alternating high voltage is output from a secondary side;
a switching part configured to generate the input voltage by switching based on a control signal having a control frequency, and configured to supply the voltage to the piezoelectric transformer;
a switching control part configured to control the control frequency of the control signal based on a comparison result, and configured to supply the control signal to the switching part;
a reference voltage waveform generation part configured to switch between a first voltage value as a target value, a second voltage value that is lower than the first voltage value, and a third voltage value that is higher than the first voltage value, within a given unit time so that a reference voltage waveform is generated;
a monitor voltage generation part configured to generate a monitor voltage waveform based on the high voltage output from the piezoelectric transformer; and
a comparison part configured to compare the reference voltage waveform with the monitor voltage waveform to generate the comparison result, and configured to supply the comparison result to the switching control part, wherein
the first voltage value is a constant voltage value over a certain period of time,
a triangle wave voltage value is formed by the second voltage value and the third voltage value, and the first voltage value and the triangle wave voltage value are exchanged when the triangle wave voltage value reaches the first voltage value.

19. An image forming device comprising:
the piezoelectric transformer driving device according to claim 18.

20. A piezoelectric transformer driving device, comprising:
- a piezoelectric transformer with a certain resonance frequency configured such that when an input voltage is intermittently applied to a primary side, an alternating high voltage is output from a secondary side;
- a switching part configured to generate the input voltage by switching based on a control signal having a control frequency, and configured to supply the voltage to the piezoelectric transformer;
- a switching control part configured to control the control frequency of the control signal based on a comparison result, and configured to supply the control signal to the switching part;
- a reference voltage waveform generation part configured to switch between a first voltage value as a target value, a second voltage value that is lower than the first voltage value, and a third voltage value that is higher than the first voltage value, within a given unit time so that a reference voltage waveform is generated;
- a monitor voltage generation part configured to generate a monitor voltage waveform based on the high voltage output from the piezoelectric transformer;
- a comparison part configured to compare the reference voltage waveform with the monitor voltage waveform to generate the comparison result, and configured to supply the comparison result to the switching control part;
- a divider part configured to divide a clock signal; and
- a divider ratio setting part configured to set a divider ratio for the clock signal, wherein
the divider ratio setting part has an integer part and a fractional part, and
the fractional part is binarized by a binarization part and is added to the integer part so that the frequency is controlled by the divider ratio per unit time as a first dividing and a second dividing.

21. An image forming device comprising:
the piezoelectric transformer driving device according to claim 20.

* * * * *